(12) United States Patent
Yamazaki et al.

(10) Patent No.: US 9,331,208 B2
(45) Date of Patent: May 3, 2016

(54) OXIDE SEMICONDUCTOR FILM AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masashi Tsubuku, Atsugi (JP); Kengo Akimoto, Atsugi (JP); Hiroki Ohara, Sagamihara (JP); Tatsuya Honda, Nigata (JP); Takatsugu Omata, Isehara (JP); Yusuke Nonaka, Atsugi (JP); Masahiro Takahashi, Atsugi (JP); Akiharu Miyanaga, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/635,199

(22) Filed: Mar. 2, 2015

(65) Prior Publication Data

US 2015/0179805 A1 Jun. 25, 2015

Related U.S. Application Data

(62) Division of application No. 14/199,257, filed on Mar. 6, 2014, now Pat. No. 8,994,021, which is a division of application No. 13/307,398, filed on Nov. 30, 2011, now Pat. No. 8,669,556.

(30) Foreign Application Priority Data

Dec. 3, 2010 (JP) .................................. 2010-270557

(51) Int. Cl.
*H01L 29/88* (2006.01)
*H01L 29/786* (2006.01)
(Continued)

(52) U.S. Cl.
CPC .......... *H01L 29/7869* (2013.01); *H01L 29/045* (2013.01); *H01L 29/1033* (2013.01); *H01L 29/78696* (2013.01)

(58) Field of Classification Search
CPC .................. H01L 29/7869; H01L 29/78696; H01L 29/1033; H01L 29/045
USPC ............ 257/43, 57, 59, 72, 77, 347; 438/151, 438/458, 585, 770, 787, 795
See application file for complete search history.

(56) References Cited

U.S. PATENT DOCUMENTS 5,622,653 A 4/1997 Orita et al.
5,731,856 A 3/1998 Kim et al.
(Continued)

FOREIGN PATENT DOCUMENTS

CN 001659711 A 8/2005
CN 101310371 A 11/2008
(Continued)

OTHER PUBLICATIONS

Taiwanese Office Action (Application No. 102131055) Dated May 18, 2015.
(Continued)

*Primary Examiner* — Dung Le
(74) *Attorney, Agent, or Firm* — Robinson Intellectual Property Law Office; Eric J. Robinson

(57) ABSTRACT

An oxide semiconductor film which has more stable electric conductivity is provided. The oxide semiconductor film comprises a crystalline region. The oxide semiconductor film has a first peak of electron diffraction intensity with a full width at half maximum of greater than or equal to 0.4 $nm^{-1}$ and less than or equal to 0.7 $nm^{-1}$ in a region where a magnitude of a scattering vector is greater than or equal to 3.3 $nm^{-1}$ and less than or equal to 4.1 $nm^{-1}$. The oxide semiconductor film has a second peak of electron diffraction intensity with a full width at half maximum of greater than or equal to 0.45 $nm^{-1}$ and less than or equal to 1.4 $nm^{-1}$ in a region where a magnitude of a scattering vector is greater than or equal to 5.5 $nm^{-1}$ and less than or equal to 7.1 $nm^{-1}$.

14 Claims, 31 Drawing Sheets

(51) Int. Cl.
*H01L 29/04* (2006.01)
*H01L 29/10* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,888,156 | B2 | 5/2005 | Chikyow et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,298,084 | B2 | 11/2007 | Baude et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 * | 11/2008 | Iwasaki ............... H01L 29/7869 257/292 |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,598,520 | B2 | 10/2009 | Hirao et al. |
| 7,601,984 | B2 | 10/2009 | Sano et al. |
| 7,674,650 | B2 | 3/2010 | Akimoto et al. |
| 7,719,185 | B2 | 5/2010 | Jin et al. |
| 7,732,819 | B2 | 6/2010 | Akimoto et al. |
| 7,745,798 | B2 | 6/2010 | Takahashi |
| 7,872,261 | B2 | 1/2011 | Ikeda |
| 7,923,723 | B2 | 4/2011 | Hayashi et al. |
| 7,932,521 | B2 | 4/2011 | Akimoto et al. |
| 7,935,964 | B2 | 5/2011 | Kim et al. |
| 7,977,169 | B2 | 7/2011 | Hirao et al. |
| 7,993,964 | B2 | 8/2011 | Hirao et al. |
| 7,994,500 | B2 | 8/2011 | Kim et al. |
| 7,998,372 | B2 | 8/2011 | Yano et al. |
| 8,058,645 | B2 | 11/2011 | Jeong et al. |
| 8,129,719 | B2 | 3/2012 | Yamazaki et al. |
| 8,148,779 | B2 | 4/2012 | Jeong et al. |
| 8,168,544 | B2 | 5/2012 | Chang |
| 8,188,480 | B2 | 5/2012 | Itai |
| 8,193,045 | B2 | 6/2012 | Omura et al. |
| 8,202,365 | B2 | 6/2012 | Umeda et al. |
| 8,203,143 | B2 | 6/2012 | Imai |
| 8,207,756 | B2 | 6/2012 | Shionoiri et al. |
| 8,232,552 | B2 | 7/2012 | Yano et al. |
| 8,236,635 | B2 | 8/2012 | Suzawa et al. |
| 8,242,494 | B2 | 8/2012 | Suzawa et al. |
| 8,274,078 | B2 | 9/2012 | Itagaki et al. |
| 8,293,661 | B2 | 10/2012 | Yamazaki |
| 8,304,765 | B2 | 11/2012 | Yamazaki et al. |
| 8,309,961 | B2 | 11/2012 | Yamazaki et al. |
| 8,319,215 | B2 | 11/2012 | Yamazaki et al. |
| 8,319,219 | B2 | 11/2012 | Yamazaki |
| 8,334,532 | B2 | 12/2012 | Umeda et al. |
| 8,343,799 | B2 | 1/2013 | Ito et al. |
| 8,373,166 | B2 | 2/2013 | Yamazaki |
| 8,735,896 | B2 | 5/2014 | Yamazaki |
| 8,748,215 | B2 | 6/2014 | Yamazaki |
| 8,822,264 | B2 | 9/2014 | Yamazaki et al. |
| 9,007,812 | B2 | 4/2015 | Koyama et al. |
| 9,082,857 | B2 | 7/2015 | Yamazaki et al. |
| 9,196,713 | B2 | 11/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0201023 | A1 | 10/2004 | Yamazaki et al. |
| 2005/0017302 | A1 | 1/2005 | Hoffman |
| 2005/0039670 | A1 | 2/2005 | Hosono et al. |
| 2005/0145840 | A1 | 7/2005 | Kato et al. |
| 2005/0179034 | A1 | 8/2005 | Chikyow et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0057261 | A1 | 3/2007 | Jeong et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0213984 | A1 | 9/2008 | Moriwaka |
| 2008/0224133 | A1 | 9/2008 | Park et al. |
| 2008/0224215 | A1 | 9/2008 | Yamazaki et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2009/0002590 | A1 | 1/2009 | Kimura |
| 2009/0008638 | A1 | 1/2009 | Kang et al. |
| 2009/0068773 | A1 | 3/2009 | Lai et al. |
| 2009/0072232 | A1 | 3/2009 | Hayashi et al. |
| 2009/0073325 | A1 | 3/2009 | Kuwabara et al. |
| 2009/0111244 | A1 | 4/2009 | Yamazaki et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189155 | A1 | 7/2009 | Akimoto |
| 2009/0189156 | A1 | 7/2009 | Akimoto |
| 2009/0278122 | A1 | 11/2009 | Hosono et al. |
| 2009/0280600 | A1 | 11/2009 | Hosono et al. |

(56) References Cited

U.S. PATENT DOCUMENTS

| | | |
|---|---|---|
| 2009/0283762 A1 | 11/2009 | Kimura |
| 2010/0006836 A1 | 1/2010 | Koukitu et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0102450 A1 | 4/2010 | Narayan |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123130 A1 | 5/2010 | Akimoto et al. |
| 2010/0123136 A1 | 5/2010 | Lee et al. |
| 2010/0148170 A1 | 6/2010 | Ueda et al. |
| 2010/0155717 A1 | 6/2010 | Yano et al. |
| 2010/0193782 A1 | 8/2010 | Sakata |
| 2010/0219410 A1 | 9/2010 | Godo et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0031497 A1 | 2/2011 | Yamazaki et al. |
| 2011/0032444 A1 | 2/2011 | Yamazaki et al. |
| 2011/0050733 A1 | 3/2011 | Yano et al. |
| 2011/0062433 A1 | 3/2011 | Yamazaki |
| 2011/0062436 A1 | 3/2011 | Yamazaki et al. |
| 2011/0068335 A1 | 3/2011 | Yamazaki et al. |
| 2011/0084266 A1 | 4/2011 | Yamazaki et al. |
| 2011/0084271 A1 | 4/2011 | Yamazaki et al. |
| 2011/0101352 A1 | 5/2011 | Hosono et al. |
| 2011/0117698 A1 | 5/2011 | Suzawa et al. |
| 2011/0133191 A1 | 6/2011 | Yamazaki |
| 2011/0193083 A1 | 8/2011 | Kim et al. |
| 2011/0201162 A1 | 8/2011 | Hosono et al. |
| 2011/0215328 A1 | 9/2011 | Morosawa et al. |
| 2012/0012838 A1 | 1/2012 | Hosono et al. |
| 2012/0119205 A1 | 5/2012 | Taniguchi et al. |
| 2012/0256179 A1 | 10/2012 | Yamazaki et al. |
| 2014/0349443 A1 | 11/2014 | Yamazaki |
| 2015/0213843 A1 | 7/2015 | Koyama et al. |
| 2015/0303280 A1 | 10/2015 | Yamazaki et al. |

FOREIGN PATENT DOCUMENTS

| | | |
|---|---|---|
| CN | 101409221 A | 4/2009 |
| CN | 101752428 A | 6/2010 |
| CN | 101931009 A | 12/2010 |
| CN | 102436846 A | 5/2012 |
| CN | 102668028 A | 9/2012 |
| EP | 1271626 A | 1/2003 |
| EP | 1443130 A | 8/2004 |
| EP | 1489654 A | 12/2004 |
| EP | 1737044 A | 12/2006 |
| EP | 2159845 A | 3/2010 |
| EP | 2197034 A | 6/2010 |
| EP | 2226847 A | 9/2010 |
| EP | 2246894 A | 11/2010 |
| EP | 2504855 A | 6/2011 |
| EP | 2413366 A | 2/2012 |
| EP | 2423966 A | 2/2012 |
| JP | 60-198861 A | 10/1985 |
| JP | 63-079791 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-008340 A | 1/1997 |
| JP | 09-037391 A | 2/1997 |
| JP | 11-135431 A | 5/1999 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-029293 A | 1/2003 |
| JP | 2003-041362 A | 2/2003 |
| JP | 2003-086000 A | 3/2003 |
| JP | 2003-086808 A | 3/2003 |
| JP | 2003-137692 A | 5/2003 |
| JP | 2003-318201 A | 11/2003 |
| JP | 2004-006562 A | 1/2004 |
| JP | 2004-022625 A | 1/2004 |
| JP | 2004-103957 A | 4/2004 |
| JP | 2004-273614 A | 9/2004 |
| JP | 2004-273732 A | 9/2004 |
| JP | 2005-340370 A | 12/2005 |
| JP | 2006-165528 A | 6/2006 |
| JP | 2006-165529 A | 6/2006 |
| JP | 2007-081362 A | 3/2007 |
| JP | 2007-096055 A | 4/2007 |
| JP | 2007-115735 A | 5/2007 |
| JP | 2007-121788 A | 5/2007 |
| JP | 2007-123861 A | 5/2007 |
| JP | 2007-158147 A | 6/2007 |
| JP | 2007-163467 A | 6/2007 |
| JP | 2007-171932 A | 7/2007 |
| JP | 2007-220820 A | 8/2007 |
| JP | 2008-533693 | 8/2008 |
| JP | 2008-277665 A | 11/2008 |
| JP | 2009-010362 A | 1/2009 |
| JP | 2009-099847 A | 5/2009 |
| JP | 2009-135430 A | 6/2009 |
| JP | 2009-167087 A | 7/2009 |
| JP | 2009-231613 A | 10/2009 |
| JP | 2009-265271 A | 11/2009 |
| JP | 2010-016347 A | 1/2010 |
| JP | 4415062 | 2/2010 |
| JP | 2010-067954 A | 3/2010 |
| JP | 2010-080947 A | 4/2010 |
| JP | 2010-080952 A | 4/2010 |
| JP | 2010-098280 A | 4/2010 |
| JP | 2010-177431 A | 8/2010 |
| JP | 2010-219538 A | 9/2010 |
| JP | 2010-226101 A | 10/2010 |
| JP | 2010-232623 A | 10/2010 |
| JP | 4571221 | 10/2010 |
| JP | 2012-160679 A | 8/2012 |
| KR | 2008-0066678 A | 7/2008 |
| KR | 2009-0037332 A | 4/2009 |
| KR | 2010-0137379 A | 12/2010 |
| TV | 200506450 | 2/2005 |
| WO | WO-2004/114391 | 12/2004 |
| WO | WO-2007/058231 | 5/2007 |
| WO | WO-2007/094501 | 8/2007 |
| WO | WO-2007/108293 | 9/2007 |
| WO | WO-2007/142167 | 12/2007 |
| WO | WO-2008/096768 | 8/2008 |
| WO | WO-2008/117810 | 10/2008 |
| WO | WO-2008/126879 | 10/2008 |
| WO | WO-2008/126884 | 10/2008 |
| WO | WO-2008/133345 | 11/2008 |
| WO | WO-2008/149873 | 12/2008 |
| WO | WO-2009/034953 | 3/2009 |
| WO | WO-2011/065216 | 6/2011 |

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Invitation to pay additional fees (Application No. PCT/JP2011/077292), International Searching Authority, Dated Dec. 27, 2011.

(56) References Cited

OTHER PUBLICATIONS

Fortunato.E et al., "Wide-Bandgap High-Mobility Zno Thin-Film Transistors Produced at Room Temperature", Appl. Phys. Lett. (Applied Physics Letters), Sep. 27, 2004, vol. 85, No, 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc—Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papes, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc-Indium-Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SIS Sigest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Chapter 2 Basic concept necessary for crystal growth, Handbook of Crystal Growth, Sep. 1, 1995, p. 22, Kyoritsu Shuppan.
Korean Office Action (Application No. 2013-7018239) Dated Apr. 3, 2014.
Chinese Office Action (Application No. 201180066610.6) Dated May 6, 2015.
Taiwanese Office Action (Application No. 100144209) Dated May 20, 2015.
Chinese Office Action (Application No. 201310376877.6) Dated Aug. 3, 2015.
Taiwanese Office Action (Application No. 104127326) Dated Feb. 23, 2016.

* cited by examiner

FIG. 8A
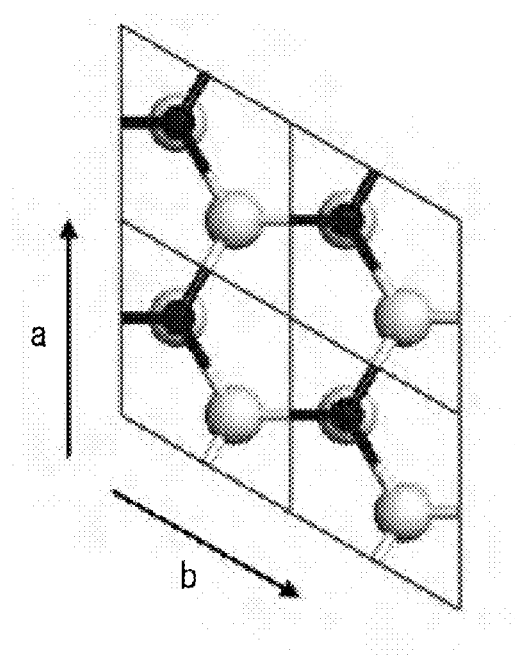
FIG. 8B
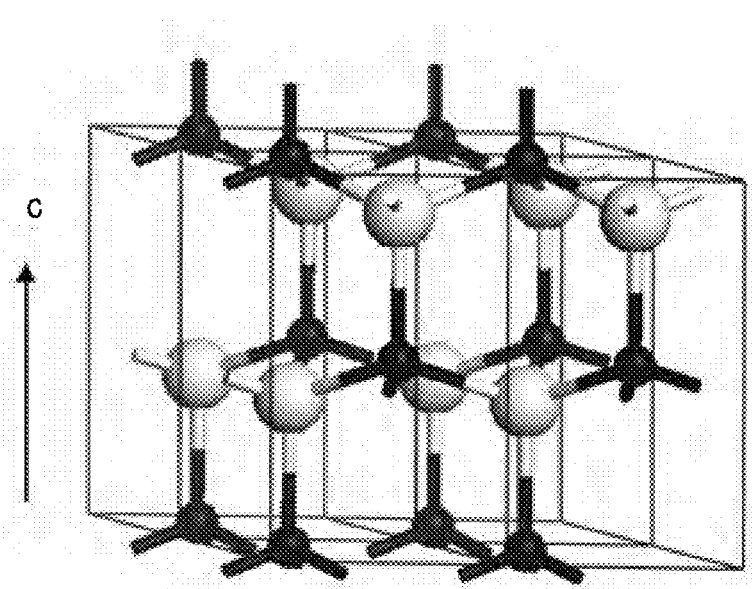

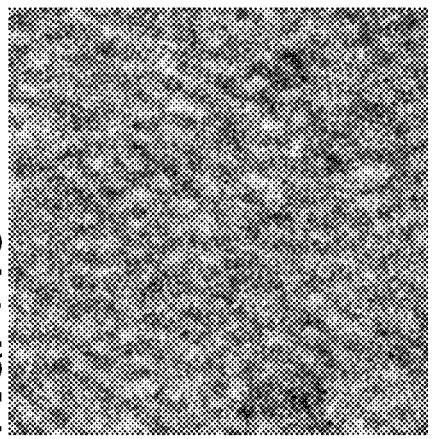
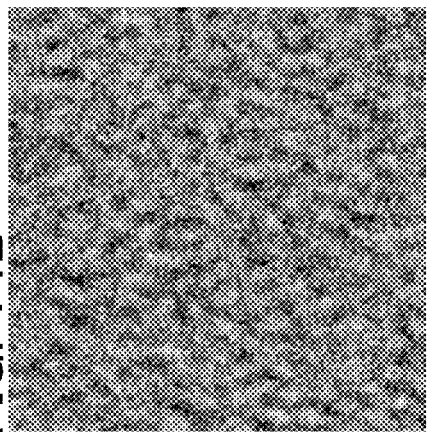
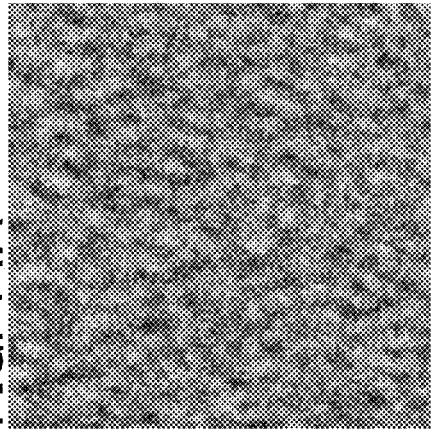
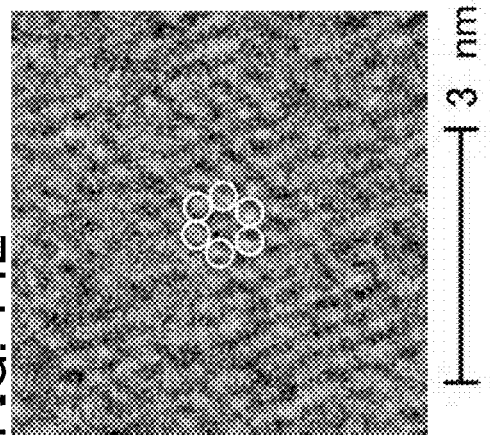
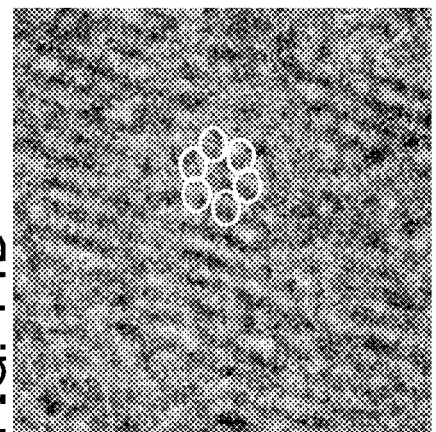

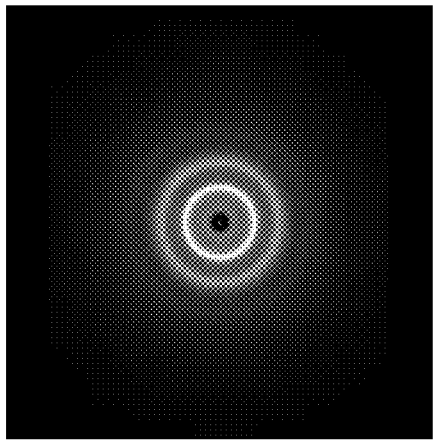
FIG. 15C
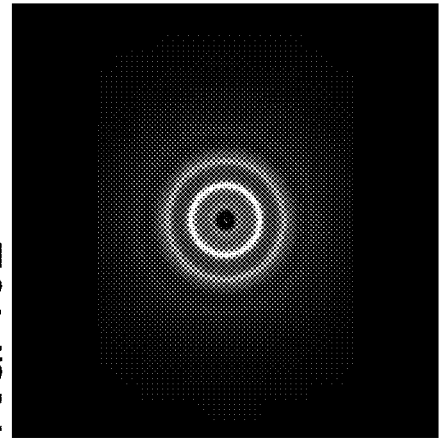
FIG. 15E
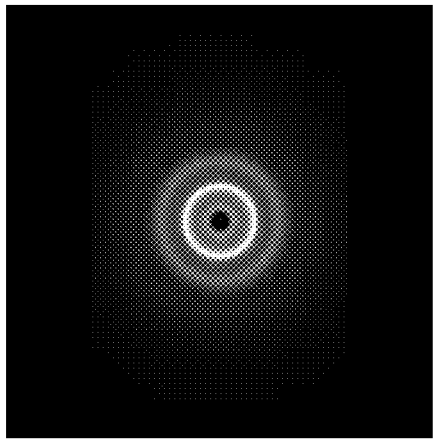
FIG. 15B
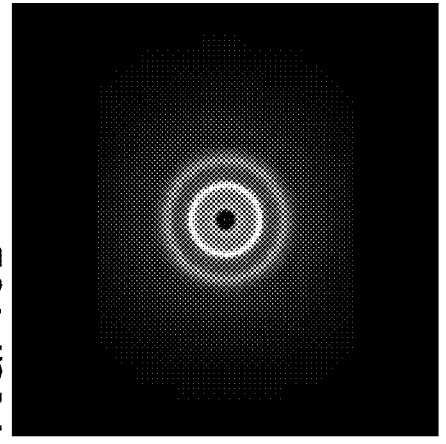
FIG. 15D
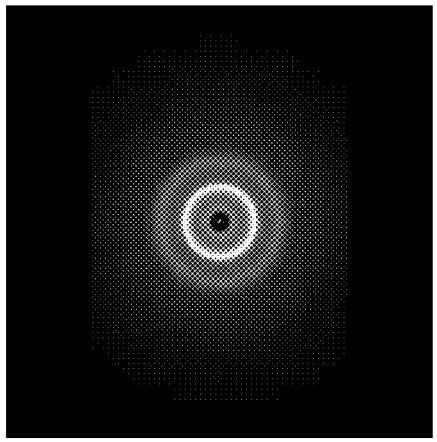
FIG. 15A
⊙ Direction of a top surface of the sample Direction of a top surface of the sample 3 nm FIG. 23
| model | 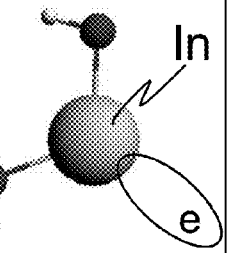 | 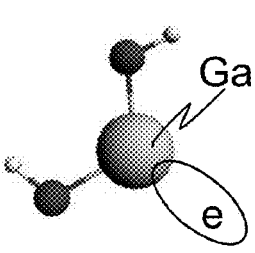 | 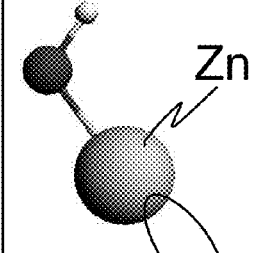 |
|---|---|---|---|
| g value | 1.984 | 1.995 | 1.996 |

OXIDE SEMICONDUCTOR FILM AND SEMICONDUCTOR DEVICE

TECHNICAL FIELD

An embodiment of the present invention relates to an oxide semiconductor film and a semiconductor device including the oxide semiconductor film.

In this specification, a semiconductor device refers to any device that can function by utilizing semiconductor characteristics, and electro-optical devices, semiconductor circuits, and electronic devices are all semiconductor devices.

BACKGROUND ART

As typically seen in a liquid crystal display device, a transistor formed over a glass substrate or the like is manufactured using amorphous silicon, polycrystalline silicon, or the like. A transistor manufactured using amorphous silicon can easily be formed over a larger glass substrate. However, a transistor manufactured using amorphous silicon has a disadvantage of low field-effect mobility. Although a transistor manufactured using polycrystalline silicon has high field-effect mobility, it has a disadvantage of not being suitable for a larger glass substrate.

In contrast to a transistor manufactured using silicon with disadvantages as described above, a technique in which a transistor is manufactured using an oxide semiconductor and applied to an electronic device or an optical device has attracted attention. For example, Patent Document 1 discloses a technique in which a transistor is manufactured using an amorphous oxide containing In, Zn, Ga, Sn, and the like as an oxide semiconductor. In addition, Patent Document 2 discloses a technique in which a transistor similar to that in Patent Document 1 is manufactured and used as a switching element or the like in a pixel of a display device.

In addition, as for such an oxide semiconductor used in a transistor, there is also description as follows: an oxide semiconductor is insensitive to impurities, there is no problem when a considerable amount of metal impurities are contained in a film, and soda-lime glass which contains a large amount of alkali metals such as sodium and is inexpensive can also be used (see Non-Patent Document 1).

REFERENCE

Patent Document

[Patent Document 1] Japanese Published Patent Application No. 2006-165529
[Patent Document 2] Japanese Published Patent Application No. 2006-165528

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633

DISCLOSURE OF INVENTION

However, the electric conductivity of an oxide semiconductor film might change when, for example, a defect typified by an oxygen defect is generated in the oxide semiconductor film, or hydrogen which is to be a source for supplying a carrier enters the oxide semiconductor film in a manufacturing process of the oxide semiconductor film and a semiconductor device including the oxide semiconductor film. Such a phenomenon changes the electric characteristics of a transistor including the oxide semiconductor film, which leads to a reduction in reliability of the semiconductor device.

When such an oxide semiconductor film is irradiated with visible light or ultraviolet light, the electric conductivity, particularly, of the oxide semiconductor film might change. Such a phenomenon also changes the electric characteristics of the transistor including the oxide semiconductor film, which leads to a reduction in reliability of the semiconductor device.

In view of the above problems, it is an object to provide an oxide semiconductor film which has more stable electric conductivity. In addition, it is an object to provide a highly reliable semiconductor device which has stable electric characteristics by using the oxide semiconductor film.

An embodiment of the disclosed invention provides an oxide semiconductor film including a crystalline region, and the crystalline region includes a crystal in which an a-b plane is substantially parallel with a surface of the film and a c-axis is substantially perpendicular to the surface of the film. That is, the crystalline region in the oxide semiconductor film has c-axis alignment. Note that the oxide semiconductor film is in a non-single-crystal state. In addition, the oxide semiconductor film is not entirely in an amorphous state.

An embodiment of the disclosed invention provides an oxide semiconductor film including a crystalline region. The crystalline region includes a crystal in which an a-b plane is substantially parallel with a surface of the film and a c-axis is substantially perpendicular to the surface of the film. In measurement of electron diffraction intensity in which irradiation with an electron beam is performed from a c-axis direction, the full width at half maximum of a peak in a region where the magnitude of a scattering vector is greater than or equal to 3.3 $nm^{-1}$ and less than or equal to 4.1 $nm^{-1}$ and the full width at half maximum of a peak in a region where the magnitude of a scattering vector is greater than or equal to 5.5 $nm^{-1}$ and less than or equal to 7.1 $nm^{-1}$ are each greater than or equal to 0.2 $nm^{-}$.

In the above, the full width at half maximum of a peak in a region where the magnitude of a scattering vector is greater than or equal to 3.3 $nm^{-1}$ and less than or equal to 4.1 $nm^{-1}$ is preferably greater than or equal to 0.4 $nm^{-1}$ and less than or equal to 0.7 $nm^{-1}$, and the full width at half maximum of a peak in a region where the magnitude of a scattering vector is greater than or equal to 5.5 $nm^{-1}$ and less than or equal to 7.1 $nm^{-1}$ is preferably greater than or equal to 0.45 $nm^{-1}$ and less than or equal to 1.4 $nm^{-1}$. In addition, the spin density of a peak in a region where the g value is in the vicinity of 1.93 in ESR measurement is preferably lower than $1.3 \times 10^{18}$ (spins/$cm^3$). In addition, the oxide semiconductor film may include plural crystalline regions, and a-axis or b-axis directions of crystals in the plural crystalline regions may be different from each other. In addition, the oxide semiconductor film preferably has a structure represented by $InGaO_3(ZnO)_m$ (m is not a natural number).

In addition, another embodiment of the disclosed invention provides a semiconductor device including a first insulating film; an oxide semiconductor film including a crystalline region, provided over the first insulating film; a source electrode and a drain electrode provided in contact with the oxide semiconductor film; a second insulating film provided over the oxide semiconductor film; and a gate electrode provided over the second insulating film. The crystalline region includes a crystal in which an a-b plane is substantially parallel with a surface of the film and a c-axis is substantially perpendicular to the surface of the film.

In addition, another embodiment of the disclosed invention provides a semiconductor device including a gate electrode; a first insulating film provided over the gate electrode; an oxide semiconductor film including a crystalline region, provided over the first insulating film; a source electrode and a drain electrode provided in contact with the oxide semiconductor film; and a second insulating film provided over the oxide semiconductor film. The crystalline region includes a crystal in which an a-b plane is substantially parallel with a surface of the film and a c-axis is substantially perpendicular to the surface of the film.

In the above, preferably, a first metal oxide film is provided between the first insulating film and the oxide semiconductor film, the first metal oxide film includes gallium oxide, zinc oxide, and a crystalline region, and the crystalline region includes a crystal in which an a-b plane is substantially parallel with a surface of the film and a c-axis is substantially perpendicular to the surface of the film. In addition, in the first metal oxide film, the amount of substance of zinc oxide is preferably lower than 25% of the amount of substance of gallium oxide. In addition, preferably, a second metal oxide film is provided between the oxide semiconductor film and the second insulating film, the second metal oxide film includes gallium oxide, zinc oxide, and a crystalline region, and the crystalline region includes a crystal in which an a-b plane is substantially parallel with a surface of the film and a c-axis is substantially perpendicular to the surface of the film. In addition, in the second metal oxide film, the amount of substance of zinc oxide is preferably lower than 25% of the amount of substance of gallium oxide.

In this specification and the like, "a plane A is substantially parallel with a plane B" means "an angle between a normal of the plane A and a normal of the plane B is greater than or equal to 0° and less than or equal to 20°." In addition, in this specification and the like, "a line C is substantially perpendicular to the plane B" means "an angle between the line C and the normal of the plane B is greater than or equal to 0° and less than or equal to 20°."

An oxide semiconductor film including a crystalline region in which an a-b plane is substantially parallel with a surface of the film and a c-axis is substantially perpendicular to the surface of the film has stable electric conductivity and is more electrically stable with respect to irradiation with visible light, ultraviolet light, and the like. By using such an oxide semiconductor film for a transistor, a highly reliable semiconductor device having stable electric characteristics can be provided.

BRIEF DESCRIPTION OF DRAWINGS

FIGS. 8A and 8B are schematic diagrams illustrating a crystal structure of a seed crystal.

FIGS. 14A to 14E are plane TEM images according an example of the present invention.

FIGS. 15A to 15E are electron diffraction patterns according to an example of the present invention.

FIG. 23 illustrates models of an oxygen defect used in quantum chemistry calculation according to an example of the present invention.

BEST MODE FOR CARRYING OUT THE INVENTION

Figure 1:
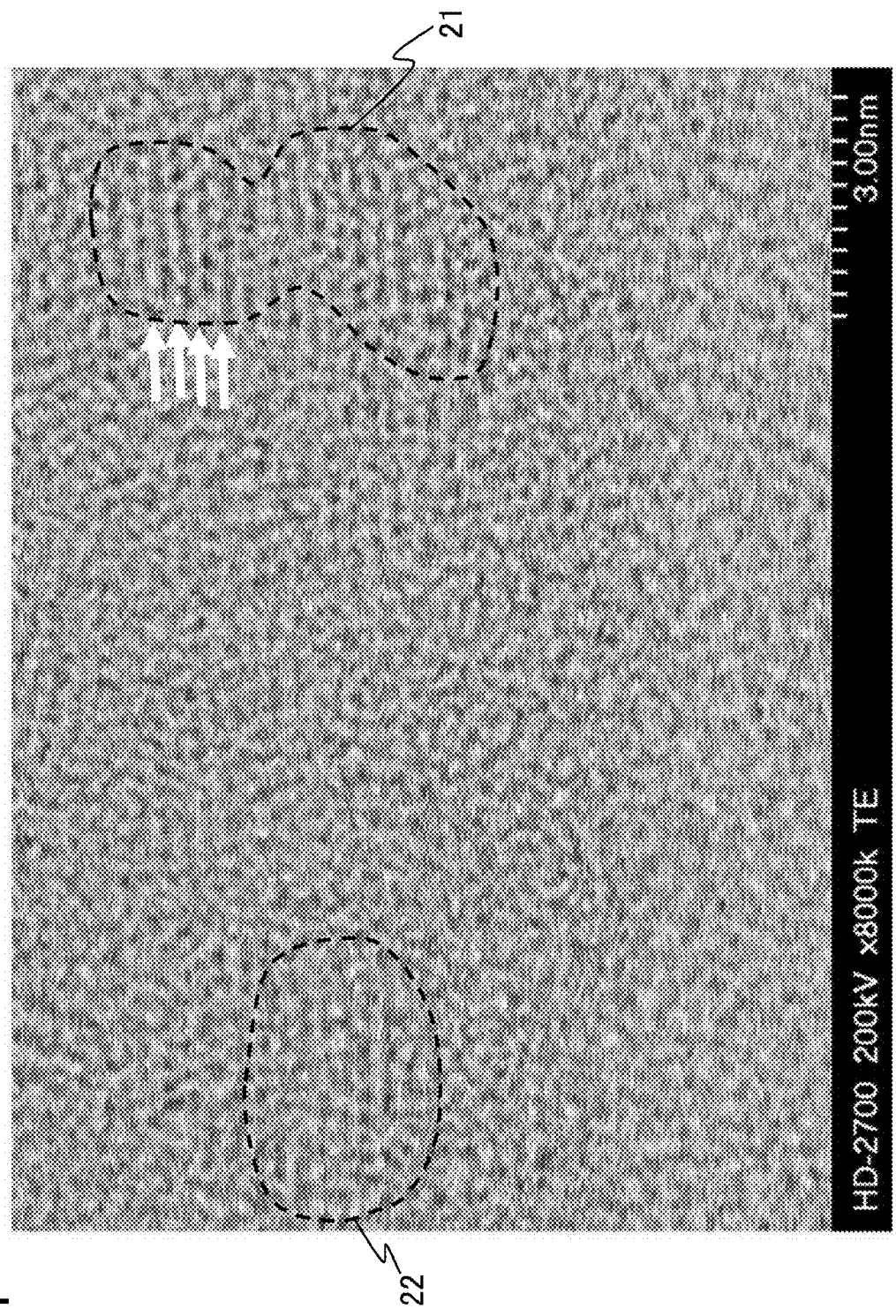
FIG. 1 is a cross-sectional TEM image according to an embodiment of the present invention.

Embodiments and Example of the present invention will be described in detail with reference to the accompanying drawings. Note that the present invention is not limited to the following description, and it will be easily understood by those skilled in the art that modes and details thereof can be modified in various ways without departing from the spirit and the scope of the present invention. Therefore, the present invention should not be construed as being limited to the description in the following embodiments and example. Note that in structures of the present invention described hereinafter, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments and an example of the present invention are not always limited to such scales.

In addition, terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

In this embodiment, an oxide semiconductor film will be described as an embodiment of the present invention with reference to FIG. 1, FIG. 2, FIG. 3, FIG. 4, and FIGS. 5A and 5B.

An oxide semiconductor film according to this embodiment includes a crystalline region. The crystalline region includes a crystal in which an a-b plane is substantially parallel with a surface of the film and a c-axis is substantially perpendicular to the surface of the film. That is, the crystalline region included in the oxide semiconductor film has c-axis alignment. When a cross section of the crystalline region is observed, atoms arranged in a layered manner and stacked from a substrate toward the surface of the film are observed, and the c-axis of the crystal is substantially perpendicular to the surface. Since the oxide semiconductor film includes the crystalline region with c-axis alignment as described above, the oxide semiconductor film is also referred to as a c-axis aligned crystalline oxide semiconductor (CAAC-OS) film.

FIG. 1 is a cross-sectional TEM image of an oxide semiconductor film including a crystalline region, which was actually manufactured. A crystalline region 21 in which, as indicated by arrows in FIG. 1, atoms are arranged in a layered manner, that is, which has c-axis alignment, is observed in the oxide semiconductor film.

A crystalline region 22 is also observed in the oxide semiconductor film. The crystalline region 21 and the crystalline region 22 are surrounded by an amorphous region in a three-dimensional manner. Although plural crystalline regions exist in the oxide semiconductor film, a crystal boundary is not observed in FIG. 1. A crystal boundary is not observed in the entire oxide semiconductor film, either.

Although the crystalline region 21 and the crystalline region 22 are separated from each other with the amorphous region provided therebetween in FIG. 1, it appears that atoms arranged in a layered manner in the crystalline region 21 are stacked at substantially the same intervals as in the crystalline region 22 and layers are continuously formed beyond the amorphous region.

Figure 31:
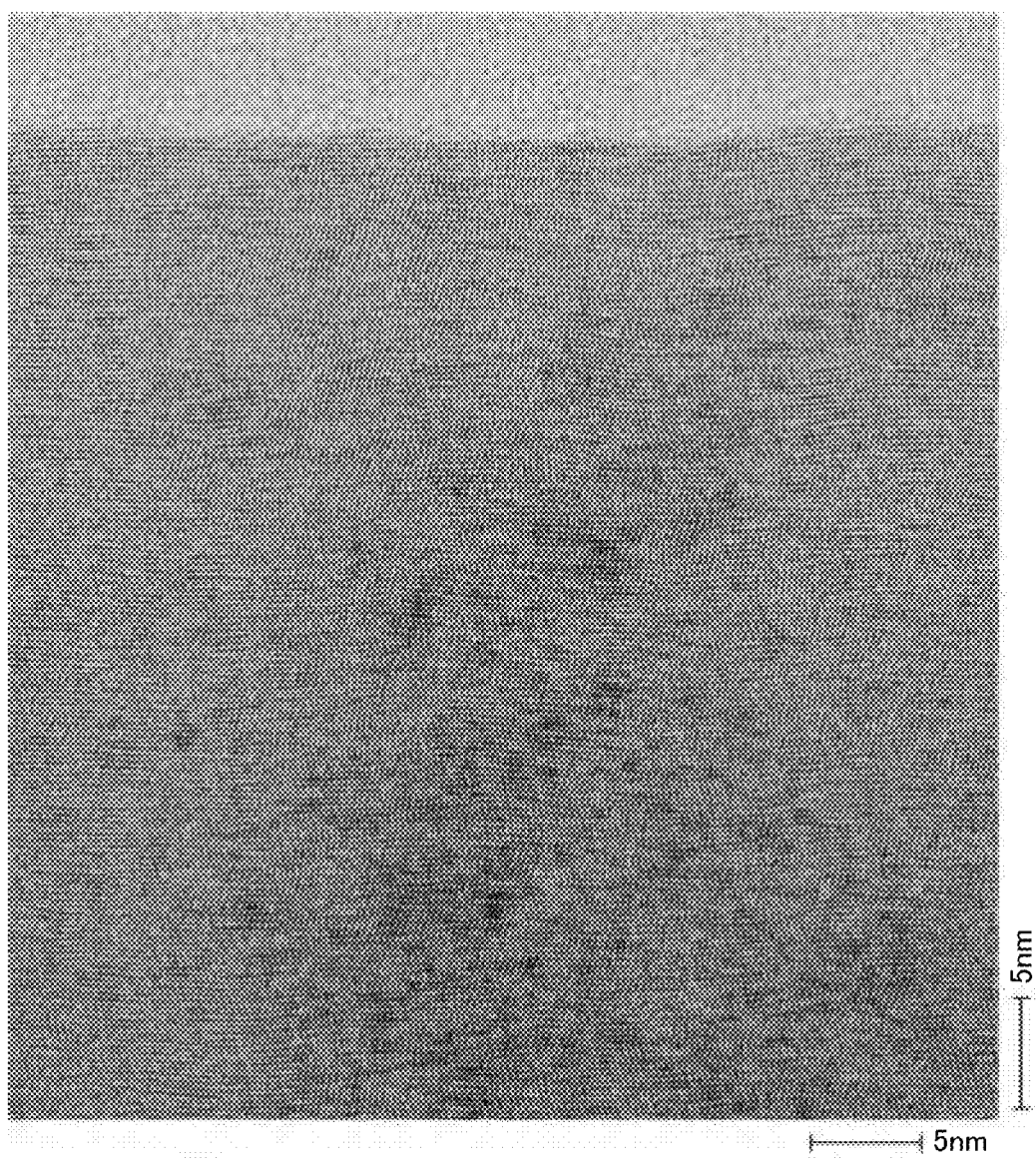
FIG. 31 is a cross-sectional TEM image according to an embodiment of the present invention.

In addition, although the crystalline region 21 and the crystalline region 22 are about 3 nm to 7 nm in size in FIG. 1, the size of the crystalline region formed in the oxide semiconductor film in this embodiment can be about greater than or equal to 1 nm and less than or equal to 1000 nm. For example, as shown in FIG. 31, the size of the crystalline region of the oxide semiconductor film can be greater than or equal to several tens of nanometers.

In addition, it is preferable that when the crystalline region is observed from a direction perpendicular to the surface of the film, atoms be arranged in a hexagonal lattice. With such a structure, the crystalline region can easily have a hexagonal crystal structure having three-fold symmetry. Note that in this specification, a hexagonal crystal structure is included in a hexagonal crystal family. Alternatively, a hexagonal crystal structure is included in trigonal and hexagonal crystal systems.

The oxide semiconductor film according to this embodiment may include plural crystalline regions, and a-axis or b-axis directions of crystals in the plural crystal regions may be different from each other. That is, the plural crystalline regions in the oxide semiconductor film according to this embodiment are crystallized along the c-axes but alignment along the a-b planes does not necessarily appear. However, it is preferable that regions with different a-axis or b-axis directions be not in contact with each other so as not to form a crystal boundary at an interface where the regions are in contact with each other. Therefore, the oxide semiconductor film preferably includes an amorphous region surrounding the crystalline region in a three-dimensional manner. That is, the oxide semiconductor film including a crystalline region is in a non-single-crystal state and not entirely in an amorphous state.

As the oxide semiconductor film, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide, or the like can be used.

Above all, an In—Ga—Zn—O-based metal oxide has an energy gap that is as wide as greater than or equal to 2 eV, preferably greater than or equal to 2.5 eV, more preferably greater than or equal to 3 eV in many cases; when a transistor is manufactured using the In—Ga—Zn—O-based metal oxide, the transistor can have sufficiently high resistance in an off state and its off-state current can be sufficiently small. A crystalline region in an In—Ga—Zn—O-based metal oxide mainly has a crystal structure which is not a hexagonal wurtzite structure in many cases and may have, for example, a YbFe$_2$O$_4$ structure, a Yb$_2$Fe$_3$O$_7$ structure, a modified structure thereof, or the like (M. Nakamura, N. Kimizuka, and T. Mohri, "The Phase Relations in the In$_2$O$_3$—Ga$_2$ZnO$_4$—ZnO System at 1350° C.", *J. Solid State Chem.*, 1991, Vol. 93, pp. 298-315). Note that a layer containing Yb is denoted by an A layer and a layer containing Fe is denoted by a B layer, below. The YbFe$_2$O$_4$ structure is a repeated structure of ABB|ABB|ABB. As an example of a deformed structure of the YbFe$_2$O$_4$ structure, a repeated structure of ABBB|ABBB can be given. Further, the Yb$_2$Fe$_3$O$_7$ structure is a repeated structure of ABB|AB|ABB|AB. As an example of a deformed structure of the Yb$_2$Fe$_3$O$_7$ structure, a repeated structure of ABBB|ABB|ABBB|ABB|ABBB|ABB| can be given. In the case where the amount of ZnO is large in an In—Ga—Zn—O-based metal oxide, it may have a wurtzite crystal structure.

A typical example of an In—Ga—Zn—O-based metal oxide is represented by InGaO$_3$(ZnO)$_m$ (m>0). Here, as an example of an In—Ga—Zn—O-based metal oxide, a metal oxide having a composition ratio where In$_2$O$_3$:Ga$_2$O$_3$:ZnO=1:1:1 [molar ratio], a metal oxide having a composition ratio where In$_2$O$_3$:Ga$_2$O$_3$:ZnO=1:1:2 [molar ratio], or a metal oxide having a composition ratio where $In_2O_3:Ga_2O_3:ZnO=1:1:4$ [molar ratio] can be given. It is preferable that m be not a natural number. Note that the above-described compositions are attributed to crystal structures and are just examples. As an example of an In—Ga—Zn—O-based metal oxide, a metal oxide having a composition ratio where $In_2O_3:Ga_2O_3:ZnO=2:1:8$ [molar ratio], a metal oxide having a composition ratio where $In_2O_3:Ga_2O_3:ZnO=3:1:4$ [molar ratio], or a metal oxide having a composition ratio where $In_2O_3:Ga_2O_3:ZnO=2:1:6$ [molar ratio] may also be given.

Figure 2:
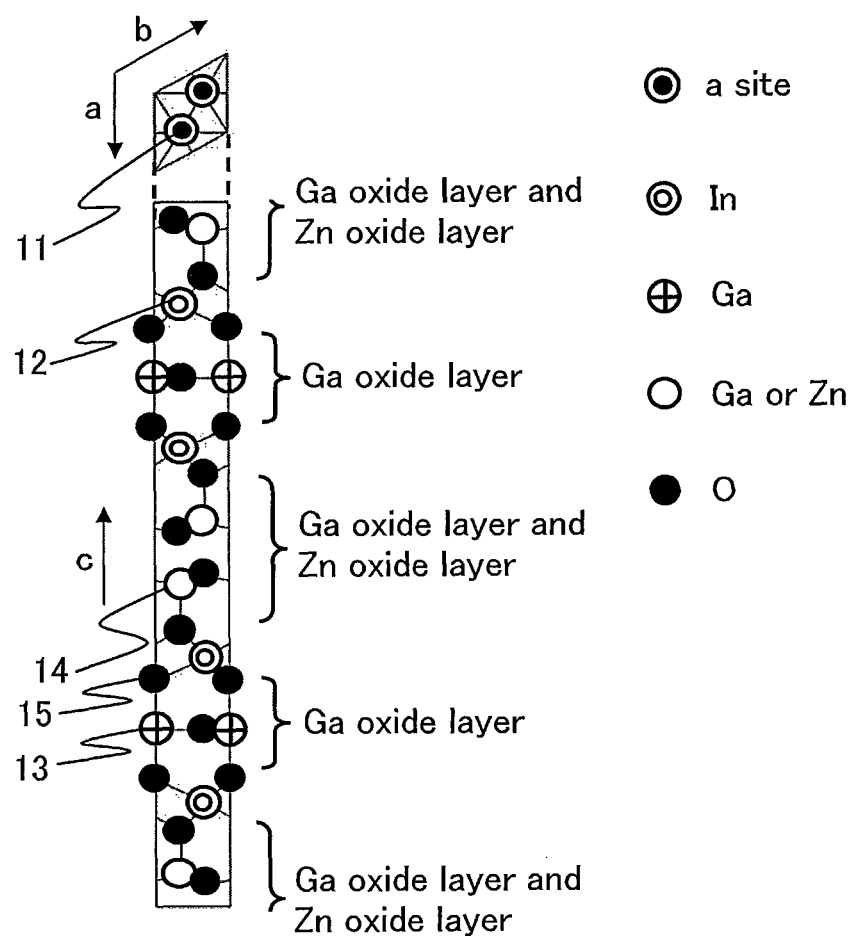
FIG. 2 illustrates a plan view and a cross-sectional view of a crystal structure according to an embodiment of the present invention.

FIG. 2 illustrates a crystal structure of $In_2Ga_2ZnO_7$ as an example of a structure of a crystalline region included in an oxide semiconductor film, which has the above structure. The crystal structure of $In_2Ga_2ZnO_7$ in FIG. 2 is shown by a plan view parallel with an a-axis and a b-axis and a cross-sectional view parallel with a c-axis. The c-axis is perpendicular to the a-axis and the b-axis, and an angle between the a-axis and the b-axis is 120°. As for $In_2Ga_2ZnO_7$ in FIG. 2, a site 11 which can be occupied by an In atom is illustrated in the plan view, and an In atom 12, a Ga atom 13, a Ga or Zn atom 14, and an O atom 15 are illustrated in the cross-sectional view.

As illustrated in the cross-sectional view of FIG. 2, $In_2Ga_2ZnO_7$ has a structure in which one Ga oxide layer between In oxide layers and two oxide layers, that is, one Ga oxide layer and one Zn oxide layer, between In oxide layers are alternatively stacked in the c-axis direction. In addition, as illustrated in the plan view of FIG. 2, $In_2Ga_2ZnO_7$ has a hexagonal crystal structure having three-fold symmetry.

The oxide semiconductor film including a crystalline region described in this embodiment preferably has crystallinity of a certain level. In addition, the oxide semiconductor film including a crystalline region is not in a single crystal state. The oxide semiconductor film including a crystalline region has favorable crystallinity as compared to an oxide semiconductor film which is entirely amorphous, and defects typified by oxygen defects or impurities such as hydrogen bonded to dangling bonds or the like are reduced. In particular, oxygen which is bonded to a metal atom in a crystal has higher bonding force than oxygen which is bonded to a metal atom in an amorphous portion and becomes less reactive to an impurity such as hydrogen, so that generation of defects can be reduced.

For example, an oxide semiconductor film which is formed of an In—Ga—Zn—O-based metal oxide and includes a crystalline region has such crystallinity that in measurement of electron diffraction intensity in which irradiation with an electron beam is performed from the c-axis direction, the full width at half maximum of a peak in a region where the magnitude of a scattering vector is greater than or equal to 3.3 $nm^{-1}$ and less than or equal to 4.1 $nm^{-1}$ and the full width at half maximum of a peak in a region where the magnitude of a scattering vector is greater than or equal to 5.5 $nm^{-1}$ and less than or equal to 7.1 $nm^{-1}$ are each greater than or equal to 0.2 $nm^{-1}$. Preferably, the full width at half maximum of a peak in a region where the magnitude of a scattering vector is greater than or equal to 3.3 $nm^{-1}$ and less than or equal to 4.1 $nm^{-1}$ is greater than or equal to 0.4 $nm^{-1}$ and less than or equal to 0.7 $nm^{-1}$, and the full width at half maximum of a peak in a region where the magnitude of a scattering vector is greater than or equal to 5.5 $nm^{-1}$ and less than or equal to 7.1 $nm^{-1}$ is greater than or equal to 0.45 $nm^{-1}$ and less than or equal to 1.4 $nm^{-1}$.

In the oxide semiconductor film including a crystalline region described in this embodiment, defects typified by oxygen defects in the film are preferably reduced as described above. Defects typified by oxygen defects function as sources for supplying carriers in the oxide semiconductor film, which might change the electric conductivity of the oxide semiconductor film. Therefore, the oxide semiconductor film including a crystalline region in which such defects are reduced has stable electric conductivity and is more electrically stable with respect to irradiation with visible light, ultraviolet light, and the like.

By performing electron spin resonance (ESR) measurement on the oxide semiconductor film including a crystalline region, the amount of lone electrons in the film can be measured, and the amount of oxygen defects can be estimated. For example, in the oxide semiconductor film which is formed of an In—Ga—Zn—O-based metal oxide and includes a crystalline region, the spin density of a peak in a region where the g value is in the vicinity of 1.93 in ESR measurement is lower than $1.3\times10^{18}$ (spins/$cm^3$), preferably lower than or equal to $5\times10^{17}$ (spins/$cm^3$), more preferably lower than or equal to $5\times10^{16}$ (spins/$cm^3$), much more preferably $1\times10^{16}$ (spins/$cm^3$).

As described above, hydrogen or impurities containing hydrogen such as water, a hydroxyl group, or a hydride in the oxide semiconductor film including a crystalline region are preferably reduced, and the concentration of hydrogen in the oxide semiconductor film including a crystalline region is preferably lower than or equal to $1\times10^{19}$ atoms/$cm^3$. Hydrogen bonded to a dangling bond or the like, or an impurity containing hydrogen such as water, a hydroxyl group, or a hydride functions as a source for supplying a carrier in the oxide semiconductor film, which might change the electric conductivity of the oxide semiconductor film. In addition, hydrogen contained in the oxide semiconductor film reacts with oxygen bonded to a metal atom to be water, and a defect is formed in a lattice from which oxygen is detached (or a portion from which oxygen is detached). Therefore, the oxide semiconductor film including a crystalline region in which such defects are reduced has stable electric conductivity and is more electrically stable with respect to irradiation with visible light, ultraviolet light, and the like.

Note that impurities such as an alkali metal in the oxide semiconductor film including a crystalline region are preferably reduced. For example, in the oxide semiconductor film including a crystalline region, the concentration of lithium is lower than or equal to $5\times10^{15}$ $cm^{-3}$, preferably lower than or equal to $1\times10^{15}$ $cm^{-3}$; the concentration of sodium is lower than or equal to $5\times10^{16}$ $cm^{-3}$, preferably lower than or equal to $1\times10^{16}$ $cm^{-3}$, more preferably lower than or equal to $1\times10^{15}$ $cm^{-3}$; and the concentration of potassium is lower than or equal to $5\times10^{15}$ $cm^{-3}$, preferably lower than or equal to $1\times10^{15}$ $cm^{-3}$.

An alkali metal and an alkaline earth metal are adverse impurities for the oxide semiconductor film including a crystalline region and are preferably contained as little as possible. In particular, when the oxide semiconductor film is used for a transistor, sodium that is one of alkali metals diffuses into an insulating film in contact with the oxide semiconductor film including a crystalline region and thus a carrier is possibly supplied to the oxide semiconductor film. In addition, sodium cuts a bond between a metal and oxygen or enters the bond in the oxide semiconductor film including a crystalline region. As a result, transistor characteristics deteriorate (e.g., the transistor becomes normally-on (the shift of a threshold voltage to a negative side) or the mobility is decreased). In addition, this also causes a variation in the characteristics.

Such a problem is significant especially in the case where the concentration of hydrogen in the oxide semiconductor film including a crystalline region is extremely low. Therefore, it is highly preferable to set the concentration of an alkali metal in the above range in the case where the concentration of hydrogen in the oxide semiconductor film including a crystalline region is lower than or equal to $5\times10^{19}$ cm$^{-3}$, particularly lower than or equal to $5\times10^{18}$ cm$^{-3}$. Accordingly, it is preferable that impurities in the oxide semiconductor film including a crystalline region be extremely reduced, the concentration of an alkali metal be lower than or equal to $5\times10^{16}$ atoms/cm$^3$, and the concentration of hydrogen be lower than or equal to $5\times10^{19}$ atoms/cm$^3$.

As described above, the oxide semiconductor film including a crystalline region has favorable crystallinity as compared to an oxide semiconductor film which is entirely amorphous, and defects typified by oxygen defects or impurities such as hydrogen bonded to dangling bonds or the like are reduced. A defect typified by an oxygen defect, hydrogen bonded to a dangling bond or the like, or the like functions as a source for supplying a carrier in the oxide semiconductor film, which might change the electric conductivity of the oxide semiconductor film. Therefore, the oxide semiconductor film including a crystalline region in which such defects are reduced has stable electric conductivity and is more electrically stable with respect to irradiation with visible light, ultraviolet light, and the like. By using such an oxide semiconductor film including a crystalline region for a transistor, a highly reliable semiconductor device having stable electric characteristics can be provided.

Next, a result of examining how the electric conductivity of the oxide semiconductor film is influenced by an oxygen defect in the oxide semiconductor film, using first-principles calculation based on density functional theory, will be described. Note that CASTEP, software of first-principles calculation produced by Accelrys Software Inc., was used for the first-principles calculation. In addition, GGA-PBE was used for a functional, and an ultrasoft type was used for pseudopotential.

In this calculation, as a model of the oxide semiconductor film, a model in which one oxygen atom is detached from amorphous InGaZnO$_4$ and a void (an oxygen defect) is left in that region was used. The model includes 12 In atoms, 12 Ga atoms, 12 Zn atoms, and 47 O atoms. InGaZnO$_4$ having such a structure was subjected to structure optimization in terms of atomic positions, and the electron density of states was calculated. At this time, cut-off energy was set to 300 eV.

Figure 3:
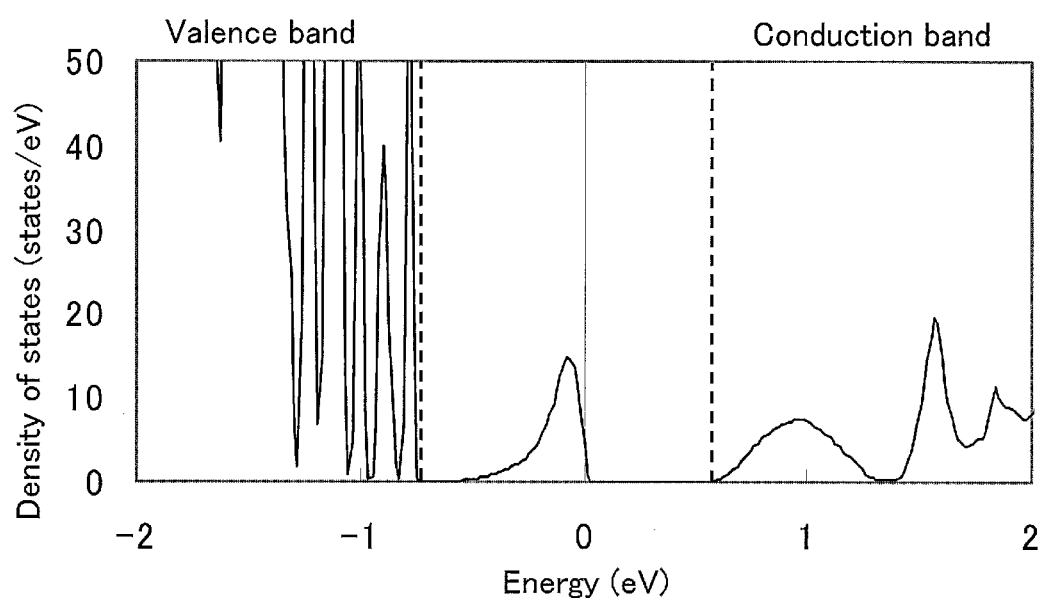
FIG. 3 is a graph showing a result of calculating the electron density of states.

A result of calculating the electron density of states is shown in FIG. 3. In FIG. 3, the vertical axis indicates the density of states (DOS) [states/eV] and the horizontal axis indicates energy [eV]. The Fermi energy is at the origin of the energy, which is spotted on the horizontal axis. As shown in FIG. 3, the top of a valence band of InGaZnO$_4$ is −0.74 eV and the bottom of a conduction band thereof is 0.56 eV. The value of the band gap is very small as compared to 3.15 eV which is an experimental value of the band gap of InGaZnO$_4$. However, it is well known that the band gap is smaller than the experimental value in the first-principles calculation based on the density functional theory, and the value of the band gap does not indicate that this calculation is improper.

FIG. 3 shows that amorphous InGaZnO$_4$ including an oxygen defect has a deep level in the band gap. That is, it is estimated that in the band structure of an amorphous oxide semiconductor including an oxygen defect, a trap level due to an oxygen defect exists as a deep trap level in the band gap.

Figure 4:
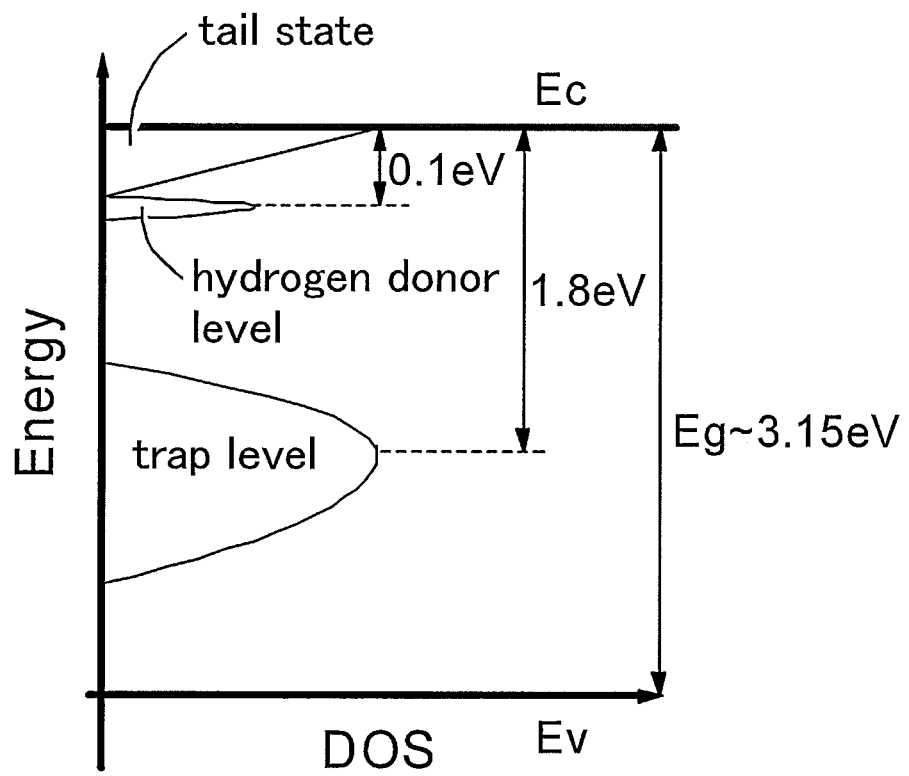
FIG. 4 is a band diagram of an amorphous oxide semiconductor including an oxygen defect.

FIG. 4 shows a band diagram of an amorphous oxide semiconductor including an oxygen defect, based on the above consideration. In FIG. 4, the vertical axis represents energy, the horizontal axis represents DOS, and the energy gap from an energy level Ev at the top of a valence band (VB) to an energy level Ec at the bottom of a conduction band (CB) is set to 3.15 eV, which is based on the experimental value.

In the band diagram of FIG. 4, a tail state due to an amorphous portion in the oxide semiconductor exists in the vicinity of the bottom of the conduction band. Further, a hydrogen donor level due to hydrogen bonded to a dangling bond or the like in the amorphous oxide semiconductor is assumed to exist at a shallow energy level that is about 0.1 eV deep from the bottom of the conduction band. A trap level due to an oxygen defect in the amorphous oxide semiconductor exists at a deep energy level that is about 1.8 eV deep from the bottom of the conduction band. Note that the value of the energy level of the trap level due to an oxygen defect will be described in detail in an example described later.

Figure 5A:
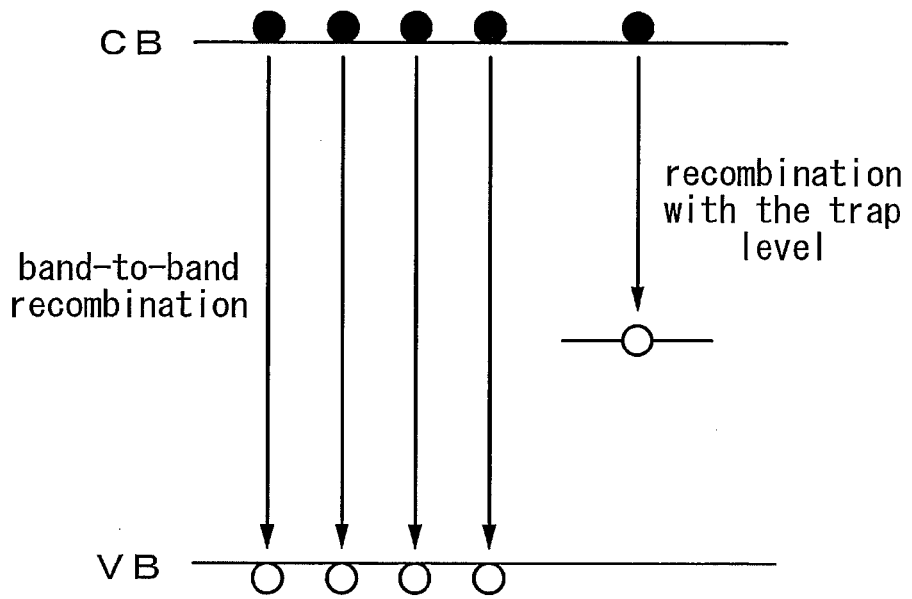
FIGS. 5A and 5B each illustrate a recombination model of an amorphous oxide semiconductor including an oxygen defect.
Figure 5B:
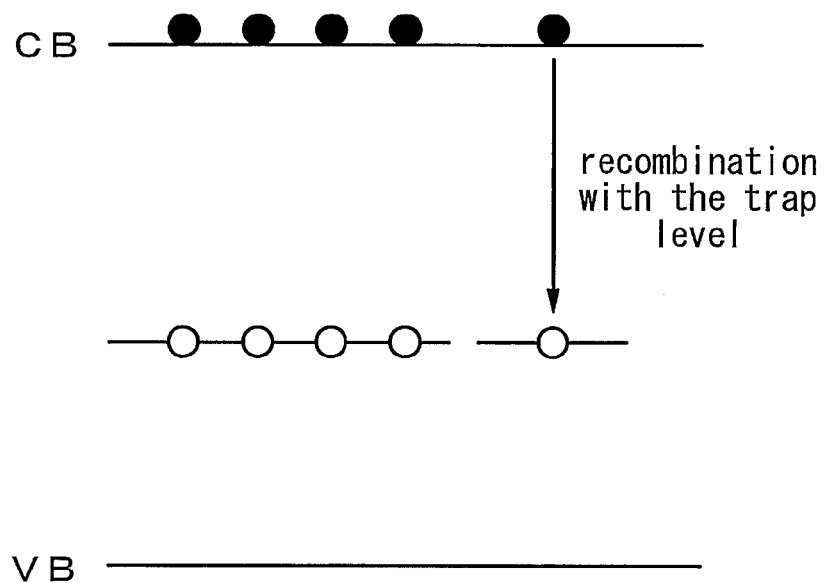

FIGS. 5A and 5B each illustrate a recombination model of an electron and a hole in the band structure in the case of an amorphous oxide semiconductor having such an energy level in the band gap as described above, which is based on the above consideration, particularly, a deep trap level due to an oxygen defect.

FIG. 5A illustrates a recombination model in the case where enough holes exist in a valence band and enough electrons exist in a conduction band. When the amorphous oxide semiconductor film is irradiated with light to generate enough electron-hole pairs, the band structure of the oxide semiconductor has a recombination model as illustrated in FIG. 5A. In this recombination model, a hole is generated not only at the top of the valence band but also at a deep trap level due to an oxygen defect.

In the recombination model illustrated in FIG. 5A, it is assumed that two kinds of recombination processes occur in parallel. One of the recombination processes is a band-to-band recombination process in which an electron in the conduction band and a hole in the valence band are directly recombined with each other. The other of the recombination processes is a recombination process in which an electron in the conduction band is recombined with a hole at a trap level due to an oxygen defect. The band-to-band recombination occurs more frequently than the recombination with the trap level due to an oxygen defect; when the number of holes in the valence band becomes sufficiently small, the band-to-band recombination finishes earlier than the recombination with the trap level. Thus, the recombination model illustrated in FIG. 5A has only the recombination process in which an electron at the bottom of the conduction band is recombined with a hole at a trap level due to an oxygen defect, and shifts to a recombination model illustrated in FIG. 5B.

Sufficient light irradiation may be performed on the oxide semiconductor so that enough holes can exist in the valence band and enough electrons can exist in the conduction band; by stopping the light irradiation after that, an electron and a hole are recombined with each other as in the recombination model illustrated in FIG. 5A. Current which flows through the oxide semiconductor at that time is also called photoelectric current. Time required for attenuation of the photoelectric current (relaxation time) at this time is shorter than relaxation time of photoelectric current in the recombination model illustrated in FIG. 5B. An example described later may be referred to for details of the above.

The recombination model illustrated in FIG. 5B is obtained after the recombination model illustrated in FIG. 5A proceeds and the number of holes in the valence band is sufficiently reduced. Since in the recombination model illustrated in FIG. 5B, almost only the recombination process with the trap level due to an oxygen defect occurs, the number of electrons in the conduction band is more gradually reduced than in the recombination model illustrated in FIG. 5A. It is needless to say that electrons in the conduction band contribute to electric conduction in the oxide semiconductor film during the recombination process. Therefore, in the recombination model illustrated in FIG. 5B, the relaxation time of the photoelectric current is longer than in the recombination model illustrated in FIG. 5A in which the band-to-band recombination mainly occurs. Note that an example described later may be referred to for details of the above.

As described above, the amorphous oxide semiconductor having a deep trap level due to an oxygen defect has two kinds of recombination models for electron-hole pairs in the band structure, and the relaxation time of the photoelectric current can also be classified into two kinds. Slow relaxation of the photoelectric current in the recombination model illustrated in FIG. 5B might form fixed electric charge in the oxide semiconductor film or at an interface between the oxide semiconductor film and the adjacent film when negative bias is applied to a gate electrode in light irradiation in a transistor or the like in which the oxide semiconductor film is used. Accordingly, it is assumed that an oxygen defect in the oxide semiconductor film adversely affects the electric conductivity of the oxide semiconductor film.

However, the oxide semiconductor film including a crystalline region according to an embodiment of the present invention has favorable crystallinity as compared to an oxide semiconductor film which is entirely amorphous, and defects typified by oxygen defects are reduced. Therefore, the oxide semiconductor film including a crystalline region according to an embodiment of the present invention has stable electric conductivity and is more electrically stable with respect to irradiation with visible light, ultraviolet light, and the like. By using such an oxide semiconductor film including a crystalline region for a transistor, a highly reliable semiconductor device having stable electric characteristics can be provided.

The structures and the like described in this embodiment can be combined as appropriate with any of the structures, methods, and the like described in other embodiments.
(Embodiment 2)

In this embodiment, a transistor in which the oxide semiconductor film including a crystalline region described in Embodiment 1 is used and a method for manufacturing the transistor will be described with reference to FIGS. 6A to 6E, FIGS. 7A and 7B, FIGS. 8A and 8B, FIGS. 9A and 9B, and FIGS. 10A to 10C. FIGS. 6A to 6E are cross-sectional views illustrating a manufacturing process of a top-gate transistor 120 which is an embodiment of the structure of a semiconductor device.

Figure 6A:
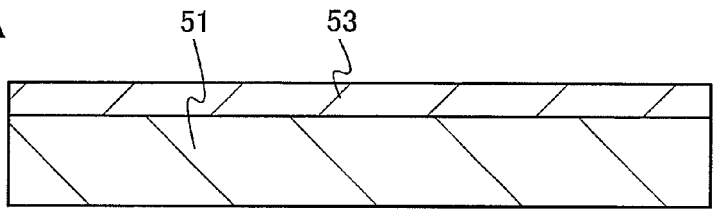
FIGS. 6A to 6E are cross-sectional views illustrating a manufacturing process of a semiconductor device according to an embodiment of the present invention.

First, before an oxide semiconductor film including a crystalline region is formed, a base insulating film 53 is preferably formed over a substrate 51 as illustrated in FIG. 6A.

The substrate 51 should have at least heat resistance high enough to withstand heat treatment performed later. When a glass substrate is used as the substrate 51, a glass substrate whose strain point is higher than or equal to 730° C. is preferably used. As a glass substrate, a substrate formed of a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used. In the case where the substrate 51 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like. The mother glass drastically shrinks when the treatment temperature is high and the treatment time is long. Thus, in the case where mass production is performed with the use of the mother glass, a preferable heating temperature in the manufacturing process is lower than or equal to 600° C., preferably lower than or equal to 450° C.

Instead of the glass substrate, a substrate formed of an insulator, such as a ceramic substrate, a quartz substrate, or a sapphire substrate can be used. Alternatively, crystallized glass or the like may be used. Further alternatively, a substrate obtained by forming an insulating layer over a surface of a semiconductor substrate such as a silicon wafer or a surface of a conductive substrate formed of a metal material can be used.

The base insulating film 53 is preferably formed using an oxide insulating film from which part of contained oxygen is released by heat treatment. The oxide insulating film from which part of contained oxygen is released by heat treatment is preferably an oxide insulating film which contains oxygen at a proportion exceeding the stoichiometric proportion. By using the oxide insulating film from which part of contained oxygen is released by heat treatment as the base insulating film 53, oxygen can be diffused into the oxide semiconductor film by heat treatment in a later step. Typical examples of the oxide insulating film from which part of contained oxygen is released by heat treatment include films of silicon oxide, silicon oxynitride, aluminum oxide, aluminum oxynitride, gallium oxide, hafnium oxide, yttrium oxide, and the like.

The thickness of the base insulating film 53 is greater than or equal to 50 nm, preferably greater than or equal to 200 nm and less than or equal to 500 nm. With the base insulating film 53 being thick, the amount of oxygen released from the base insulating film 53 can be increased, and thereby defects at the interface between the base insulating film 53 and the oxide semiconductor film to be formed later can be reduced.

The base insulating film 53 is formed by a sputtering method, a CVD method or the like. The oxide insulating film from which part of contained oxygen is released by heat treatment can easily be formed by a sputtering method. When the oxide insulating film from which part of contained oxygen is released by heat treatment is formed by a sputtering method, the amount of oxygen contained in a deposition gas is preferably large, and oxygen, a mixed gas of oxygen and a rare gas, or the like can be used. Typically, the concentration of oxygen in the deposition gas is preferably higher than or equal to 6% and lower than or equal to 100%.

The base insulating film 53 is not necessarily formed using an oxide insulating film from which part of contained oxygen is released by heat treatment, and may be formed using a nitride insulating film formed of silicon nitride, silicon nitride oxide, aluminum nitride, or the like. In addition, the base insulating film 53 may have a layered structure including the oxide insulating film and the nitride insulating film; in such a case, the oxide insulating film is preferably provided over the nitride insulating film. By using the nitride insulating film as the base insulating film 53, entry of an alkali metal or the like into the oxide semiconductor film can be prevented when a glass substrate containing an impurity such as an alkali metal is used. Since an alkali metal such as lithium, sodium, or potassium is an adverse impurity for the oxide semiconductor, the contained amount of such an alkali metal in the oxide semiconductor film is preferably small. The nitride insulating film can be formed by a CVD method, a sputtering method, or the like.

Figure 6B:
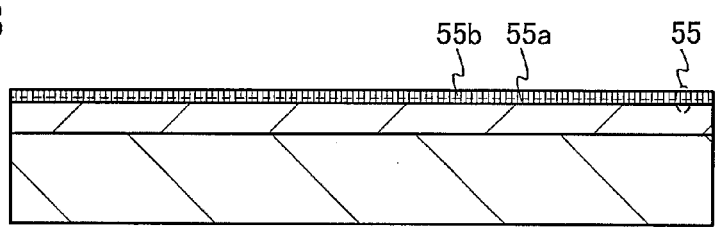

Next, as illustrated in FIG. 6B, over the base insulating film 53, an oxide semiconductor film 55 including a crystalline region is formed to a thickness of greater than or equal to 30 nm and less than or equal to 50 μm by a sputtering method with the use of a sputtering apparatus.

Here, a treatment chamber of the sputtering apparatus is described with reference to FIG. 7A. An evacuation unit 33 and a gas supply unit 35 are connected to a treatment chamber 31. In the treatment chamber 31, a substrate support 40 and a target 41 are provided. The target 41 is connected to a power supply device 37.

The treatment chamber 31 is connected to GND. When the leakage rate of the treatment chamber 31 is lower than or equal to $1 \times 10^{-10}$ Pa·m$^3$/sec., entry of an impurity into a film to be formed by a sputtering method can be decreased.

In order to decrease the leakage rate, internal leakage as well as external leakage needs to be reduced. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of external leakage and internal leakage in order that the leakage rate be lower than or equal to $1 \times 10^{-10}$ Pa·m$^3$/sec.

In order to decrease external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce external leakage. Further, with the use of a metal material covered with iron fluoride, aluminum oxide, chromium oxide, or the like which is in the passive state, a released gas containing hydrogen from the metal gasket is suppressed, so that internal leakage can also be reduced.

As a member for forming the inner wall of the treatment chamber 31, aluminum, chromium, titanium, zirconium, nickel, or vanadium, from which a gas containing hydrogen is released at a smaller amount, is used. An alloy material containing iron, chromium, nickel, or the like covered with the above-mentioned material may also be used. The alloy material containing iron, chromium, nickel, or the like is rigid, resistant to heat, and suitable for processing. Here, when surface unevenness of the member is decreased by polishing or the like to reduce the surface area, the released gas can be reduced. Alternatively, the above-mentioned member of the sputtering apparatus may be covered with iron fluoride, aluminum oxide, chromium oxide, or the like which is in the passive state.

A member provided for the inner wall of the treatment chamber 31 is preferably formed with only a metal material as much as possible. For example, in the case where a viewing window formed with quartz or the like is provided, a surface is preferably covered thinly with iron fluoride, aluminum oxide, chromium oxide, or the like which is in the passive state so as to suppress the released gas.

Furthermore, it is preferable to provide a refiner for a sputtering gas just in front of the treatment chamber 31. At this time, the length of a pipe between the refiner and the treatment chamber is less than or equal to 5 m, preferably less than or equal to 1 m. When the length of the pipe is less than or equal to 5 m or less than or equal to 1 m, the influence of a released gas from the pipe can be reduced owing to a reduction in length of the pipe.

A pipe through which a sputtering gas flows from a cylinder to the treatment chamber 31 is preferably a metal pipe whose inside is covered with iron fluoride, aluminum oxide, chromium oxide, or the like which is in the passive state. With the above-mentioned pipe, the amount of a released gas containing hydrogen is small and entry of impurities into the deposition gas can be reduced as compared to a SUS316L-EP pipe, for example. Further, a high-performance ultra-compact metal gasket joint (a UPG joint) is preferably used as a joint of the pipe. In addition, a structure in which all the materials of the pipe are metal materials is preferable, because the influence of the released gas and external leakage can be reduced as compared to a structure in which a resin or the like is used.

Evacuation of the treatment chamber 31 is preferably performed with appropriate combination of a rough vacuum pump such as a dry pump, and a high vacuum pump such as a sputter ion pump, a turbo molecular pump, or a cryopump. A turbo molecular pump has an outstanding capability in removing a large-sized molecule, whereas it has a low capability in removing hydrogen or water. Hence, combination with a cryopump having a high capability in removing water and a sputter ion pump having a high capability in removing hydrogen is effective.

An adsorbate on the inner wall of the treatment chamber 31 does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate in the treatment chamber be detached as much as possible and evacuation be performed in advance with the use of a pump having high evacuation capability. Note that the treatment chamber may be subjected to baking for promotion of detachment of the adsorbate. By the baking, the rate of detachment of the adsorbate can be increased about tenfold. The baking may be performed at a temperature of higher than or equal to 100° C. and lower than or equal to 450° C. At this time, when the adsorbate is removed while an inert gas is introduced, the rate of detachment of water or the like, which is difficult to detach only by evacuation, can be further increased.

The evacuation unit 33 can remove an impurity from the treatment chamber 31 and control the pressure in the treatment chamber 31. An entrapment vacuum pump is preferably used as the evacuation unit 33. For example, a cryopump, an ion pump, or a titanium sublimation pump is preferably used. With the use of the above entrapment vacuum pump, the amount of hydrogen contained in the oxide semiconductor film can be reduced.

Note that hydrogen contained in the oxide semiconductor film may be a hydrogen molecule, water, a hydroxyl group, or a hydride in some cases, in addition to a hydrogen atom.

The gas supply unit 35 is for supplying a gas with which a target is sputtered into the treatment chamber 31. The gas supply unit 35 includes a cylinder filled with a gas, a pressure adjusting valve, a stop valve, a mass flow controller, and the like. Providing a refiner for the gas supply unit 35 makes it possible to reduce impurities contained in a gas introduced into the treatment chamber 31. As the gas with which a target is sputtered, a rare gas such as helium, neon, argon, xenon, or krypton is used. Alternatively, a mixed gas of oxygen and one of the above rare gases can be used.

As the power supply device 37, an RF power supply device, an AC power supply device, a DC power supply device, or the like can be used as appropriate. When a magnet is provided inside or outside a target support for supporting the target, which is not illustrated, high-density plasma can be confined in the periphery of the target, so that improvement in deposition rate and a reduction in plasma damage on the substrate can be achieved. This method is referred to as a magnetron sputtering method. Moreover, when the magnet can be rotated in a magnetron sputtering method, non-uniformity of a magnetic field can be reduced, so that efficiency of use of the target is increased and a variation in film quality in the substrate plane can be reduced.

The substrate support 40 is connected to GND. The substrate support 40 is provided with a heater. As a heater, a device for heating an object by heat conduction or heat radiation from a heating element such as a resistance heating element can be used.

As the target 41, a metal oxide target containing zinc is preferably used. As a typical example of the target 41, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide can be used.

An example of the target 41 is a metal oxide target containing In, Ga, and Zn at a composition ratio where $In_2O_3$:$Ga_2O_3$:ZnO=1:1:1 [molar ratio]. Alternatively, a target having a composition ratio where $In_2O_3$:$Ga_2O_3$:ZnO=1:1:2 [molar ratio], a target having a composition ratio where $In_2O_3$:$Ga_2O_3$:ZnO=1:1:4 [molar ratio], or a target having a composition ratio where $In_2O_3$:$Ga_2O_3$:ZnO=2:1:8 [molar ratio] can be used.

The distance between the target 41 and the substrate 51 (the T-S distance) is preferably set to a distance which enables an atom whose atomic weight is light to preferentially reach the base insulating film 53 over the substrate 51.

Figure 7A:
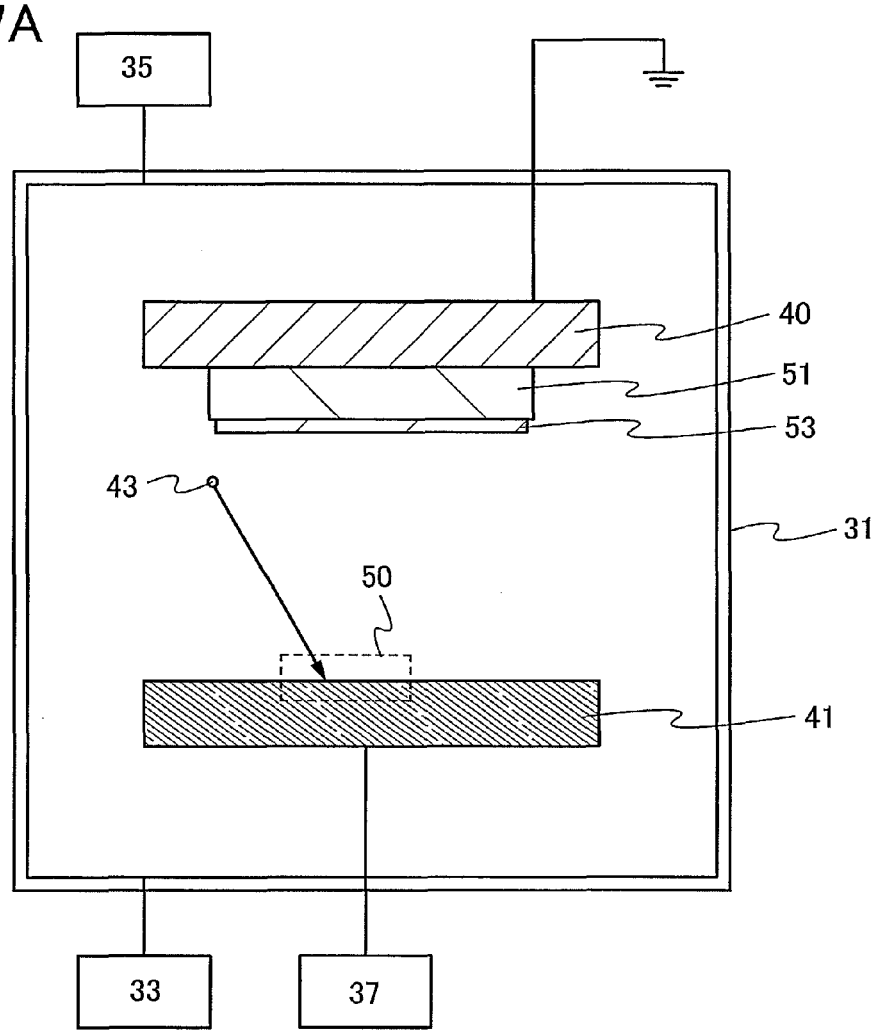
FIGS. 7A and 7B are schematic views illustrating a sputtering apparatus.

As illustrated in FIG. 7A, the substrate 51 over which the base insulating film 53 is formed is placed on the substrate support 40 in the treatment chamber 31 of the sputtering apparatus. Next, a gas for sputtering the target 41 is introduced from the gas supply unit 35 into the treatment chamber 31. The purity of the target 41 is higher than or equal to 99.9%, preferably higher than or equal to 99.99%. Then, power is supplied to the power supply device 37 connected to the target 41. As a result, with the use of an ion 43 and an electron in the sputtering gas introduced from the gas supply unit 35 into the treatment chamber 31, the target 41 is sputtered.

Figure 7B:
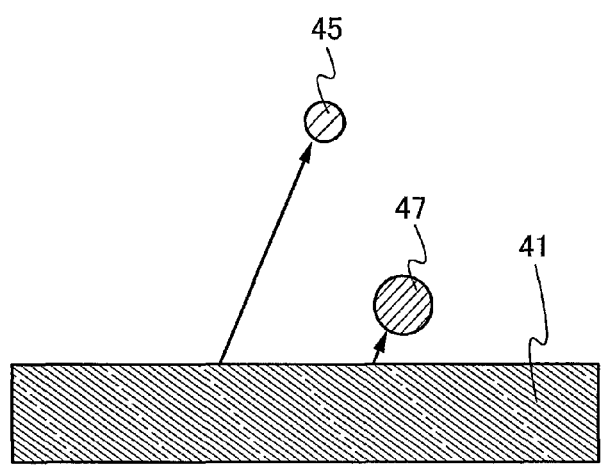

Here, the distance between the target 41 and the substrate 51 is set to a distance which enables an atom whose atomic weight is light to preferentially reach the base insulating film 53 over the substrate 51, whereby among atoms contained in the target 41, an atom 45 whose atomic weight is light can more preferentially move to the substrate side than an atom 47 whose atomic weight is heavy as illustrated in FIG. 7B.

In the target 41, zinc has a lighter atomic weight than indium or the like. Thus, zinc is preferentially deposited on the base insulating film 53. Further, an atmosphere for forming a film contains oxygen, and the substrate support 40 is provided with a heater for heating the substrate and the deposited film during deposition. Thus, zinc deposited on the base insulating film 53 is oxidized, so that a seed crystal 55a with a hexagonal crystal structure containing zinc, typically, a seed crystal containing zinc oxide with a hexagonal crystal structure is formed. In the case where the target 41 includes an atom of aluminum or the like with lighter atomic weight than zinc, the atom of aluminum or the like with lighter atomic weight than zinc, as well as zinc, is preferentially deposited on the base insulating film 53.

The seed crystal 55a includes a crystal containing zinc with a hexagonal wurtzite crystal structure which has a bond with a hexagonal lattice in an a-b plane and in which the a-b plane is substantially parallel with a surface of the film and a c-axis is substantially perpendicular to the surface of the film. The crystal containing zinc with a hexagonal crystal structure which has a bond with a hexagonal lattice in the a-b plane and in which the a-b plane is substantially parallel with the surface of the film and the c-axis is substantially perpendicular to the surface of the film will be described with reference to FIGS. 8A and 8B. As a typical example of the crystal containing zinc with a hexagonal crystal structure, zinc oxide is described. A black sphere represents zinc, and a white sphere represents oxygen. FIG. 8A is a schematic diagram of zinc oxide with a hexagonal crystal structure in the a-b plane, and FIG. 8B is a schematic diagram of zinc oxide with a hexagonal crystal structure in which the longitudinal direction of the drawing is the c-axis direction. As illustrated in FIG. 8A, in a plan top surface of the a-b plane, zinc and oxygen are bonded to form a hexagonal shape. As illustrated in FIG. 8B, layers in each of which zinc and oxygen are bonded to form a hexagonal lattice are stacked, and the c-axis direction is perpendicular to the a-b plane. The seed crystal 55a includes, in the c-axis direction, at least one atomic layer including a bond with a hexagonal lattice in the a-b plane.

The target 41 is continuously sputtered with the use of a sputtering gas, whereby atoms included in the target are deposited on the seed crystal 55a. At this time, crystal growth is caused with the use of the seed crystal 55a as a nucleus, so that an oxide semiconductor film 55b including a crystalline region with a hexagonal crystal structure can be formed on the seed crystal 55a. Note that since the substrate 51 is heated by the heater of the substrate support 40, crystal growth of the atoms deposited on the surface progresses with the use of the seed crystal 55a as a nucleus while the atoms are oxidized.

In formation of the oxide semiconductor film 55b, crystal growth of an atom with heavy atomic weight at the surface of the target 41 and an atom with light atomic weight sputtered after formation of the seed crystal 55a is caused with the use of the seed crystal 55a as a nucleus while the atoms are oxidized. Thus, like the seed crystal 55a, the oxide semiconductor film 55b has a crystalline region with a hexagonal crystal structure which includes a bond with a hexagonal lattice in the a-b plane and in which the a-b plane is substantially parallel with the surface of the film and the c-axis is substantially perpendicular to the surface of the film. That is, the oxide semiconductor film 55 including the seed crystal 55a and the oxide semiconductor film 55b has a crystalline region with a hexagonal crystal structure, which includes a bond with a hexagonal lattice in the a-b plane parallel with a surface of the base insulating film 53 and in which the c-axis is substantially perpendicular to the surface of the film. That is, the crystalline region with a hexagonal crystal structure included in the oxide semiconductor film 55 has c-axis alignment. Note that in FIG. 6B, the interface between the seed crystal 55a and the oxide semiconductor film 55b is denoted by a dotted line for description of a stack of the oxide semiconductor films; however, the interface is actually not distinct and is illustrated for easy understanding.

The temperature of the substrate heated by the heater is higher than 200° C. and lower than or equal to 400° C., preferably higher than or equal to 250° C. and lower than or equal to 350° C. By performing deposition while the substrate is heated at a temperature of higher than 200° C. and lower than or equal to 400° C., preferably higher than or equal to 250° C. and lower than or equal to 350° C., heat treatment can be performed at the same time as the deposition, so that the oxide semiconductor film including a region having favorable crystallinity can be formed. Note that the temperature of the surface where a film is formed in sputtering is higher than or equal to 250° C. and lower than or equal to the upper limit of the heat treatment temperature of the substrate.

As a sputtering gas, a rare gas (typically argon), oxygen, or a mixed gas of a rare gas and oxygen is used as appropriate. It is preferable that a high-purity gas from which impurities such as hydrogen, water, a hydroxyl group, or a hydride are removed be used as a sputtering gas.

When the pressure of the treatment chamber including the substrate support 40 and the target 41 is set to lower than or equal to 0.4 Pa, impurities such an alkali metal or hydrogen entering a surface of the oxide semiconductor film including a crystalline region or the inside thereof can be reduced.

Moreover, when the leakage rate of the treatment chamber of the sputtering apparatus is set to lower than or equal to $1 \times 10^{-10}$ Pa·m³/sec., entry of impurities such as an alkali metal, hydrogen, water, a hydroxyl group, or a hydride into the oxide semiconductor film including a crystalline region which is being formed by a sputtering method can be reduced. Further, with the use of an entrapment vacuum pump as an evacuation system, counter flow of impurities such as an alkali metal, hydrogen, water, a hydroxyl group, or a hydride from the evacuation system can be reduced.

When the purity of the target 41 is set to higher than or equal to 99.99%, an alkali metal, hydrogen, water, a hydroxyl group, a hydride, or the like entering the oxide semiconductor film including a crystalline region can be reduced. With the use of the target as described above, in the oxide semiconductor film 55, the concentration of lithium can be lower than or equal to $5 \times 10^{15}$ atoms/cm³, preferably lower than or equal to $1 \times 10^{15}$ atoms/cm³, the concentration of sodium can be lower than or equal to $5 \times 10^{16}$ atoms/cm³, preferably lower than or equal to $1 \times 10^{16}$ atoms/cm³, more preferably lower than or equal to $1 \times 10^{15}$ atoms/cm³, and the concentration of potassium can be lower than or equal to $5 \times 10^{15}$ atoms/cm³, preferably lower than or equal to $1 \times 10^{15}$ atoms/cm³.

In the above method for forming the oxide semiconductor film, in one sputtering step, by utilizing a difference in atomic weight of atoms contained in the target, zinc with light atomic weight is preferentially deposited on the oxide insulating film to form a seed crystal, and then indium or the like with heavy atomic weight is deposited on the seed crystal while crystal growth is carried out. Thus, the oxide semiconductor film including a crystalline region can be formed without performing a plurality of steps.

In the above method for forming the oxide semiconductor film 55, by a sputtering method, the seed crystal 55a and the oxide semiconductor film 55b are formed and crystallized at the same time; however, the oxide semiconductor film according to this embodiment is not necessarily formed in this manner. For example, formation and crystallization of the seed crystal and the oxide semiconductor film may be performed in separate steps.

Figure 9A:
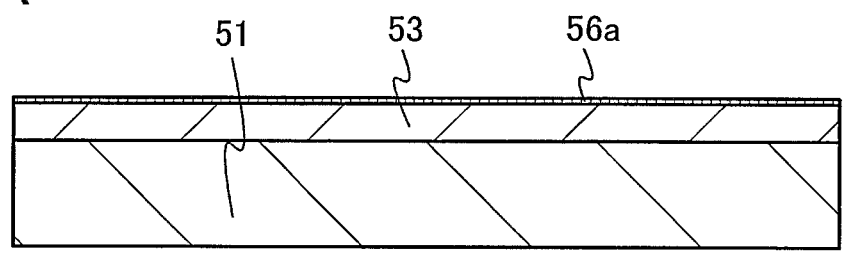
FIGS. 9A and 9B are cross-sectional views illustrating a manufacturing process of a semiconductor device according to an embodiment of the present invention.
Figure 9B:
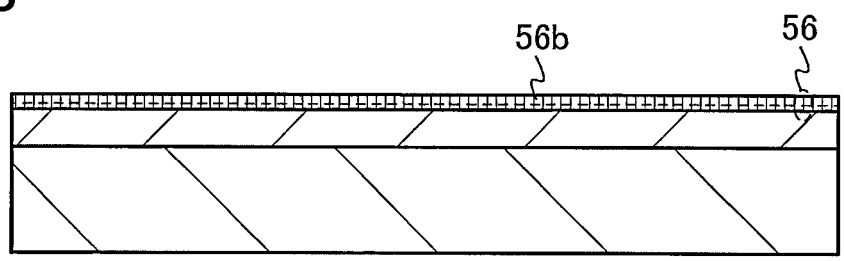

A method in which formation and crystallization of the seed crystal and the oxide semiconductor film are performed in separate steps is described below with reference to FIGS. 9A and 9B. In this specification, the method for forming the oxide semiconductor film including a crystalline region as described below is referred to as a "two-step method" in some cases. The oxide semiconductor film including a crystalline region which is shown in the cross-sectional TEM image in FIG. 1 is formed by the two-step method.

First, a first oxide semiconductor film having a thickness of greater than or equal to 1 nm and less than or equal to 10 nm is formed over the base insulating film 53. The first oxide semiconductor film is formed by a sputtering method, and the substrate temperature in deposition by a sputtering method is preferably set to higher than or equal to 200° C. and lower than or equal to 400° C. The other film formation conditions are similar to those of the above method for forming the oxide semiconductor film.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, the first oxide semiconductor film is crystallized, so that a seed crystal 56a is formed (see FIG. 9A).

Although it depends on the temperature of the first heat treatment, the first heat treatment causes crystallization from a film surface and a crystal grows from the film surface toward the inside of the film, so that a c-axis aligned crystal is obtained. By the first heat treatment, a large amount of zinc and oxygen gather to the film surface, and one or more layers of a graphene-type two-dimensional crystal including zinc and oxygen and having a hexagonal shape on the upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

In addition, by using an oxide insulating film from which part of contained oxygen is released by heat treatment as the base insulating film 53, oxygen in the base insulating film 53 can be diffused into the interface between the base insulating film 53 and the seed crystal 56a or in the vicinity thereof (±5 nm from the interface) by the first heat treatment, whereby oxygen defects in the seed crystal 56a can be reduced.

Next, a second oxide semiconductor film having a thickness of greater than 10 nm is formed over the seed crystal 56a. The second oxide semiconductor film is formed by a sputtering method, and the substrate temperature in deposition is set to higher than or equal to 200° C. and lower than or equal to 400° C. The other film formation conditions are similar to those of the above method for forming the oxide semiconductor film.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, the second oxide semiconductor film is crystallized, so that an oxide semiconductor film 56b is formed (see FIG. 9B). The second heat treatment is performed in a nitrogen atmosphere, an oxygen atmosphere, or a mixed atmosphere of nitrogen and oxygen, whereby the density of the oxide semiconductor film 56b is increased and the number of defects therein is reduced. By the second heat treatment, crystal growth proceeds in the thickness direction with the use of the seed crystal 56a as a nucleus, that is, crystal growth proceeds from the bottom to the inside; thus, the oxide semiconductor film 56b including a crystalline region is formed. In this manner, an oxide semiconductor film 56 including the seed crystal 56a and the oxide semiconductor film 56b is formed. In FIG. 9B, the interface between the seed crystal 56a and the oxide semiconductor film 56b is indicated by a dotted line, and the seed crystal 56a and the oxide semiconductor film 56b are illustrated as a stack of oxide semiconductor layers; however, the interface is actually not distinct and is illustrated for easy understanding.

It is preferable that the steps from the formation of the base insulating film 53 to the second heat treatment be performed successively without exposure to the air. The steps from the formation of the base insulating film 53 to the second heat treatment are preferably performed in an atmosphere which is controlled to contain little hydrogen and moisture (such as an inert atmosphere, a reduced-pressure atmosphere, or a dry-air atmosphere); in terms of moisture, for example, a dry nitrogen atmosphere with a dew point of lower than or equal to −40° C., preferably a dew point of lower than or equal to −50° C. is preferably employed.

In the above method for forming the oxide semiconductor film, the oxide semiconductor film including a region having favorable crystallinity can be formed even with a low substrate temperature in deposition, as compared to the method in which atoms whose atomic weight is light are preferentially deposited on the oxide insulating film. Note that the oxide semiconductor film 56 formed by using the above two-step method has crystallinity substantially the same as that of the oxide semiconductor film 55 which is formed by the method in which atoms whose atomic weight is light are preferentially deposited on the oxide insulating film, and the oxide semiconductor film 56 also has stable electric conductivity. Therefore, a highly reliable semiconductor device having stable electric characteristics can be provided by using the oxide semiconductor film which is formed by either of the above methods. As for a process described below, a manufacturing process of the transistor 120 with the use of the oxide semiconductor film 55 is described; however, the oxide semiconductor film 56 can also be used.

Through the above process, the oxide semiconductor film 55 including a stack of the seed crystal 55a and the oxide semiconductor film 55b can be formed over the base insulating film 53. Next, preferably, heat treatment is performed on the substrate 51, so that hydrogen is released from the oxide semiconductor film 55 and part of oxygen contained in the base insulating film 53 is diffused into the oxide semiconductor film 55 and in the vicinity of the interface between the base insulating film 53 and the oxide semiconductor film 55.

The temperature of the heat treatment is preferably a temperature at which hydrogen is released from the oxide semiconductor film 55 and part of oxygen contained in the base insulating film 53 is released and diffused into the oxide semiconductor film 55. The temperature is typically higher than or equal to 150° C. and lower than the strain point of the substrate 51, preferably higher than or equal to 250° C. and lower than or equal to 450° C. When the heat treatment temperature is higher than the temperature in forming the oxide semiconductor film including a crystalline region, a large amount of oxygen contained in the base insulating film 53 can be released.

The heat treatment is preferably performed in an inert gas atmosphere, an oxygen atmosphere, a nitrogen atmosphere, or a mixed atmosphere of oxygen and nitrogen, which contains little hydrogen and moisture. As an inert gas atmosphere, typically, an atmosphere of a rare gas such as helium, neon, argon, xenon, or krypton is preferable. In addition, heating time of the heat treatment is longer than or equal to 1 minute and shorter than or equal to 24 hours.

This heat treatment enables release of hydrogen from the oxide semiconductor film 55 and diffusion of part of oxygen contained in the base insulating film 53 into the oxide semiconductor film 55 and in the vicinity of the interface between the base insulating film 53 and the oxide semiconductor film 55. Through this process, oxygen defects in the oxide semiconductor film 55 can be reduced. As a result, the oxide semiconductor film including a crystalline region, in which the concentration of hydrogen and oxygen defects are reduced, can be formed.

Figure 6C:
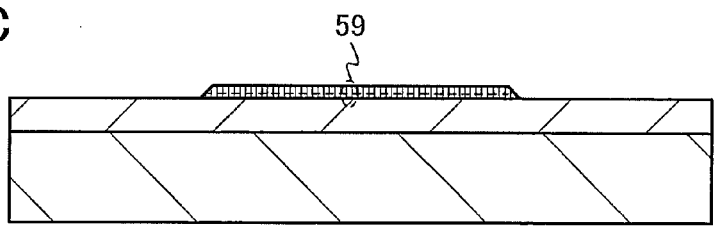

Next, a mask is formed over the oxide semiconductor film 55, and then the oxide semiconductor film 55 is selectively etched with the use of the mask, so that an oxide semiconductor film 59 is formed as illustrated in FIG. 6C. After that, the mask is removed.

The mask used in the etching of the oxide semiconductor film 55 can be formed as appropriate by a photolithography step, an inkjet method, a printing method, or the like. Wet etching or dry etching may be employed as appropriate for the etching of the oxide semiconductor film 55.

Figure 6D:
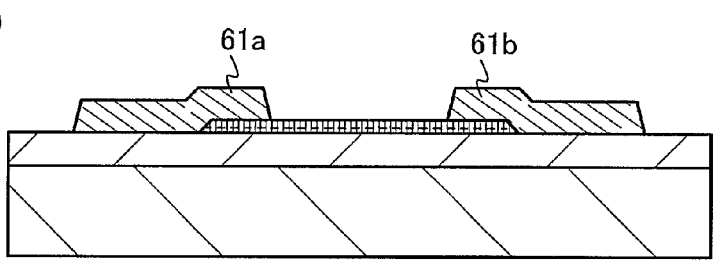

Next, as illustrated in FIG. 6D, a source electrode 61a and a drain electrode 61b which are in contact with the oxide semiconductor film 59 are formed.

The source electrode 61a and the drain electrode 61b can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. The source electrode 61a and the drain electrode 61b may be a single layer or a stack of two or more layers. For example, a single-layer structure of an aluminum film containing silicon, a two-layer structure in which a copper film is stacked over a Cu—Mg—Al alloy film, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, or the like can be used.

The source electrode 61a and the drain electrode 61b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

After a conductive film is formed by a sputtering method, a CVD method, an evaporation method, or the like, a mask is formed over the conductive film and the conductive film is etched, and thereby the source electrode 61a and the drain electrode 61b are formed. The mask formed over the conductive film can be formed by a printing method, an inkjet method, or a photolithography method as appropriate. Alternatively, the source electrode 61a and the drain electrode 61b can be directly formed by a printing method or an inkjet method.

At this time, the conductive film is formed over the oxide semiconductor film 59 and the base insulating film 53, and etched into a predetermined pattern to form the source electrode 61a and the drain electrode 61b.

Alternatively, the oxide semiconductor film 59, the source electrode 61a, and the drain electrode 61b may be formed in such a manner that a conductive film is formed over the oxide semiconductor film 55, and the oxide semiconductor film 55 and the conductive film are etched with a multi-tone photomask. In the above, an uneven mask is formed, the oxide semiconductor film 55 and the conductive film are etched with the use of the uneven mask, the uneven mask is divided by ashing, and the conductive film is selectively etched with masks obtained by the dividing, whereby the oxide semiconductor film 59, the source electrode 61a, and the drain electrode 61b can be formed. With this process, the number of the photomasks and the number of steps in photolithography can be reduced.

Then, a gate insulating film 63 is formed over the oxide semiconductor film 59, the source electrode 61a, and the drain electrode 61b.

The gate insulating film 63 can be formed with a single layer or a stacked layer including one or more of silicon oxide, silicon oxynitride, silicon nitride, silicon nitride oxide, aluminum oxide, aluminum oxynitride, and gallium oxide. It is preferable that a portion in the gate insulating film 63 which is in contact with the oxide semiconductor film 59 contain oxygen. It is more preferable that the gate insulating film 63 be formed using an oxide insulating film from which part of contained oxygen is released by heat treatment, like the base insulating film 53. By using a silicon oxide film as the oxide insulating film from which part of contained oxygen is released by heat treatment, oxygen can be diffused into the oxide semiconductor film 59 in heat treatment in a later step, whereby characteristics of the transistor 120 can be favorable.

When the gate insulating film 63 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased. Further, a layered structure can be used in which a high-k material and one or more of silicon oxide, silicon oxynitride, silicon nitride, silicon nitride oxide, aluminum oxide, aluminum oxynitride, and gallium oxide are stacked. The thickness of the gate insulating film 63 is preferably greater than or equal to 1 nm and less than or equal to 300 nm, more preferably greater than or equal to 5 nm and less than or equal to 50 nm. When the thickness of the gate insulating film 63 is greater than or equal to 5 nm, gate leakage current can be reduced.

Before the gate insulating film 63 is formed, the surface of the oxide semiconductor film 59 may be exposed to plasma of an oxidative gas such as oxygen, ozone, or dinitrogen monoxide so as to be oxidized, thereby reducing oxygen deficiency.

Next, a gate electrode 65 is formed in a region which is over the gate insulating film 63 and overlaps with the oxide semiconductor film 59.

The gate electrode 65 can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains aluminum and one or more metal elements selected from titanium, tantalum, tungsten, molybdenum, chromium, neodymium, and scandium may be used. Further, the gate electrode 65 may be a single layer or a stack of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, or the like can be used.

The gate electrode 65 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. In addition, a compound conductor obtained by sputtering using an In—Ga—Zn—O-based metal oxide as a target in an atmosphere containing nitrogen may be used. It is also possible to have a layered structure formed using the above light-transmitting conductive material and the above metal element.

Figure 6E:
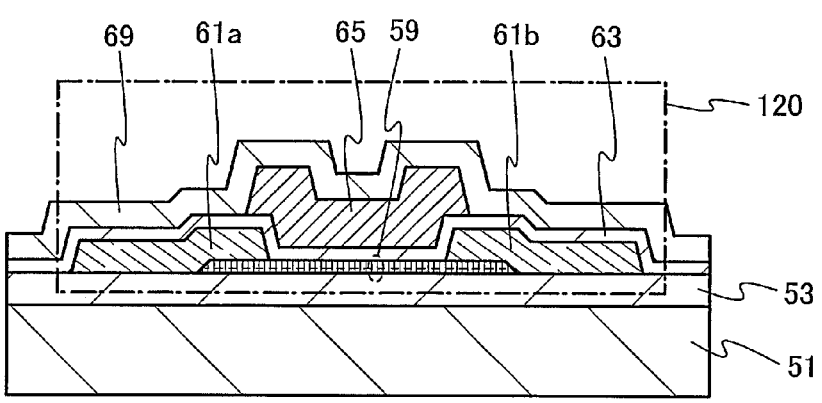

Further, an insulating film 69 may be formed as a protective film over the gate electrode 65 (see FIG. 6E). In addition, after contact holes are formed in the gate insulating film 63 and the insulating film 69, wirings may be formed so as to be connected to the source electrode 61a and the drain electrode 61b.

The insulating film 69 can be formed as appropriate with an insulating film similar to that of the gate insulating film 63. When a silicon nitride film is formed as the insulating film 69 by a sputtering method, entry of moisture and an alkali metal from the outside can be prevented, and thus the amount of impurities contained in the oxide semiconductor film 59 can be reduced.

Note that after the gate insulating film 63 is formed or the insulating film 69 is formed, heat treatment may be performed. This heat treatment enables release of hydrogen from the oxide semiconductor film 59 and diffusion of part of oxygen contained in base insulating film 53, the gate insulating film 63, or the insulating film 69 into the oxide semiconductor film 59, in the vicinity of the interface between the base insulating film 53 and the oxide semiconductor film 59, and in the vicinity of the interface between the gate insulating film 63 and the oxide semiconductor film 59. Through this process, oxygen defects in the oxide semiconductor film 59 can be reduced, and defects at the interface between the oxide semiconductor film 59 and the base insulating film 53 or the interface between the oxide semiconductor film 59 and the gate insulating film 63 can be reduced. As a result, the oxide semiconductor film 59 in which the concentration of hydrogen and oxygen defects are reduced can be formed. An i-type (intrinsic) or substantially i-type oxide semiconductor film that is highly purified is formed as described above, whereby a transistor having excellent characteristics can be realized.

Through the above process, the transistor 120 in which a channel region is formed in the oxide semiconductor film including a crystalline region can be manufactured. As illustrated in FIG. 6E, the transistor 120 includes the base insulating film 53 provided over the substrate 51, the oxide semiconductor film 59 provided over the base insulating film 53, the source electrode 61a and the drain electrode 61b provided in contact with an upper surface and side surfaces of the oxide semiconductor film 59, the gate insulating film 63 provided over the oxide semiconductor film 59, the gate electrode 65 provided over the gate insulating film 63 so as to overlap with the oxide semiconductor film 59, and the insulating film 69 provided over the gate electrode 65.

The oxide semiconductor film including a crystalline region used in the transistor 120 has favorable crystallinity compared to an oxide semiconductor film which is entirely amorphous, and defects typified by oxygen defects or impurities such as hydrogen bonded to dangling bonds or the like are reduced. A defect typified by an oxygen defect, hydrogen bonded to a dangling bond or the like, or the like functions as a source for supplying a carrier in the oxide semiconductor film, which might change the electric conductivity of the oxide semiconductor film. Therefore, the oxide semiconductor film including a crystalline region in which such defects are reduced has stable electric conductivity and is more electrically stable with respect to irradiation with visible light, ultraviolet light, and the like. By using such an oxide semiconductor film including a crystalline region for a transistor, a highly reliable semiconductor device having stable electric characteristics can be provided.

The semiconductor device according to the present invention is not limited to the transistor 120 illustrated in FIGS. 6A to 6E. For example, a structure like a transistor 130 illustrated in FIG. 10A may be employed. The transistor 130 includes a base insulating film 53 provided over a substrate 51, a source electrode 61*a* and a drain electrode 61*b* provided over the base insulating film 53, an oxide semiconductor film 59 provided in contact with upper surfaces and side surfaces of the source electrode 61*a* and the drain electrode 61*b*, a gate insulating film 63 provided over the oxide semiconductor film 59, a gate electrode 65 provided over the gate insulating film 63 so as to overlap with the oxide semiconductor film 59, and an insulating film 69 provided over the gate electrode 65. That is, the transistor 130 is different from the transistor 120 in that the oxide semiconductor film 59 is provided in contact with the upper surfaces and the side surfaces of the source electrode 61*a* and the drain electrode 61*b*.

Figure 10A:
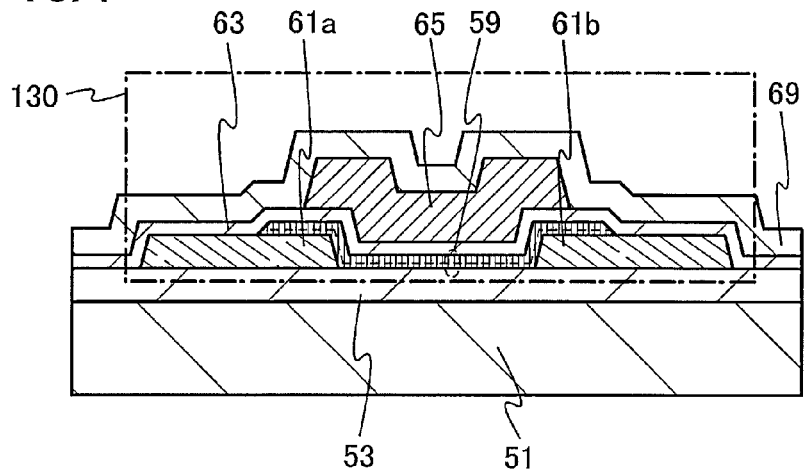
FIGS. 10A to 10C are cross-sectional views each illustrating a semiconductor device according to an embodiment of the present invention.
Figure 10B:
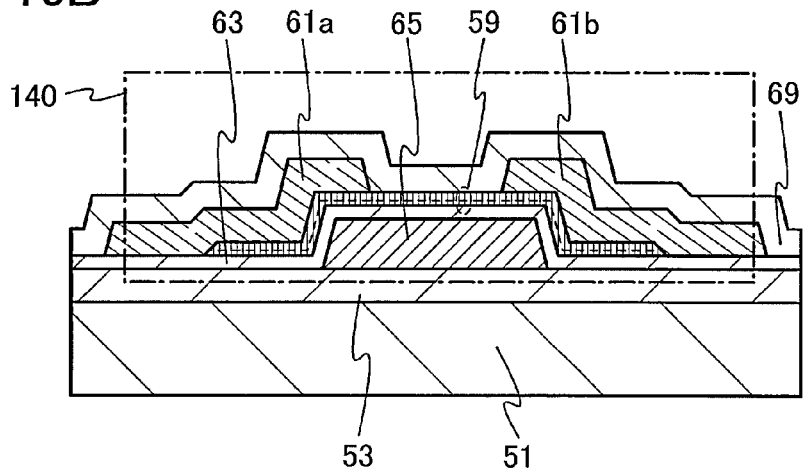

In addition, a structure like a transistor 140 illustrated in FIG. 10B may be employed. The transistor 140 includes a base insulating film 53 provided over a substrate 51, a gate electrode 65 provided over the base insulating film 53, a gate insulating film 63 provided over the gate electrode 65, an oxide semiconductor film 59 provided over the gate insulating film 63, a source electrode 61*a* and a drain electrode 61*b* provided in contact with an upper surface and side surfaces of the oxide semiconductor film 59, and an insulating film 69 provided over the oxide semiconductor film 59. That is, the transistor 140 is different from the transistor 120 in that it has a bottom gate structure in which the gate electrode 65 and the gate insulating film 63 are provided below the oxide semiconductor film 59.

Figure 10C:
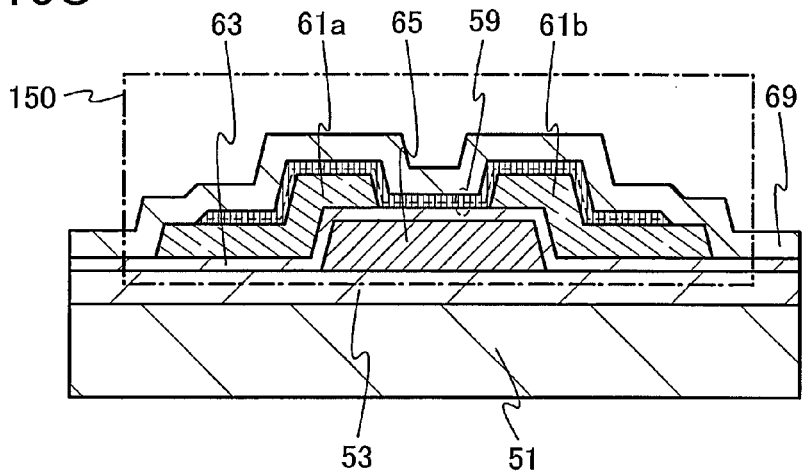

In addition, a structure like a transistor 150 illustrated in FIG. 10C may be employed. The transistor 150 includes a base insulating film 53 provided over a substrate 51, a gate electrode 65 provided over the base insulating film 53, a gate insulating film 63 provided over the gate electrode 65, a source electrode 61*a* and a drain electrode 61*b* provided over the gate insulating film 63, an oxide semiconductor film 59 provided in contact with upper surfaces and side surfaces of the source electrode 61*a* and the drain electrode 61*b*, and an insulating film 69 provided over the oxide semiconductor film 59. That is, the transistor 150 is different from the transistor 130 in that it has a bottom gate structure in which the gate electrode 65 and the gate insulating film 63 are provided below the oxide semiconductor film 59.

The structures, methods, and the like described in this embodiment can be combined as appropriate with any of the structures, methods, and the like described in other embodiments.

(Embodiment 3)

In this embodiment, a transistor having a structure that is different from that of the transistor which includes the oxide semiconductor film including a crystalline region described in the above embodiment will be described with reference to FIGS. 11A to 11C and FIG. 12.

Figure 11A:
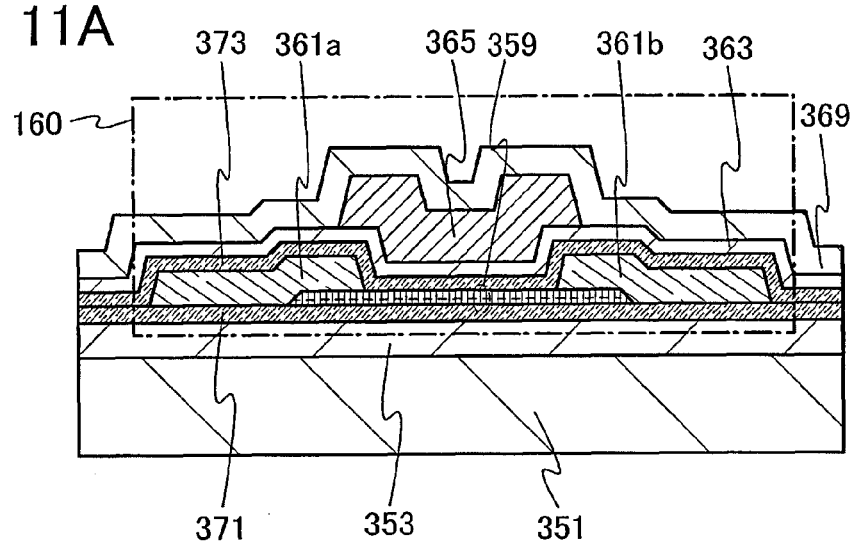
FIGS. 11A to 11C are cross-sectional views each illustrating a semiconductor device according to an embodiment of the present invention.

A transistor 160 having a top gate structure illustrated in FIG. 11A includes a base insulating film 353 provided over a substrate 351, a metal oxide film 371 provided over the base insulating film 353, an oxide semiconductor film 359 provided over the metal oxide film 371, a source electrode 361*a* and a drain electrode 361*b* provided in contact with an upper surface and side surfaces of the oxide semiconductor film 359, a metal oxide film 373 provided over the oxide semiconductor film 359, a gate insulating film 363 provided over the metal oxide film 373, a gate electrode 365 provided over the gate insulating film 363 so as to overlap with the oxide semiconductor film 359, and an insulating film 369 provided over the gate electrode 365.

That is, the transistor 160 is different from the transistor 120 described in the above embodiment in that the metal oxide film 371 is provided between the base insulating film 353 and the oxide semiconductor film 359, and the metal oxide film 373 is provided between the oxide semiconductor film 359 and the gate insulating film 363. Note that other structures of the transistor 160 are similar to those of the transistor 120 described in the above embodiment. In other words, the description about the substrate 51 can be referred to for details of the substrate 351, the description about the base insulating film 53 can be referred to for details of the base insulating film 353, the description about the oxide semiconductor film 59 can be referred to for details of the oxide semiconductor film 359, the description about the source electrode 61*a* and the drain electrode 61*b* can be referred to for details of the source electrode 361*a* and the drain electrode 361*b*, the description about the gate insulating film 63 can be referred to for details of the gate insulating film 363, and the description about the gate electrode 65 can be referred to for details of the gate electrode 365.

It is desirable to use a metal oxide containing a constituent similar to that of the oxide semiconductor film 359 for the metal oxide film 371 and the metal oxide film 373. Here, "a constituent similar to that of the oxide semiconductor film" means one or more atoms selected from constituent metal atoms of the oxide semiconductor film. It is particularly preferable to use a constituent atom that can have a crystal structure similar to that of a crystalline region of the oxide semiconductor film 359. In this manner, it is preferable that the metal oxide film 371 and the metal oxide film 373 be formed using a metal oxide containing a constituent similar to that of the oxide semiconductor film 359 so as to have a crystalline region like the oxide semiconductor film 359. Preferably, the crystalline region includes a crystal in which an a-b plane is substantially parallel with a surface of the film and a c-axis is substantially perpendicular to the surface of the film. That is, the crystalline region preferably has c-axis alignment. When the crystalline region is observed from a direction perpendicular to the surface of the film, it is preferable that atoms be arranged in a hexagonal lattice.

By providing the metal oxide film 371 including a crystalline region as described above, a crystalline region with continuous c-axis alignment can be formed at the interface between the metal oxide film 371 and the oxide semiconductor film 359 and in the vicinity thereof. Accordingly, defects typified by oxygen defects or impurities such as hydrogen bonded to dangling bonds or the like can be reduced at the interface between the metal oxide film 371 and the oxide semiconductor film 359 and in the vicinity thereof. In addition, also at the interface between the metal oxide film 373 and the oxide semiconductor film 359 and in the vicinity thereof, a crystalline region with continuous c-axis alignment can be formed.

As described above, a defect typified by an oxygen defect, hydrogen bonded to a dangling bond or the like, or the like functions as a source for supplying a carrier, which might change the electric conductivity of the oxide semiconductor film. Therefore, the above-described defects, hydrogen, or the like are reduced at the interface between the oxide semiconductor film 359 and the metal oxide film 371, at the interface between the oxide semiconductor film 359 and the metal oxide film 373, and in the vicinity thereof. Therefore, the oxide semiconductor film 359 has stable electric conductivity and is more electrically stable with respect to irradiation with visible light, ultraviolet light, and the like. By using the oxide semiconductor film 359, the metal oxide film 371, and the metal oxide film 373 for a transistor, a highly reliable semiconductor device having stable electric characteristics can be provided.

In the case where an In—Ga—Zn—O-based metal oxide, for example, is used for the oxide semiconductor film 359, the metal oxide film 371 and the metal oxide film 373 may be formed using a metal oxide containing gallium oxide, particularly, a Ga—Zn—O-based metal oxide obtained by adding zinc oxide to gallium oxide. In the Ga—Zn—O-based metal oxide, the amount of substance of zinc oxide with respect to gallium oxide is lower than 50%, preferably lower than 25%. Note that in the case where the Ga—Zn—O-based metal oxide is in contact with the In—Ga—Zn—O-based metal oxide, the energy barrier is about 0.5 eV on the conduction band side and about 0.7 eV on the valence band side.

The metal oxide film 371 and the metal oxide film 373 each need to have a larger energy gap than the oxide semiconductor film 359 because the oxide semiconductor film 359 is used as an active layer. In addition, between the metal oxide film 371 and the oxide semiconductor film 359 or between the metal oxide film 373 and the oxide semiconductor film 359, it is necessary to form an energy barrier with at least a level with which a carrier does not flow out of the oxide semiconductor film 359 at room temperature (20° C.). For example, an energy difference between the bottom of the conduction band of the metal oxide film 371 or the metal oxide film 373 and the bottom of the conduction band of the oxide semiconductor film 359, or an energy difference between the top of the valence band of the metal oxide film 371 or the metal oxide film 373 and the top of the valence band of the oxide semiconductor film 359 is preferably greater than or equal to 0.5 eV, more preferably greater than or equal to 0.7 eV. In addition, the energy difference is preferably less than or equal to 1.5 eV.

Further, it is preferable that the metal oxide film 371 have a smaller energy gap than the base insulating film 353 and the metal oxide film 373 have a smaller energy gap than the gate insulating film 363.

Figure 12:
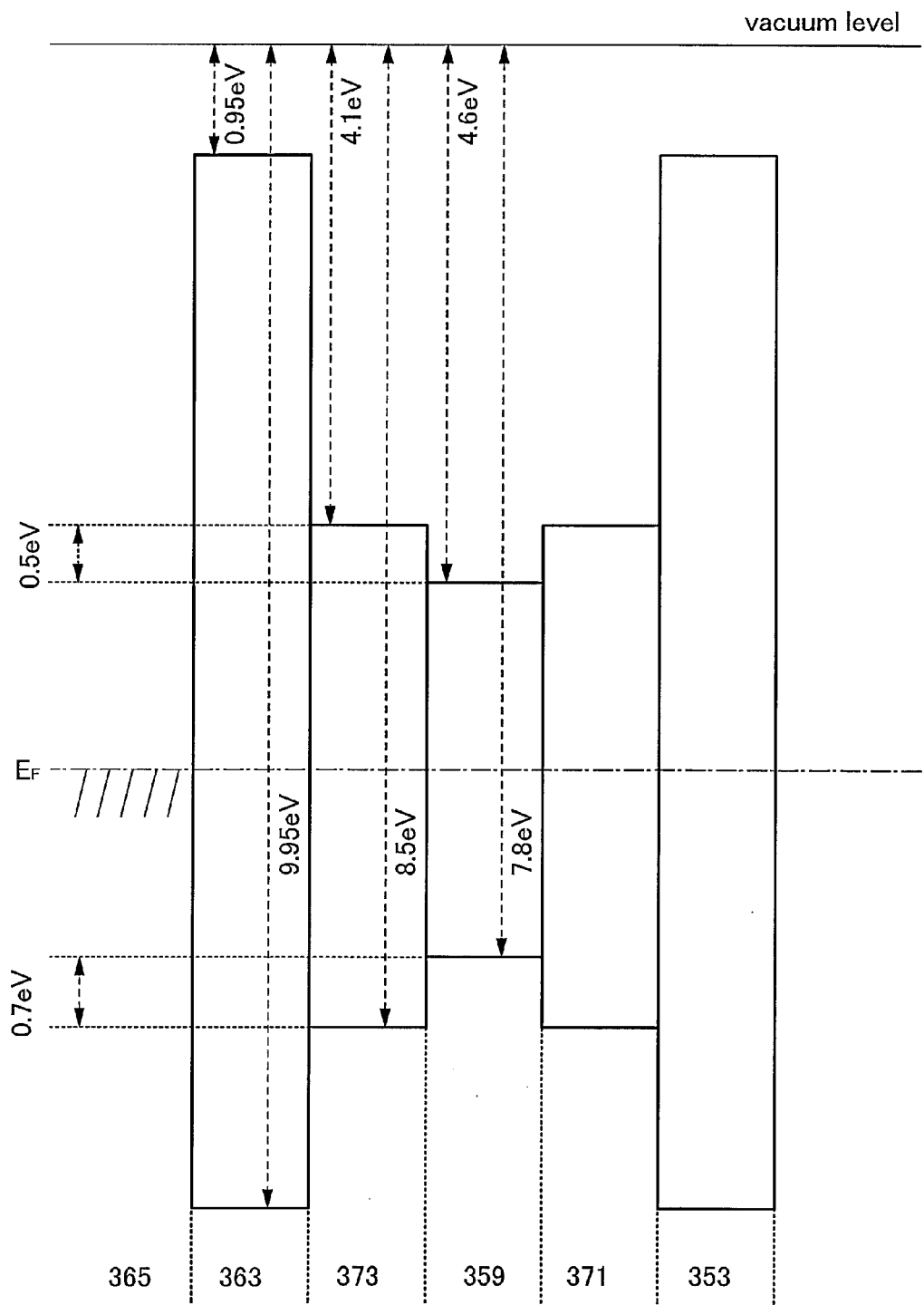
FIG. 12 is a diagram illustrating a band structure of a semiconductor device according to an embodiment of the present invention.

FIG. 12 is an energy band diagram (schematic diagram) of the transistor 160, that is, an energy band diagram of a structure in which the gate insulating film 363, the metal oxide film 373, the oxide semiconductor film 359, the metal oxide film 371, and the base insulating film 353 are arranged from the gate electrode 365 side. FIG. 12 shows the case where silicon oxide (with a band gap Eg of 8 eV to 9 eV) is used as each of the gate insulating film 363 and the base insulating film 353, a Ga—Zn—O-based metal oxide (with a band gap Eg of 4.4 eV) is used as each of the metal oxide films, and an In—Ga—Zn—O-based metal oxide (with a band gap Eg of 3.2 eV) is used as the oxide semiconductor film, on the assumption of the ideal state that the gate insulating film 363, the metal oxide film 373, the oxide semiconductor film 359, the metal oxide film 371, and the base insulating film 353 arranged from the gate electrode 365 side are all intrinsic. An energy difference between the vacuum level and the bottom of the conduction band is 0.95 eV in silicon oxide, an energy difference between the vacuum level and the bottom of the conduction band is 4.1 eV in the Ga—Zn—O-based metal oxide, and an energy difference between the vacuum level and the bottom of the conduction band is 4.6 eV in the In—Ga—Zn—O-based metal oxide.

As shown in FIG. 12, on the gate electrode side (channel side) of the oxide semiconductor film 359, an energy barrier of about 0.5 eV and an energy barrier of about 0.7 eV exist at the interface between the oxide semiconductor film 359 and the metal oxide film 373. On the back channel side (the side opposite to the gate electrode) of the oxide semiconductor film 359, similarly, an energy barrier of about 0.5 eV and an energy barrier of about 0.7 eV exist at the interface between the oxide semiconductor film 359 and the metal oxide film 371. Since such energy barriers exist at the interfaces between the oxide semiconductor and the metal oxides, transfer of carriers at the interfaces can be prevented; thus, the carriers travel inside the oxide semiconductor and do not travel from the oxide semiconductor film 359 to the metal oxide film 371 or the metal oxide film 373. That is, when the oxide semiconductor film 359 is sandwiched between materials (here, the metal oxide films and the insulating films) whose band gaps are wider than that of the oxide semiconductor stepwise, carriers travel inside the oxide semiconductor film.

There is no particular limitation on a formation method of the metal oxide film 371 and the metal oxide film 373. For example, a film formation method such as a plasma CVD method or a sputtering method can be used for formation of the metal oxide film 371 and the metal oxide film 373. A sputtering method or the like is appropriate in terms of low possibility of entry of hydrogen, water, and the like. On the other hand, a plasma CVD method or the like is appropriate in terms of improvement in film quality. In addition, when the metal oxide film 371 and the metal oxide film 373 are formed using a Ga—Zn—O-based metal oxide film, the conductivity of the metal oxide films is high because zinc is used, so that a DC sputtering method can be used to form the metal oxide film 371 and the metal oxide film 373.

The semiconductor device according to the present invention is not limited to the transistor 160 illustrated in FIG. 11A. For example, a structure like a transistor 170 illustrated in FIG. 11B may be employed. The transistor 170 includes a base insulating film 353 provided over a substrate 351, a metal oxide film 371 provided over the base insulating film 353, an oxide semiconductor film 359 provided over the metal oxide film 371, a source electrode 361a and a drain electrode 361b provided in contact with an upper surface and side surfaces of the oxide semiconductor film 359, a gate insulating film 363 provided over the oxide semiconductor film 359, a gate electrode 365 provided over the gate insulating film 363 so as to overlap with the oxide semiconductor film 359, and an insulating film 369 provided over the gate electrode 365. That is, the transistor 170 is different from the transistor 160 in that the metal oxide film 373 between the oxide semiconductor film 359 and the gate insulating film 363 is not provided.

Figure 11B:
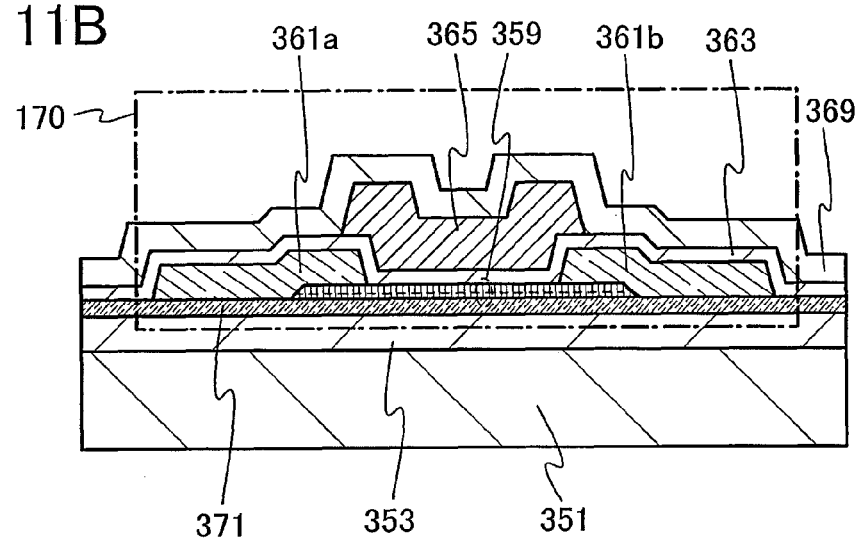
Figure 11C:
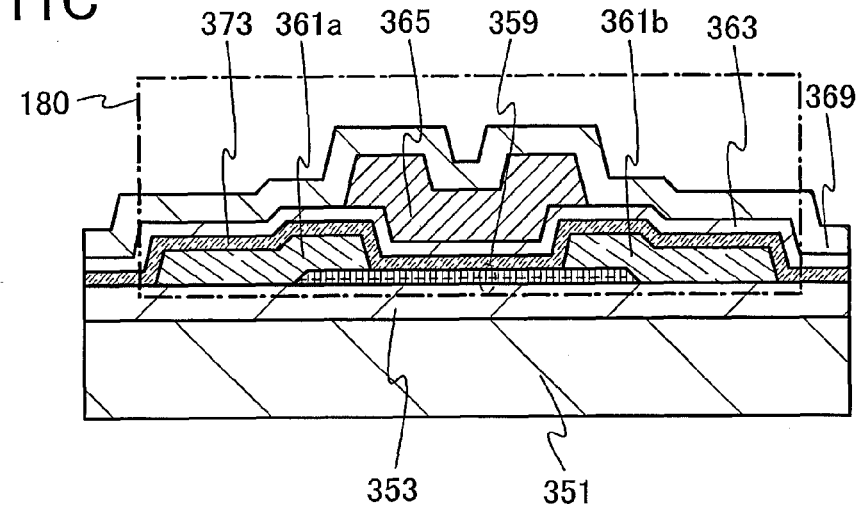

In addition, a structure like a transistor 180 illustrated in FIG. 11C may be employed. The transistor 180 includes a base insulating film 353 provided over a substrate 351, an oxide semiconductor film 359 provided over the base insulating film 353, a source electrode 361a and a drain electrode 361b provided in contact with an upper surface and side surfaces of the oxide semiconductor film 359, a metal oxide film 373 provided over the oxide semiconductor film 359, a gate insulating film 363 provided over the metal oxide film 373, a gate electrode 365 provided over the gate insulating film 363 so as to overlap with the oxide semiconductor film 359, and an insulating film 369 provided over the gate electrode 365. That is, the transistor 180 is different from the transistor 160 in that the metal oxide film 371 between the base insulating film 353 and the oxide semiconductor film 359 is not provided.

In this embodiment, each of the transistors illustrated in FIGS. 11A to 11C has a top gate structure and a structure in which the source electrode 361a and the drain electrode 361b are in contact with the upper surface and the side surfaces of the oxide semiconductor film 359, but the semiconductor device according to the present invention is not limited thereto. Like the transistors illustrated in FIGS. 10A to 10C in the above embodiment, a bottom gate structure may be employed, or a structure in which the oxide semiconductor film 359 is in contact with upper surfaces and side surfaces of the source electrode 361*a* and the drain electrode 361*b* may be employed.

The structures, methods, and the like described in this embodiment can be combined as appropriate with any of the structures, methods, and the like described in other embodiments.

(Embodiment 4)

In this embodiment, an example in which at least part of a driver circuit and a transistor to be disposed in a pixel portion are formed over one substrate will be described below.

The transistor disposed in the pixel portion is formed in accordance with Embodiment 2 or 3. Further, the transistor can easily be an n-channel transistor, and thus, part of a driver circuit that can be formed using an n-channel transistor in the driver circuit is formed over the same substrate as the transistor of the pixel portion. By using the transistor described in the above embodiment for the pixel portion or the driver circuit as described above, a highly reliable display device can be provided.

Figure 29A:
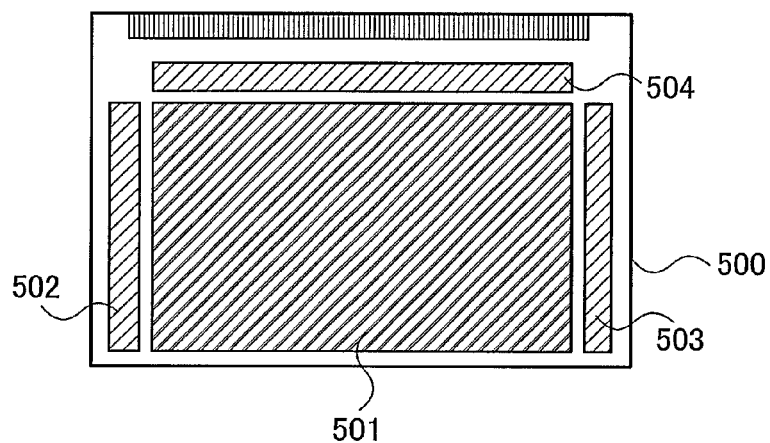
FIGS. 29A to 29C are a block diagram and equivalent circuit diagrams illustrating an embodiment of the present invention.

FIG. 29A illustrates an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels each including a display element are provided in matrix in respective regions in each of which the scan line and the signal line intersect with each other. The substrate 500 of the display device is connected to a timing control circuit (also referred to as a controller or a control IC) through a connection portion such as a flexible printed circuit (FPC).

In FIG. 29A, the first scan line driver circuit 502, the second scan line driver circuit 503, and the signal line driver circuit 504 are formed over the same substrate 500 as the pixel portion 501. Accordingly, the number of components of a driver circuit which is provided outside and the like are reduced, so that a reduction in cost can be achieved. Further, if the driver circuit is provided outside the substrate 500, wiring would need to be extended and the number of wiring connections would be increased, but if the driver circuit is provided over the substrate 500, the number of wiring connections can be reduced. Accordingly, the reliability or yield can be improved.

Figure 29B:
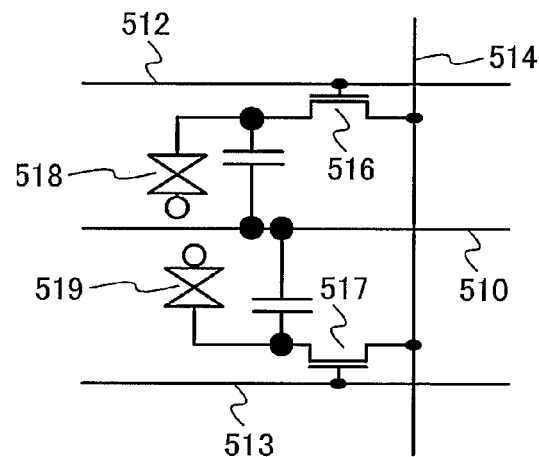

FIG. 29B illustrates an example of a circuit structure of the pixel portion. Here, a pixel structure of a VA liquid crystal display panel is illustrated.

In this pixel structure, a plurality of pixel electrode layers are provided in one pixel, and transistors are connected to respective pixel electrode layers. The plurality of transistors are constructed so as to be driven by different gate signals. In other words, signals applied to individual pixel electrode layers in a multi-domain pixel are controlled independently.

A gate wiring 512 of a transistor 516 and a gate wiring 513 of a transistor 517 are separated so that different gate signals can be given thereto. In contrast, a source or drain electrode layer 514 functioning as a data line is used in common for the transistors 516 and 517. As the transistors 516 and 517, the transistor described in the above embodiment can be used as appropriate. In the above manner, a highly reliable liquid crystal display panel can be provided.

A first pixel electrode layer electrically connected to the transistor 516 and a second pixel electrode layer electrically connected to the transistor 517 have different shapes and are separated by a slit. The second pixel electrode layer is provided so as to surround the external side of the first pixel electrode layer which is spread in a V shape. Timing of voltage application is made to vary between the first and second pixel electrode layers by the transistors 516 and 517 in order to control alignment of the liquid crystal. The transistor 516 is connected to the gate wiring 512, and the transistor 517 is connected to the gate wiring 513. When different gate signals are supplied to the gate wiring 512 and the gate wiring 513, operation timings of the transistor 516 and the transistor 517 can be varied.

Further, a storage capacitor is formed using a capacitor wiring 510, a gate insulating film functioning as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 518. In addition, the second pixel electrode layer, the liquid crystal layer, and the counter electrode layer overlap with each other to form a second liquid crystal element 519. The pixel structure is a multi-domain structure in which the first liquid crystal element 518 and the second liquid crystal element 519 are provided in one pixel.

Note that an embodiment of the present invention is not limited to the pixel structure illustrated in FIG. 29B. For example, a switch, a resistor, a capacitor, a transistor, a sensor, a logic circuit, or the like may be added to the pixel illustrated in FIG. 29B.

Figure 29C:
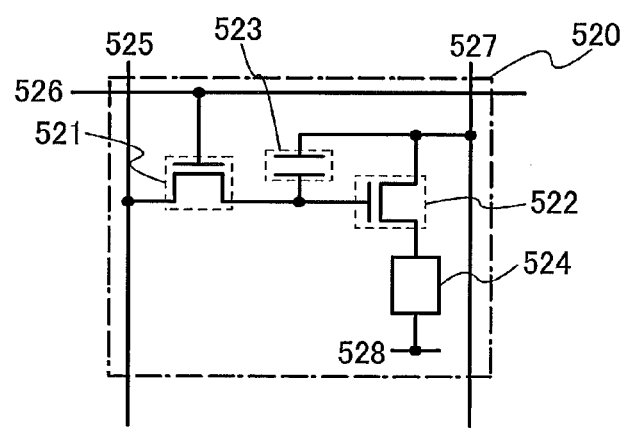

FIG. 29C illustrates an example of a circuit structure of the pixel portion. Here, a pixel structure of a display panel using an organic EL element is illustrated.

In an organic EL element, by application of a voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 29C illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 520 includes a switching transistor 521, a driving transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driving transistor 522. The gate electrode layer of the driving transistor 522 is connected to a power supply line 527 through the capacitor 523, a first electrode of the driving transistor 522 is connected to the power supply line 527, and a second electrode of the driving transistor 522 is connected to a first electrode (pixel electrode) of the light-emitting element 524. A second electrode of the light-emitting element 524 corresponds to a common electrode 528. The common electrode 528 is electrically connected to a common potential line formed over the same substrate as the common electrode 528.

As the switching transistor 521 and the driving transistor 522, the transistor described in the above embodiment can be used as appropriate. In this manner, a highly reliable display panel including an organic EL element can be provided.

Note that the second electrode (the common electrode 528) of the light-emitting element 524 is set to have a low power supply potential. Note that the low power supply potential is a potential satisfying the low power supply potential<a high power supply potential with reference to the high power supply potential that is set for the power supply line 527. As the low power supply potential, GND, 0 V, or the like may be employed, for example. In order to make the light-emitting element 524 emit light by applying a potential difference between the high power supply potential and the low power supply potential to the light-emitting element 524 so that current is supplied to the light-emitting element 524, each of the potentials is set so that the potential difference between the high power supply potential and the low power supply potential is higher than or equal to the forward threshold voltage of the light-emitting element 524.

Gate capacitance of the driving transistor 522 may be used as a substitute for the capacitor 523, in which case the capacitor 523 can be omitted. The gate capacitance of the driving transistor 522 may be formed between a channel formation region and the gate electrode layer.

In the case of a voltage-input voltage driving method, a video signal is input to the gate electrode layer of the driving transistor 522 so that the driving transistor 522 is in either of two states of being sufficiently turned on and turned off. That is, the driving transistor 522 operates in a linear region. The driving transistor 522 operates in a linear region, and thus, a voltage higher than the voltage of the power supply line 527 is applied to the gate electrode layer of the driving transistor 522. Note that a voltage of higher than or equal to (power supply line voltage+Vth of the driving transistor 522) is applied to the signal line 525.

In the case of performing analog grayscale driving instead of digital time grayscale driving, the same pixel structure as that in FIG. 29C can be used by changing signal input.

In the case of performing analog grayscale driving, a voltage of higher than or equal to the sum of the forward voltage of the light-emitting element 524 and Vth of the driving transistor 522 is applied to the gate electrode layer of the driving transistor 522. The forward voltage of the light-emitting element 524 indicates a voltage at which a desired luminance is obtained, and includes at least a forward threshold voltage. A video signal by which the driving transistor 522 is operated in a saturation region is input, so that current can be supplied to the light-emitting element 524. In order for the driving transistor 522 to operate in a saturation region, the potential of the power supply line 527 is set to be higher than the gate potential of the driving transistor 522. Since the video signal is an analog signal, a current in accordance with the video signal can be supplied to the light-emitting element 524, and analog grayscale driving can be performed.

Note that an embodiment of the present invention is not limited to the pixel structure illustrated in FIG. 29C. For example, a switch, a resistor, a capacitor, a sensor, a transistor, a logic circuit, or the like may be added to the pixel illustrated in FIG. 29C.

(Embodiment 5)

A semiconductor device disclosed in this specification can be applied to a variety of electronic devices (including amusement machines). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in the above embodiment will be described.

Figure 30A:
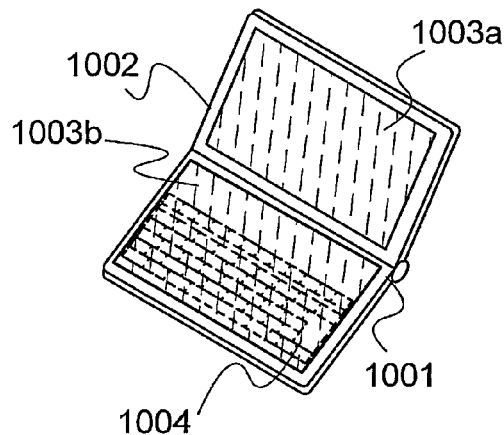
FIGS. 30A to 30D are external views each illustrating an electronic device according to an embodiment of the present invention.

FIG. 30A illustrates a portable information terminal, which includes a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using the transistor described in the above embodiment as a switching element and applied to the display portion 1003a or 1003b, whereby a highly reliable portable information terminal can be provided.

The portable information terminal in FIG. 30A can have a function of displaying a variety of data (e.g., a still image, a moving image, and a text image) on the display portion, a function of displaying a calendar, a date, the time, or the like on the display portion, a function of operating or editing data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 30A may be configured to be able to transmit and receive data wirelessly. Through wireless communication, desired book data or the like can be purchased and downloaded from an electronic book server.

Figure 30B:
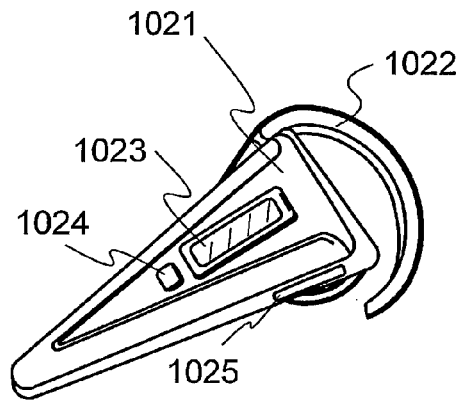

FIG. 30B illustrates a portable music player, which includes, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured by using the transistor described in the above embodiment as a switching element and applied to the display portion 1023, whereby a highly reliable portable music player can be provided.

Furthermore, when the portable music player illustrated in FIG. 30B has an antenna, a microphone function, or a wireless communication function and is used with a mobile phone, a user can talk on the phone wirelessly in a hands-free way while driving a car or the like.

Figure 30C:
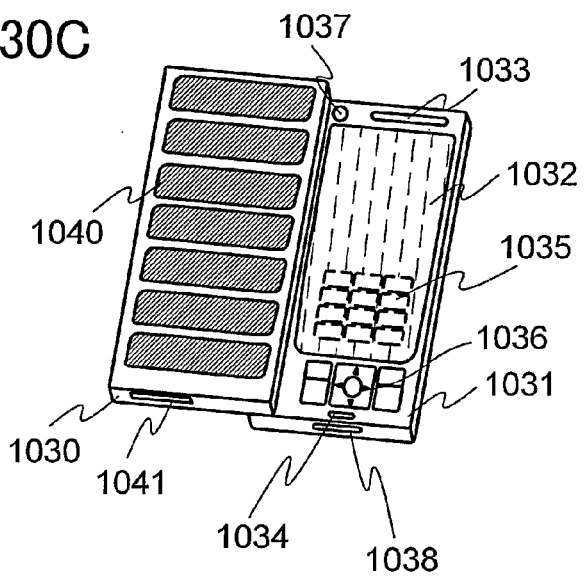

FIG. 30C illustrates a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in the above embodiment is applied to the display panel 1032, whereby a highly reliable mobile phone can be provided.

Further, the display panel 1032 includes a touch panel. A plurality of operation keys 1035 which are displayed as images are indicated by dotted lines in FIG. 30C. Note that a boosting circuit by which a voltage output from the solar cell 1040 is increased to be sufficiently high for each circuit is also included.

For example, a power transistor used for a power supply circuit such as a boosting circuit can also be formed when the oxide semiconductor film of the transistor described in the above embodiment has a thickness of greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 30C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 30D:
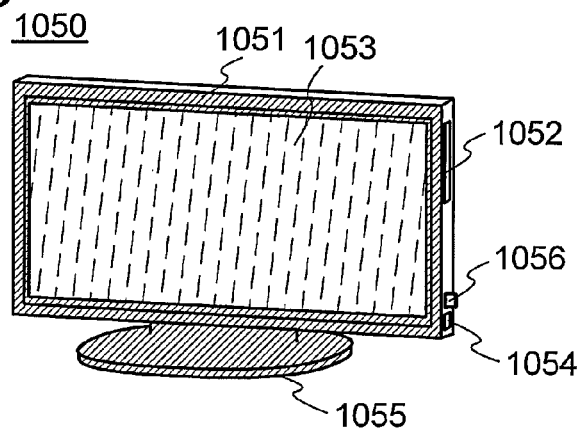

FIG. 30D illustrates an example of a television set. In a television set 1050, a display portion 1053 is incorporated in a housing 1051. Images can be displayed on the display portion 1053. Here, the housing 1051 is supported on a stand 1055 incorporating a CPU. When the transistor described in the above embodiment is applied to the display portion 1053, the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the receiver, a general television broadcast can be received. Moreover, when the television set is connected to a communication network with or without wires via a modem, one-way (from a sender to a receiver) or two-way (between a sender and a receiver or between receivers) data communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

When the semiconductor device described in the above embodiment is applied to the external memory 1056 or a CPU, the television set 1050 can have high reliability and power consumption thereof can be sufficiently reduced.

EXAMPLE

Measurements were performed on an oxide semiconductor film according to an embodiment of the present invention and a semiconductor device including the oxide semiconductor film by using a variety of methods. Results thereof will be described in this example.

<1. Observation of TEM Image and Measurement of Electron Diffraction Intensity Using TEM, and XRD Measurement>

In this section, an oxide semiconductor film was formed in accordance with the above embodiment, and the oxide semiconductor film was observed with the use of a transmission electron microscope (TEM). A result thereof is described below.

In this section, the oxide semiconductor film was formed over a quartz substrate by a sputtering method. In this way, Sample A, Sample B, Sample C, Sample D, and Sample E were manufactured. The substrate temperatures in deposition for Sample A, Sample B, Sample C, Sample D, and Sample E were room temperature, 200° C., 250° C., 300° C., and 400° C., respectively. Samples A and B were manufactured with a substrate temperature in deposition of lower than that in the method in Embodiment 2, and Samples C to E were manufactured with a substrate temperature in the range in the method in Embodiment 2. A target for forming the oxide semiconductor film had a composition ratio where $In_2O_3$:$Ga_2O_3$:$ZnO$=1:1:2 [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, and the radio frequency (RF) power was 0.5 kW. Note that the aiming thickness of each of Samples A, B, and E was 50 nm, and the aiming thickness of each of Samples C and D was 100 nm.

After the oxide semiconductor film was formed, heat treatment was performed on the quartz substrate over which the oxide semiconductor film was formed. The heat treatment was performed in a dry atmosphere with a dew point of −24° C. at a temperature of 450° C. for 1 hour. In this manner, Samples A, B, C, D, and E, in each of which the oxide semiconductor film was formed over the quartz substrate, were manufactured.

Further, in a manner different from those of Samples A to E, an oxide semiconductor film was formed by the two-step method described in Embodiment 2, thereby forming Sample F. Sample F was formed in such a way that, first, a first oxide semiconductor film having a thickness of 5 nm was formed, first heat treatment was performed on the first oxide semiconductor film, a second oxide semiconductor film having a thickness of 30 nm was formed over the first oxide semiconductor film, and second heat treatment was performed on the first oxide semiconductor film and the second oxide semiconductor film.

Here, a target for forming the first oxide semiconductor film had a composition ratio where $In_2O_3$:$Ga_2O_3$:$ZnO$=1:1:2 [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, and the radio frequency (RF) power was 0.5 kW. The first heat treatment was performed at a temperature of 650° C. in a nitrogen atmosphere for 1 hour.

In addition, a target for forming the second oxide semiconductor film had a composition ratio where $In_2O_3$:$Ga_2O_3$:

ZnO=1:1:2 [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, and the radio frequency (RF) power was 0.5 kW. The second heat treatment was performed at a temperature of 650° C. in a dry atmosphere with a dew point of −24° C. for 1 hour.

In this manner, Sample F in which the oxide semiconductor film was formed over the quartz substrate by the two-step method was manufactured.

As a comparative example of Samples A to F, an IGZO single crystal film having a thickness of 150 nm was formed over an yttria-stabilized zirconia (YSZ) substrate, thereby forming Sample G.

Figure 16E:
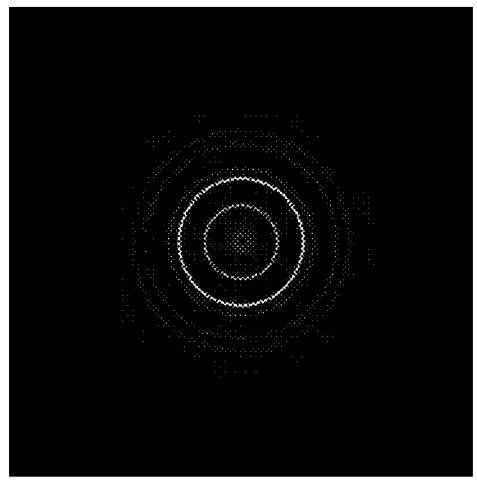
FIGS. 16A to 16E are plane TEM images and electron diffraction patterns according to an example of the present invention.
Figure 16C:
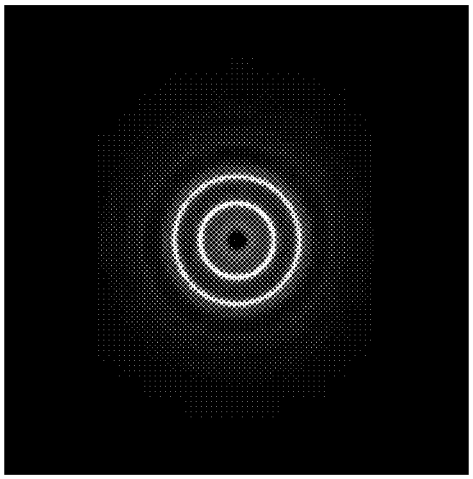
Figure 16D:
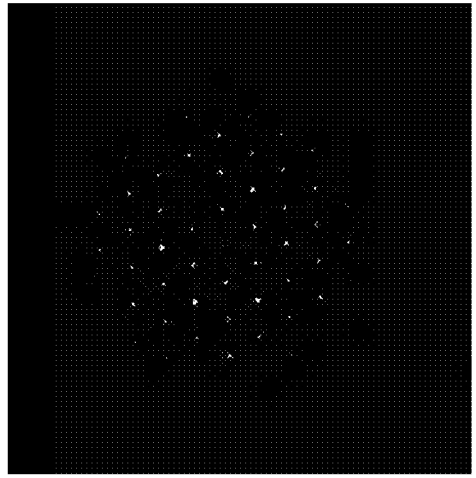
Figure 16A:
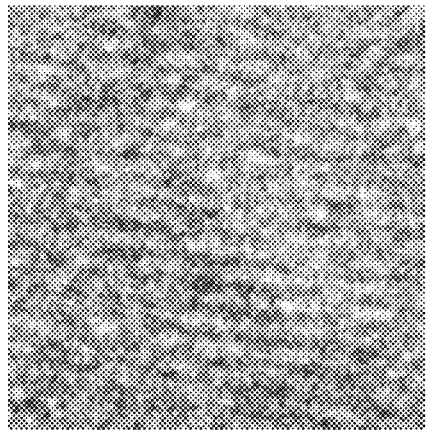
Figure 16B:
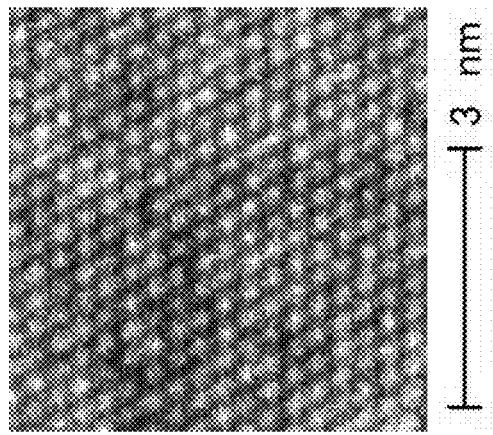

By using TEM, TEM images and electron diffraction patterns of Samples A to G were taken by irradiating the substrate over which the oxide semiconductor film was formed with an electron beam perpendicularly to the substrate, that is, in parallel with the c-axis direction in the above embodiment. FIGS. 13A to 13E are cross-sectional TEM images of Samples A to E, respectively. Since the direction of a top surface of the sample corresponds to the longitudinal direction in each of the cross-sectional TEM images in FIGS. 13A to 13E, the longitudinal direction of the image is the c-axis direction. FIGS. 14A to 14E are plane TEM images of Samples A to E, respectively. Since the direction of a top surface of the sample corresponds to the vertical direction in each of the plane TEM images in FIGS. 14A to 14E, the vertical direction of the image is the c-axis direction. FIGS. 15A to 15E are electron diffraction patterns of Samples A to E, respectively. Since the direction of a top surface of the sample corresponds to the vertical direction in each of the electron diffraction patterns in FIGS. 15A to 15E, the vertical direction of the pattern is the c-axis direction. FIGS. 16A and 16B are plane TEM images of Samples F and G, respectively. FIG. 16C is an electron diffraction pattern of Sample F. FIGS. 16D and 16E are electron diffraction patterns of Sample G. Since the direction of a top surface of the sample corresponds to the vertical direction in each of the plane TEM images and the electron diffraction patterns in FIGS. 16A to 16E, the vertical direction of the image and the pattern is the c-axis direction.

Note that in this section, the cross-sectional TEM images, the plane TEM images, and the electron diffraction patterns were taken with H-9000NAR manufactured by Hitachi High-Technologies Corporation by setting the diameter of an electron beam spot to 1 nm and the acceleration voltage to 300 kW.

Figure 13C:
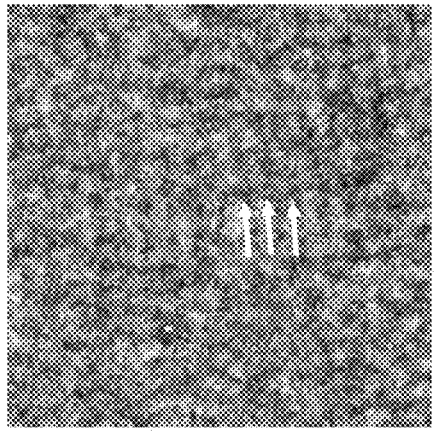
FIGS. 13A to 13E are cross-sectional TEM images according an example of the present invention.
Figure 13E:
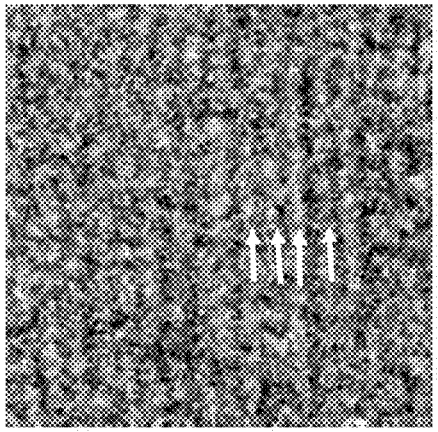
Figure 13B:
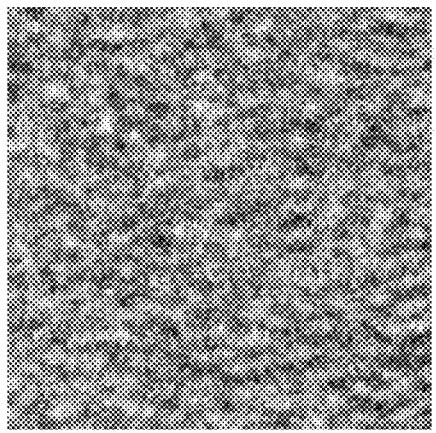
Figure 13D:
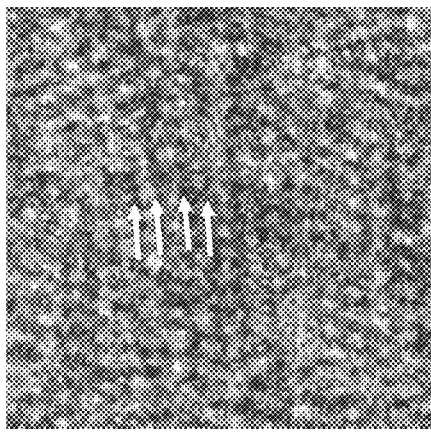
Figure 13A:
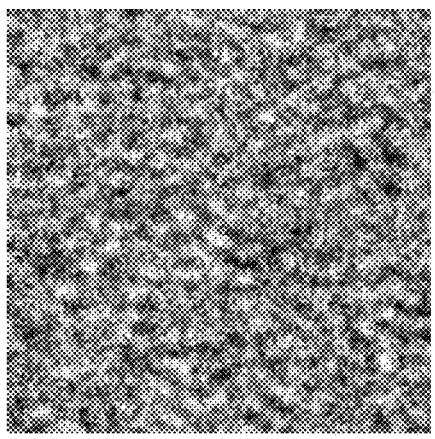

In the cross-sectional TEM images in FIGS. 13C to 13E, a crystalline region with c-axis alignment was observed. On the other hand, in the cross-sectional TEM images in FIGS. 13A and 13B, a crystalline region with c-axis alignment was not clearly observed. This shows that the crystalline region with c-axis alignment is formed in the oxide semiconductor film formed with a substrate temperature in deposition of higher than 200° C., preferably higher than or equal to 250° C. The clarity of the crystalline region with c-axis alignment is increased from FIGS. 13C to 13E sequentially, and thus, it is estimated that crystallinity of the oxide semiconductor film is improved as the substrate temperature in forming the oxide semiconductor film is increased.

In the plane TEM image in FIG. 14E, atoms arranged in a hexagonal lattice were observed. Also in the plane TEM images in FIGS. 14C and 14D, atoms arranged in a hexagonal lattice were observed in light colors. In the plane TEM images in FIGS. 14A and 14B, atoms arranged in a hexagonal lattice were not clearly observed. In addition, in the plane TEM images in FIGS. 16A and 16B, atoms arranged in a hexagonal lattice were observed. From the above, it is assumed that the crystalline region with c-axis alignment in the oxide semiconductor film tends to have a hexagonal crystal structure having three-fold symmetry as illustrated in FIG. 2. In addition, it was found that the crystalline region was also formed in the oxide semiconductor film of Sample F manufactured by the two-step method, as in Samples C to E. As in the observation results of the cross-sectional TEM images in FIGS. 13A to 13E, it is assumed that crystallinity of the oxide semiconductor film is improved as the substrate temperature in forming the oxide semiconductor film is increased. The observation of FIGS. 13A to 13E and FIGS. 14A to 14E show that each of Samples A and B is an amorphous oxide semiconductor film hardly having crystallinity and each of Samples C to F is an oxide semiconductor film including a crystalline region with c-axis alignment.

Each of the electron diffraction patterns in FIGS. 15A to 15E has a concentric circular halo pattern, in which the width of a diffraction pattern is wide and not distinct and the electron diffraction intensity of an outer halo pattern is lower than that of an inner halo pattern. Further, the electron diffraction intensity of the outer halo pattern is increased from FIGS. 15A to 15E sequentially. An electron diffraction pattern in FIG. 16C also has a concentric circular halo pattern; however, as compared to those in FIGS. 15A to 15E, in FIG. 16C, the width of the halo pattern is thinner, and the electron diffraction intensity of an inner halo pattern and that of an outer halo pattern are substantially equal to each other.

An electron diffraction pattern in FIG. 16D is a spot pattern, unlike those in FIGS. 15A to 15E and FIG. 16C. An image of the electron diffraction pattern in FIG. 16D is processed to obtain a concentric circular pattern in FIG. 16E; the pattern in FIG. 16E is not a halo pattern because the width of the concentric circular pattern is thin, unlike those in FIGS. 15A to 15E and FIG. 16C. Further, FIG. 16E is different from FIGS. 15A to 15E and FIG. 16C in that the electron diffraction intensity of an outer concentric circular pattern is higher than that of an inner concentric circular pattern.

Figure 17:
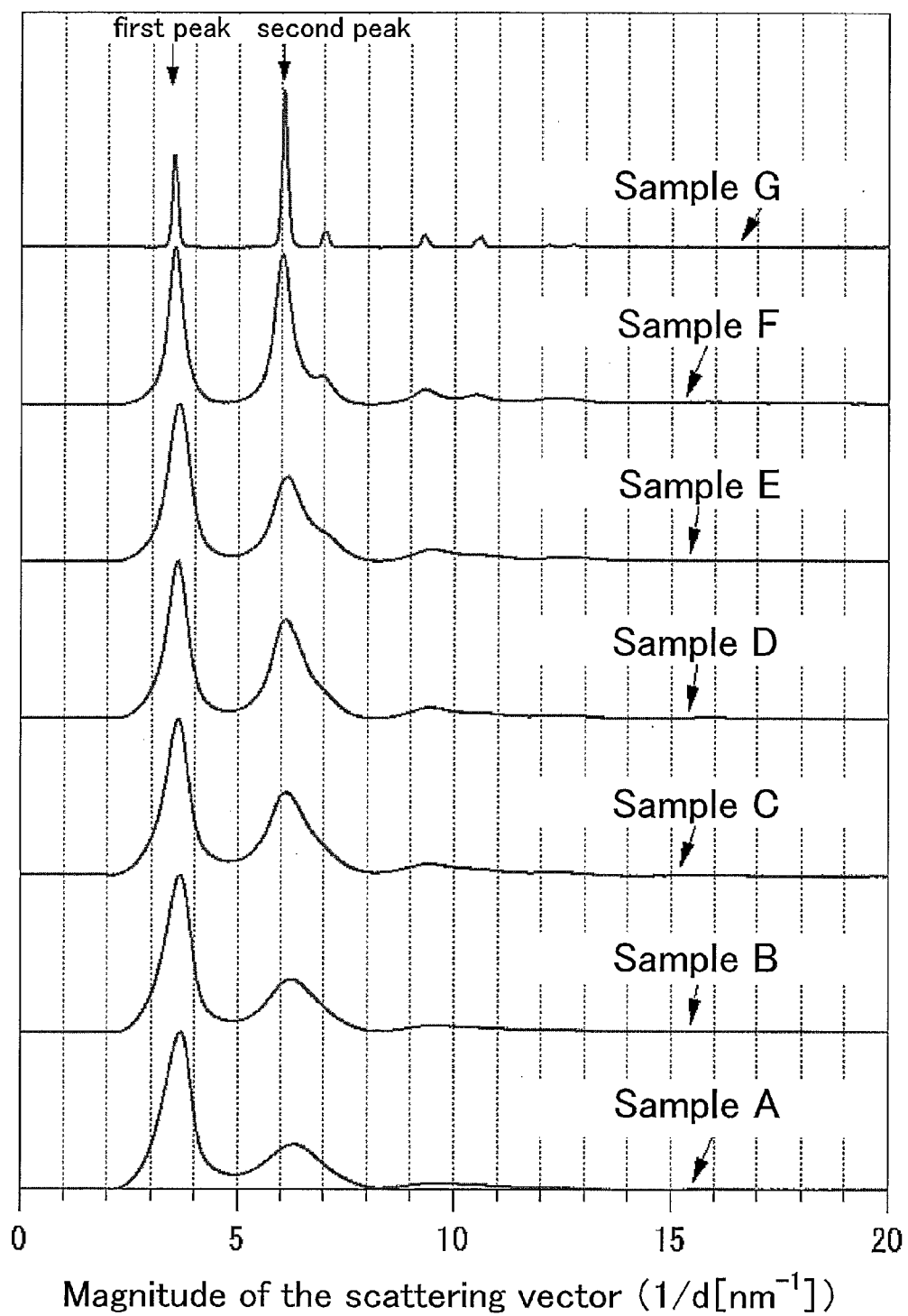
FIG. 17 is a graph showing electron diffraction intensity according to an example of the present invention.

FIG. 17 is a graph showing the electron diffraction intensities of Samples A to G. In the graph shown in FIG. 17, the vertical axis indicates the electron diffraction intensity (arbitrary unit) and the horizontal axis indicates the magnitude (1/d [1/nm]) of a scattering vector of the sample. Note that d in the magnitude (1/d [1/nm]) of the scattering vector denotes an interplanar spacing in crystals. The magnitude (1/d) of the scattering vector can be represented by the following formula by using a distance r from a spot of a transmitted wave in the center to a concentric circular pattern of a diffracted wave in a film of the electron diffraction pattern, a camera length L between the sample and the film in TEM, and a wavelength λ of an electron beam used in TEM.

$$rd = \lambda L \qquad \text{[Formula 1]}$$
$$\frac{1}{d} = \frac{r}{\lambda L}$$

That is, the magnitude (1/d) of the scattering vector on the horizontal axis in FIG. 17 is in proportion to the distance r from a spot of a transmitted wave in the center to a concentric circular pattern of a diffracted wave in each of the electron diffraction patterns in FIGS. 15A to 15E and FIGS. 16C and 16E.

That is, in the graph shown in FIG. 17, a first peak in the range of $3.3 \text{ nm}^{-1} \leq 1/d \leq 4.1 \text{ nm}^{-1}$ corresponds to a peak of the inner halo pattern and a peak of the inner concentric circular pattern in the electron diffraction patterns in FIGS. 15A to 15E and FIGS. 16A and 16E, and a second peak in the range of $5.5 \text{ nm}^{-1} \leq 1/d \leq 7.1 \text{ nm}^{-1}$ corresponds to a peak of the outer halo pattern and a peak of the outer concentric circular pattern in the electron diffraction patterns in FIGS. 15A to 15E and FIGS. 16A and 16E.

Figure 18:
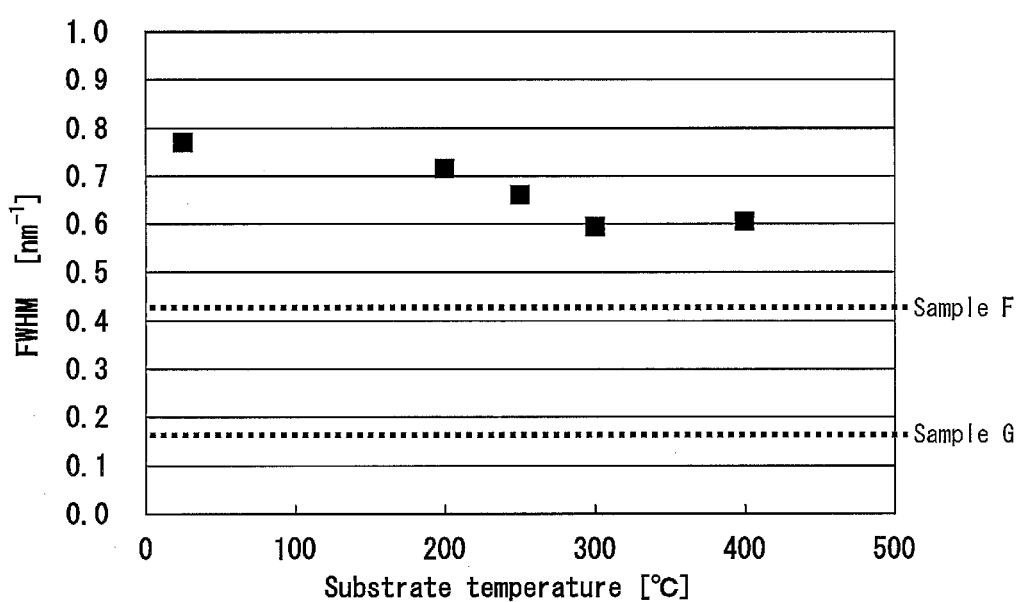
FIG. 18 is a graph showing the full width at half maximum of a first peak in electron diffraction intensity according to an example of the present invention.
Figure 19:
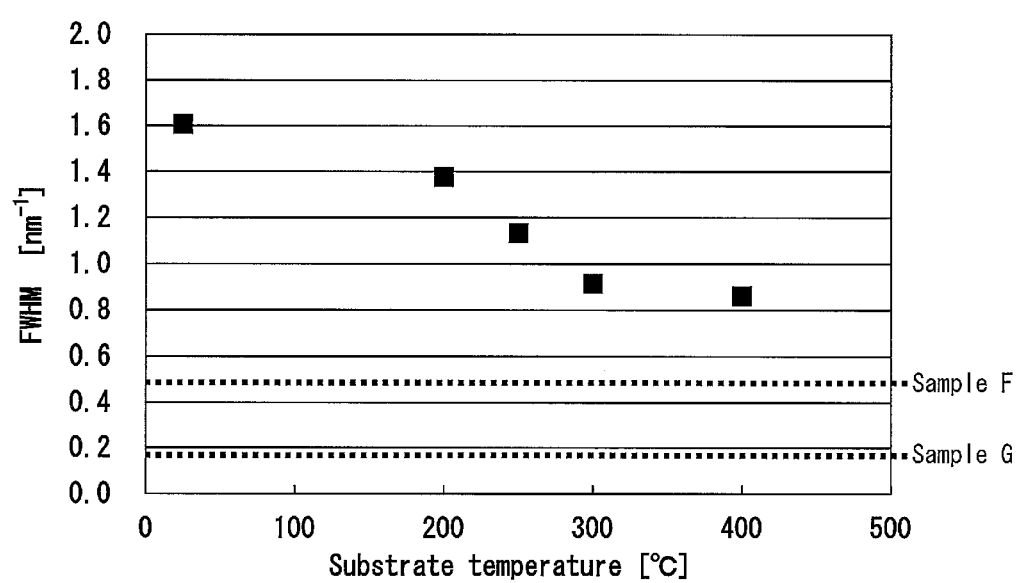
FIG. 19 is a graph showing the full width at half maximum of a second peak in electron diffraction intensity according to an example of the present invention.

FIG. 18 is a graph showing the full width at half maximum of the first peak of each of Samples A to G, and FIG. 19 is a graph showing the full width at half maximum of the second peak of each of Samples A to G. In the graph shown in FIG. 18, the vertical axis indicates the full width at half maximum (FWHM) ($\text{nm}^{-1}$) of the first peak and the horizontal axis indicates the substrate temperature (° C.) in forming the oxide semiconductor film of Samples A to E. In addition, dotted lines in the graph of FIG. 18 indicate the values of the full width at half maximum of the first peaks in Samples F and G. In a manner similar to that in FIG. 18, the full width at half maximum of the second peaks is shown in the graph of FIG. 19. Positions ($\text{nm}^{-1}$) and the full width at half maximum ($\text{nm}^{-1}$) of the first peak and the second peak in FIG. 18 and FIG. 19 are listed in Table 1.

TABLE 1

| Name of Sample | First Peak | | Second Peak | |
|---|---|---|---|---|
| | Peak Position (1/nm) | Full Width at Half Maximum (1/nm) | Peak Position (1/nm) | Full Width at Half Maximum (1/nm) |
| Sample A | 3.685 | 0.770 | 6.325 | 1.606 |
| Sample B | 3.674 | 0.715 | 6.270 | 1.375 |
| Sample C | 3.674 | 0.660 | 6.226 | 1.133 |
| Sample D | 3.597 | 0.594 | 6.116 | 0.913 |
| Sample E | 3.630 | 0.605 | 6.138 | 0.859 |
| Sample F | 3.575 | 0.418 | 6.105 | 0.473 |
| Sample G | 3.509 | 0.149 | 6.072 | 0.149 |

FIG. 18 and FIG. 19 show a tendency in which the full width at half maximum and the peak position of each of the first peak and the second peak decrease as the substrate temperature in formation of the oxide semiconductor film is increased. It is also shown that the full width at half maximum of each of the first peak and the second peak does not differ greatly between the substrate temperatures in film formation in the range of 300° C. to 400° C. Further, values of the full width at half maximum and the peak position of each of the first peak and the second peak of Sample F which was formed by the two-step method were smaller than values of the full width at half maximum and the peak position of Samples A to E and larger than values of the full width at half maximum and the peak position of Sample G which was in a single crystal state.

The crystallinity of the oxide semiconductor film including a crystalline region with c-axis alignment is different from the crystallinity of Sample G which has a single crystal structure. Therefore, in the measurement of the electron diffraction intensity in which irradiation with an electron beam is performed from the c-axis direction, the full width at half maximum of each of the first peak and the second peak is greater than or equal to $0.2 \text{ nm}^{-1}$; preferably, the full width at half maximum of the first peak is greater than or equal to $0.4 \text{ nm}^{-1}$, and the full width at half maximum of the second peak is greater than or equal to $0.45 \text{ nm}^{-1}$.

From FIGS. 13A to 13E and FIGS. 14A to 14E, crystallinity is not clearly observed in Samples A and B, that is, in the oxide semiconductor films formed with a substrate temperature in deposition of lower than or equal to 200° C.; in consideration of this, it is preferable that in the oxide semiconductor film including a crystalline region with c-axis alignment, the full width at half maximum of the first peak be less than or equal to $0.7 \text{ nm}^{-1}$, and the full width at half maximum of the second peak be less than or equal to $1.4 \text{ nm}^{-1}$ in the measurement of the electron diffraction intensity in which irradiation with an electron beam is performed from the c-axis direction.

In addition, X-ray diffraction (XRD) measurement was performed on Samples A, E, and G, whose results support the above-described TEM measurement results.

Figure 20:
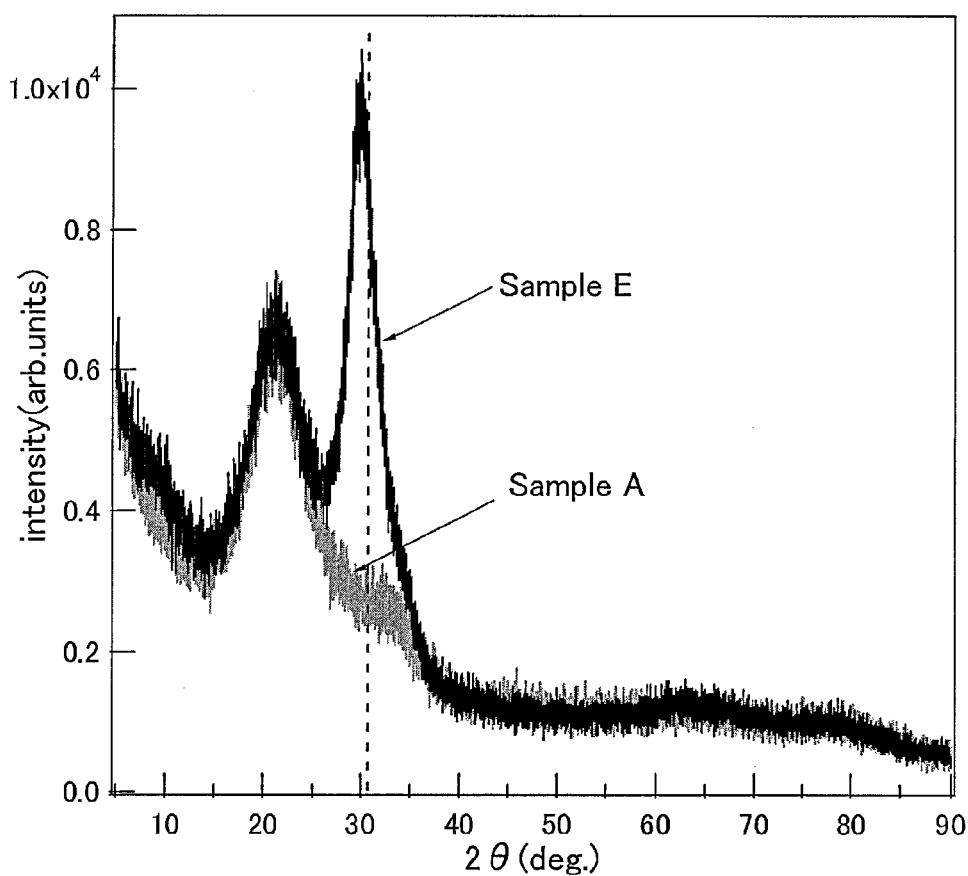
FIG. 20 shows XRD spectra according to an example of the present invention.

FIG. 20 shows the results of measuring XRD spectra of Samples A and E by using an out-of-plane method. In FIG. 20, the vertical axis indicates the X ray diffraction intensity (arbitrary unit), and the horizontal axis indicates the rotation angle 2θ [deg.].

FIG. 20 shows that a strong peak is observed in a region where 2θ is in the vicinity of 30° in Sample E, whereas a peak is hardly observed in a region where 2θ is in the vicinity of 30° in Sample A. This peak is attributed to diffraction in (009) plane of an IGZO crystal. This also indicates that Sample E is an oxide semiconductor film including a crystalline region with c-axis alignment, which is clearly different from Sample A which has an amorphous structure.

Figure 21A:
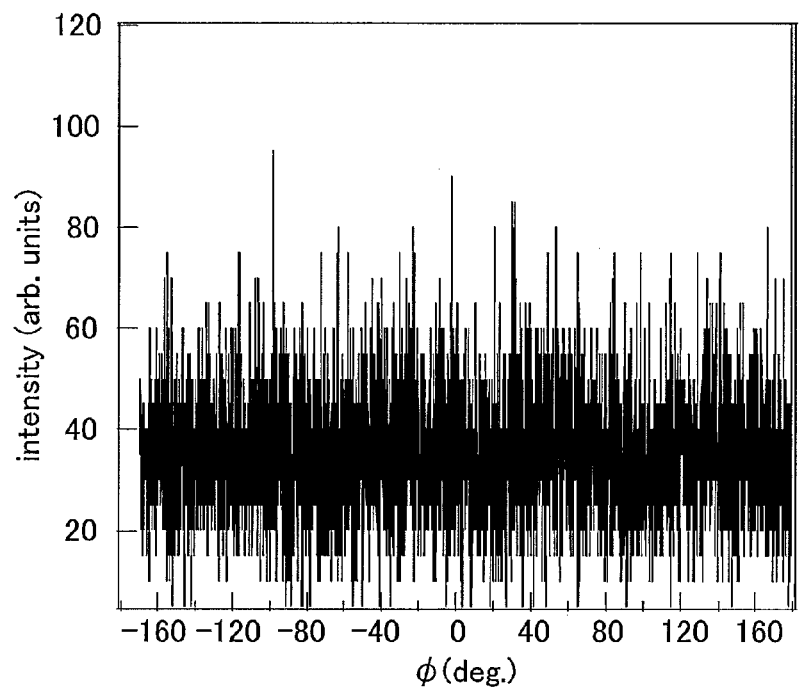
FIGS. 21A and 21B each show an XRD spectrum according to an example of the present invention.
Figure 21B:
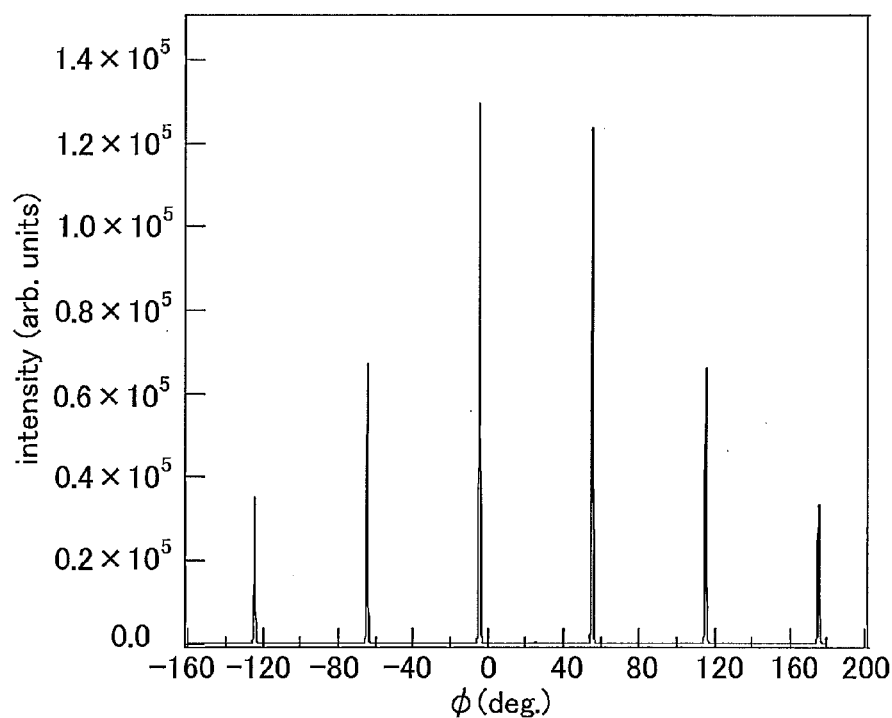

FIG. 21A shows the result of measuring an XRD spectrum of Sample E by using an in-plane method. Similarly, FIG. 21B shows the result of measuring an XRD spectrum of Sample G by using an in-plane method. In FIGS. 21A and 21B, the vertical axis indicates the X ray diffraction intensity (arbitrary unit), and the horizontal axis indicates the rotation angle φ [deg.]. In an in-plane method used in this example, XRD measurement was performed by rotating the sample at a rotation angle φ using the c-axis of the sample as a rotation axis.

In the XRD spectrum of Sample G shown in FIG. 21B, peaks are observed at equal intervals of 60° which is the rotation angle, which shows that Sample G is a single crystal film having six-fold symmetry. On the other hand, in the XRD spectrum of Sample E shown in FIG. 21A, regular peaks are not observed, which shows that there is no alignment in the a-b plane direction in the crystalline region. That is, individual crystalline regions in Sample E are crystallized along the c-axes but alignment along the a-b planes does not necessarily appear. This also indicates that Sample E is an oxide semiconductor film including a crystalline region with c-axis alignment, which is clearly different from Sample G which has a single crystal structure.

As described above, the oxide semiconductor film including a crystalline region with c-axis alignment according to an embodiment of the present invention has crystallinity that is clearly different from that of the oxide semiconductor film with an amorphous structure and that of the oxide semiconductor film with a single crystal structure.

The oxide semiconductor film including a crystalline region with c-axis alignment as described above has favorable crystallinity as compared to an oxide semiconductor film which is entirely amorphous, and defects typified by oxygen defects or impurities such as hydrogen bonded to a dangling bond or the like are reduced. A defect typified by an oxygen defect, hydrogen bonded to a dangling bond or the like, or the like functions as a source for supplying a carrier in the oxide semiconductor film, which might change the electric conductivity of the oxide semiconductor film. Therefore, the oxide semiconductor film including a crystalline region in which such defects are reduced has stable electric conductivity and is more electrically stable with respect to irradiation with visible light, ultraviolet light, and the like. By using such an oxide semiconductor film including a crystalline region for a transistor, a highly reliable semiconductor device having stable electric characteristics can be provided.

<2. ESR Measurement>

In this section, an oxide semiconductor film was formed in accordance with the above embodiment, and the oxide semiconductor film was evaluated with the use of an electron spin resonance (ESR) method. A result thereof is described below.

In this section, Sample H in which an oxide semiconductor film was formed over a quartz substrate by a sputtering method and Sample I obtained by performing heat treatment on the quartz substrate over which the oxide semiconductor film was formed were manufactured. A target for forming the oxide semiconductor film had a composition ratio where $In_2O_3:Ga_2O_3:ZnO=1:1:2$ [molar ratio]. Other conditions were as follows: as for the flow of deposition gases, the flow of an argon gas was 30 sccm and the flow of an oxygen gas was 15 sccm, the substrate temperature in deposition was 400° C., the pressure was 0.4 Pa, the distance between the substrate and the target was 60 mm, the radio frequency (RF) power was 0.5 kW, and the film thickness was 100 nm.

After the oxide semiconductor film was formed, heat treatment was performed on the quartz substrate over which the oxide semiconductor film was formed to form Sample I. The heat treatment was performed in a dry atmosphere with a dew point of −24° C. at a temperature of 450° C. for 1 hour. In this manner, Samples H and I, in each of which the oxide semiconductor film was formed over the quartz substrate, were manufactured.

In this section, ESR measurement performed on Samples H and I is described. ESR measurement is a method by which lone electrons in a substance are measured by utilizing Zeeman effect. When a magnetic field H applied to the sample is swept while the sample is irradiated with a microwave having a specific frequency v, lone electrons in the sample absorb the microwave in a specific magnetic field H, whereby transition of a spin energy level parallel with the magnetic field to a spin energy level anti-parallel with the magnetic field is caused. The relation between the frequency v of the microwave absorbed by the lone electrons in the sample and the magnetic field H applied to the sample can be expressed by the following formula.

$$hv=g\mu_B H \quad \text{[Formula 2]}$$

In the formula, h denotes a Planck constant and $\mu_B$ denotes a Bohr magneton. In addition, g is a coefficient called a g value which varies depending on a local magnetic field applied to the lone electron in the substance; that is, by calculating the g value using the above formula, the environment of the lone electron such as a dangling bond can be known.

In this example, the ESR measurement was performed by using E500 manufactured by Bruker Corporation. The measurement condition was as follows: the measurement temperature was room temperature, the microwave frequency was 9.5 GHz, and the microwave power was 0.2 mW.

Figure 22:
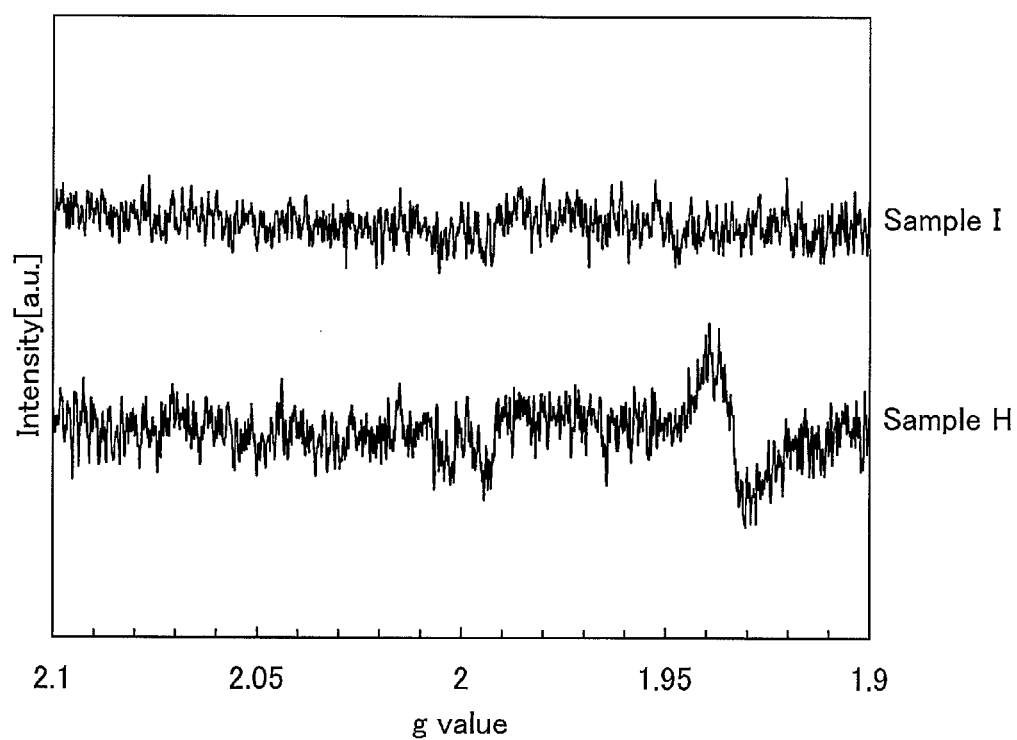
FIG. 22 is a graph showing results of ESR measurement according to an example of the present invention.

The results of the ESR measurement performed on Samples H and I are shown in FIG. 22. In the graph shown in FIG. 22, the vertical axis indicates a first-order differential of the absorption intensity of the microwave, and the horizontal axis indicates a g value.

As shown in the graph of FIG. 22, a signal corresponding to the absorption of the microwave was not observed as for Sample I, whereas a signal corresponding to the absorption of the microwave was observed in a region where the g value was in the vicinity of 1.93 as for Sample H. By calculating the value of an integral of the signal in a region where the g value is in the vicinity of 1.93, the spin density of lone electrons corresponding to the absorption of the microwave, i.e., a spin density of $1.3 \times 10^{18}$ (spins/cm$^3$) can be obtained. Note that in Sample I, the absorption of the microwave is less than the lower detection limit; therefore, the spin density of lone electrons in Sample 1 is lower than or equal to $1 \times 10^{16}$ (spins/cm$^3$).

Here, quantum chemistry calculation was performed in order to examine the following: to which kind of dangling bond the signal at a g value in the vicinity of 1.93 is attributed in an In—Ga—Zn—O-based oxide semiconductor film. Specifically, a cluster model in which a metal atom has a dangling bond corresponding to an oxygen defect was formed and the structure of the cluster model was optimized, and the g value thereof was calculated.

Amsterdam density functional (ADF) software was used to optimize the structure of the model and calculate the g value of the model whose structure was optimized. GGA:BP was used as a functional and TZ2P was used as a basis function in both the optimization of the structure of the model and the calculation of the g value of the model whose structure was optimized. In addition, as a Core Type, Large was used for the optimization of the structure of the model and None was used for the calculation of the g value.

FIG. 23 shows models of a dangling bond in the In—Ga—Zn—O-based oxide semiconductor film, which were obtained by the above quantum chemistry calculation. FIG. 23 shows a dangling bond (g=1.984) due to an oxygen defect in an indium-oxygen bond, a dangling bond (g=1.995) due to an oxygen defect in a gallium-oxygen bond, and a dangling bond (g=1.996) due to an oxygen defect in a zinc-oxygen bond. These g values of the dangling bonds are relatively close to g=1.93 of the signal corresponding to the absorption of the microwave of Sample H. That is, Sample H has a possibility that an oxygen defect is generated in a bond of oxygen and one or more of indium, gallium, and zinc.

However, a signal corresponding to the absorption of the microwave is not observed in a region where the g value is in the vicinity of 1.93 as for Sample I. This indicates that oxygen is added to an oxygen defect by performing heat treatment in a dry atmosphere after the oxide semiconductor film is formed. As described in the above embodiment, an oxygen defect in the oxide semiconductor film can function as a carrier which changes the electric conductivity; by reducing oxygen defects, the reliability of a transistor including the oxide semiconductor film can be improved.

Therefore, in the oxide semiconductor film including a crystalline region with c-axis alignment according to an embodiment of the present invention, oxygen is preferably added to an oxygen defect by performing heat treatment after the oxide semiconductor film is formed, and the spin density in a region where the g value is in the vicinity of 1.93 in ESR measurement is preferably lower than or equal to $1.3 \times 10^{18}$ (spins/cm$^3$), more preferably lower than or equal to $1 \times 10^{16}$ (spins/cm$^3$).

<3. Low-Temperature PL Measurement>

In this section, an oxide semiconductor film was formed in accordance with the above embodiment, and the oxide semiconductor film was evaluated with the use of low-temperature photoluminescence (PL) measurement. A result thereof is described below.

In this section, Sample J in which an oxide semiconductor film was formed over a quartz substrate by a sputtering method with a substrate temperature in deposition of 200° C. and Sample K in which an oxide semiconductor film was formed over a quartz substrate by a sputtering method with a substrate temperature in deposition of 400° C. were manufactured. That is, Sample J is an oxide semiconductor film which does not include a crystalline region with c-axis alignment, and Sample K is an oxide semiconductor film which includes a crystalline region with c-axis alignment. A target for forming the oxide semiconductor film had a composition ratio where $In_2O_3:Ga_2O_3:ZnO=1:1:2$ [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, the radio frequency (RF) power was 0.5 kW, and the film thickness was 100 nm.

Further, after the oxide semiconductor film was formed, heat treatment was performed on the quartz substrate in each of Samples J and K, over which the oxide semiconductor film was formed. The heat treatment was performed in a dry atmosphere with a dew point of −24° C. at a temperature of 450° C. for 1 hour. In this manner, Samples J and K, in each of which the oxide semiconductor film was formed over the quartz substrate, were manufactured.

In this section, low-temperature PL measurement is performed on Samples J and K. In the low-temperature PL measurement, the sample is irradiated with excited light in an atmosphere at very low temperature to give energy to the sample, the irradiation with the excited light is stopped while electrons and holes are generated in the sample, and light emission caused by recombination of electrons and holes generated by the irradiation with the excited light is detected by using a charge coupled device (CCD) or the like.

In this example, the low-temperature PL measurement was performed in a helium gas atmosphere with a measurement temperature of 10 K. As for the excited light, light having a wavelength of 325 nm emitted from a He—Cd gas laser was used. In addition, CCD was used for detecting light emission.

Figure 24:
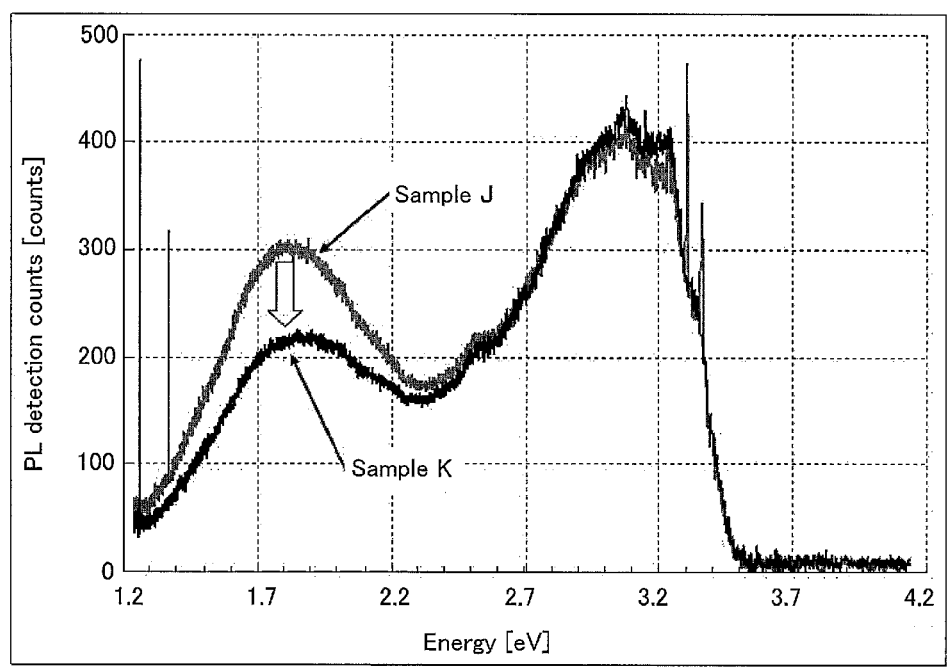
FIG. 24 is a graph showing results of low-temperature PL measurement according to an example of the present invention.

Emission spectra of Samples J and K detected in the low-temperature PL measurement are shown in FIG. 24. In the graph shown in FIG. 24, the vertical axis indicates PL detection counts, and the horizontal axis indicates energy (eV) of light emission detected.

According to the graph of FIG. 24, it is found that although each of Samples J and K has a peak in a region where the emission energy is in the vicinity of 1.8 eV, the number of PL detection counts of Sample K is smaller than that of Sample J by about 100. Note that a peak in a region where the emission energy is in the vicinity of 3.2 eV in each of Samples J and K is attributed to a quartz window of a low-temperature PL measurement device.

Here, the peak in the region where the emission energy is in the vicinity of 1.8 eV in the graph of FIG. 24 indicates that an energy level exists at a depth of about 1.8 eV from the bottom of the conduction band in the band structure of the oxide semiconductor film. This deep energy level in the band gap coincides with the trap level due to an oxygen defect in the result of calculation of the electron density of states in FIG. 3. Therefore, the emission peak in the region where the emission energy is in the vicinity of 1.8 eV in the graph of FIG. 24 can be assumed to represent the energy level of the trap level due to an oxygen defect in the band diagram in FIG. 4. That is, since the number of PL detection counts in the region where the emission energy is in the vicinity of 1.8 eV in Sample K is smaller than that in Sample J, it is assumed that the number of trap levels due to oxygen defects, that is, the number of oxygen defects is decreased in the oxide semiconductor film including a crystalline region with c-axis alignment.

<4. Measurement of Negative-Bias Stress Photodegradation>

In this example, a transistor including an oxide semiconductor film was manufactured in accordance with the above embodiment, and stress was applied to the transistor by applying a negative voltage to a gate of the transistor while irradiating the transistor with light, so that the threshold voltage of the transistor changed depending on the length of time to apply stress. A result of evaluating the change in threshold voltage of the transistor is described. Such a change in threshold voltage or the like of the transistor owing to the stress is referred to as negative-bias stress photodegradation.

In this section, a transistor provided with an oxide semiconductor film in which a crystalline region with c-axis alignment described in the above embodiment was formed (Sample L) was manufactured. In addition, as a comparative example, a transistor which was formed of a material similar to that of Sample L but provided with an oxide semiconductor film in which a crystalline region with c-axis alignment was not formed (Sample M) was manufactured. Then, stress was applied to Samples L and M by applying negative voltages to gates of the samples while irradiating Samples L and M with light, and threshold voltages Vth of Samples L and M, which changed depending on the length of time to apply stress, were evaluated. A method for manufacturing Samples L and M is described below.

First, as a base film, a silicon nitride film having a thickness of 100 nm and a silicon oxynitride film having a thickness of 150 nm were formed successively by a plasma CVD method over a glass substrate, and then a tungsten film having a thickness of 100 nm was formed over the silicon oxynitride film by a sputtering method. The tungsten film was etched selectively, thereby forming a gate electrode having a tapered shape. Then, as a gate insulating film, a silicon oxynitride film having a thickness of 100 nm was formed over the gate electrode by a plasma CVD method.

Next, an oxide semiconductor film was formed over the gate insulating film by a sputtering method. The oxide semiconductor film of Sample L was formed in such a manner that an oxide semiconductor film having a thickness of 30 nm was stacked over an oxide semiconductor film having a thickness of 5 nm functioning as a seed crystal and heat treatment was performed thereon to form a crystalline region with c-axis alignment. The oxide semiconductor film of Sample M was formed in such a manner that heat treatment was performed on an oxide semiconductor film having a thickness of 25 nm.

First, a method for manufacturing the oxide semiconductor film of Sample L is described. The oxide semiconductor film functioning as a seed crystal was formed by a sputtering method; as a target for forming the oxide semiconductor film, a target having a composition ratio where $In_2O_3:Ga_2O_3:ZnO=1:1:2$ [molar ratio] was used. Other conditions were as follows: the substrate temperature in deposition was 200° C., an oxygen gas was 50% and an argon gas was 50% in the flow rate of deposition gases, the pressure was 0.6 Pa, the distance between the substrate and the target was 100 mm, the direct current (DC) power was 5 kW, and the film thickness was 5 nm. After the oxide semiconductor film was formed, heat treatment was performed in a nitrogen atmosphere at a temperature of 450° C. for 1 hour, whereby the oxide semiconductor film functioning as a seed crystal was crystallized. Then, over the oxide semiconductor film functioning as a seed crystal, the oxide semiconductor film having a thickness of 30 nm was formed by a sputtering method under conditions similar to those for forming the oxide semiconductor film functioning as a seed crystal. Further, heat treatment was performed with the use of an oven in a nitrogen atmosphere at a temperature of 450° C. for 1 hour, and moreover, heat treatment was performed in a mixed atmosphere of nitrogen and oxygen at a temperature of 450° C. for 1 hour, so that the oxide semiconductor film including a crystalline region with c-axis alignment was formed.

In addition, the oxide semiconductor film of Sample M was formed by a sputtering method; as a target for forming the oxide semiconductor film, a target having a composition ratio where $In_2O_3:Ga_2O_3:ZnO=1:1:2$ [molar ratio] was used. Other conditions were as follows: the substrate temperature in deposition was 200° C., an oxygen gas was 50% and an argon gas was 50% in the flow rate of deposition gases, the pressure was 0.6 Pa, the distance between the substrate and the target was 100 mm, the direct current (DC) power was 5 kW, and the film thickness was 25 nm. After the oxide semiconductor film was formed, heat treatment was performed with the use of a rapid thermal annealing (RTA) method in a nitrogen atmosphere at a temperature of 650° C. for 6 minutes. Further, heat treatment was performed with the use of an oven in a mixed atmosphere of nitrogen and oxygen at a temperature of 450° C. for 1 hour, so that the oxide semiconductor film which did not include a crystalline region with c-axis alignment was formed.

Next, over the oxide semiconductor film, a conductive film in which a titanium film, an aluminum film, and a titanium film were stacked was formed by a sputtering method and selectively etched to form a source electrode and a drain electrode. Then, a silicon oxide film having a thickness of 400 nm was formed as a first interlayer insulating film. Further, as a second interlayer insulating film, an insulating film formed of an acrylic resin having a thickness of 1.5 μm was formed. Finally, heat treatment was performed in a nitrogen atmosphere at a temperature of 250° C. for 1 hour, so that Samples L and M were manufactured.

Then, stress was applied to Samples L and M by applying a negative voltage to gates of the samples while irradiating Samples L and M with light, and Id-Vg characteristics of Samples L and M depending on the length of time to apply stress were measured, so that the amount of change in threshold voltage before and after the application of stress was obtained.

The stress was applied in an air atmosphere at room temperature under the following condition: the gate voltage was −20 V, the drain voltage was 0.1 V, the source voltage was 0 V, and illuminance of light used for irradiation was 36000 (lx). Id-Vg characteristics of Samples L and M were measured by varying the length of time to apply stress as follows: 100 seconds, 300 seconds, 600 seconds, 1000 seconds, 1800 seconds, 3600 seconds, 7200 seconds, 10000 seconds, 18000 seconds, and 43200 seconds (12 hours). In measuring the Id-Vg characteristics, the drain voltage was set to +10 V, the gate voltage was swept in the range of from −10 V to +10 V, and the other conditions were similar to those in applying stress.

Figure 25:
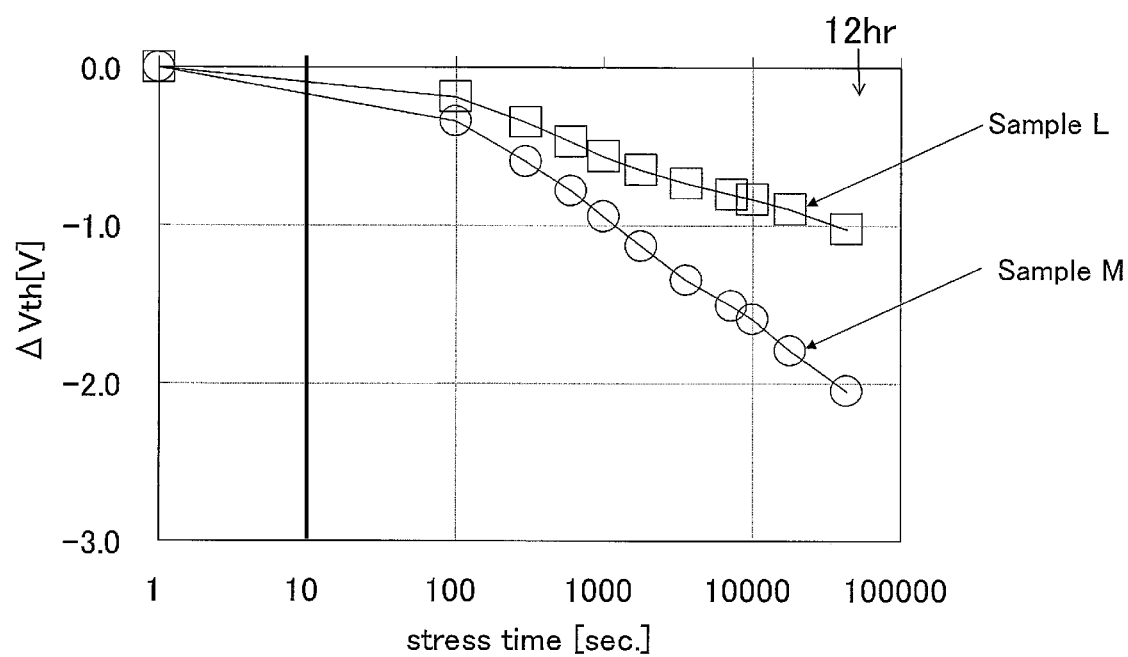
FIG. 25 is a graph showing results of measurement of negative-bias stress photodegradation according to an example of the present invention.

FIG. 25 is a graph showing the amount of change in threshold voltage of Samples L and M. In the graph shown in FIG. 25, the vertical axis indicates the amount of change in threshold voltage Δ Vth (V) and the horizontal axis indicates stress time (sec).

In FIG. 25, whereas the amount of change in threshold voltage Δ Vth of Sample L is about −1 V at maximum, the amount of change in threshold voltage Δ Vth of Sample M is as large as about −2 V at maximum; that is, the amount of change in threshold voltage Δ Vth of Sample L is reduced to about half of that of Sample M.

Accordingly, a transistor provided with an oxide semiconductor film including a crystalline region with c-axis alignment has more stable electric characteristics with respect to light irradiation or stress of a gate voltage, and the reliability thereof is improved.

<5. Measurement Using Photoresponse Defect Evaluation Method>

In this section, a transistor including an oxide semiconductor film was formed in accordance with the above embodiment, and a photoresponse defect evaluation method was performed on the transistor and stability of the oxide semiconductor film with respect to light irradiation was evaluated. A result thereof is described below.

In this section, a photoresponse defect evaluation method was performed on Samples N and O which were manufactured by methods similar to those of Samples L and M. In a photoresponse defect evaluation method, relaxation of current (photoelectric current) which flows by irradiating a semiconductor film with light is measured, relaxation time τ is calculated by fitting of a graph showing relaxation of photoelectric current with the use of a formula represented by linear combination of exponential functions, and defects in the semiconductor film are evaluated from the relaxation time τ.

Here, current ID is represented by linear combination of exponential functions having two terms by using relaxation time $\tau_1$ corresponding to rapid response and relaxation time $\tau_2$ corresponding to slow response ($\tau_2 > \tau_1$), resulting in the following formula.

$$ID = Ae^{-\frac{t}{\tau_1}} + Be^{-\frac{t}{\tau_2}} \quad \text{[Formula 3]}$$

In a photoresponse defect evaluation method described in this section, after a dark state for 60 seconds, light irradiation was performed for 600 seconds, and then, the light irradiation was stopped and relaxation of photoelectric current was measured for 3000 seconds. The wavelength and the intensity of irradiation light were set to 400 nm and 3.5 mW/cm², respectively, voltages of a gate electrode and a source electrode of each of Samples N and O were fixed to 0 V, a low voltage of 0.1 V was applied to a drain electrode, and the value of photoelectric current was measured. Note that the channel length L and the channel width W of each of Samples N and O were 30 μm and 10000 μm, respectively.

Figure 26A:
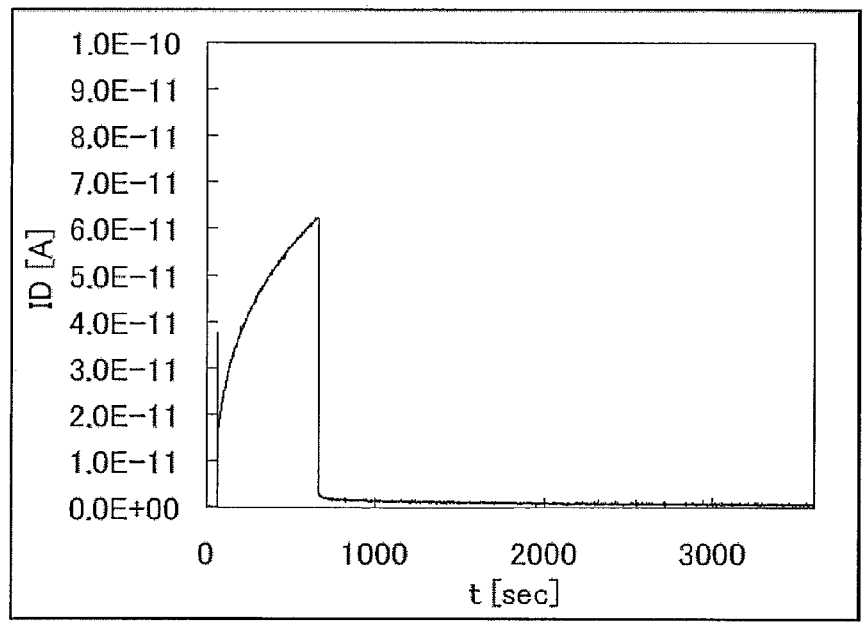
FIGS. 26A and 26B are graphs each showing photoelectric current measured by a photoresponse defect evaluation method according to an example of the present invention.
Figure 26B:
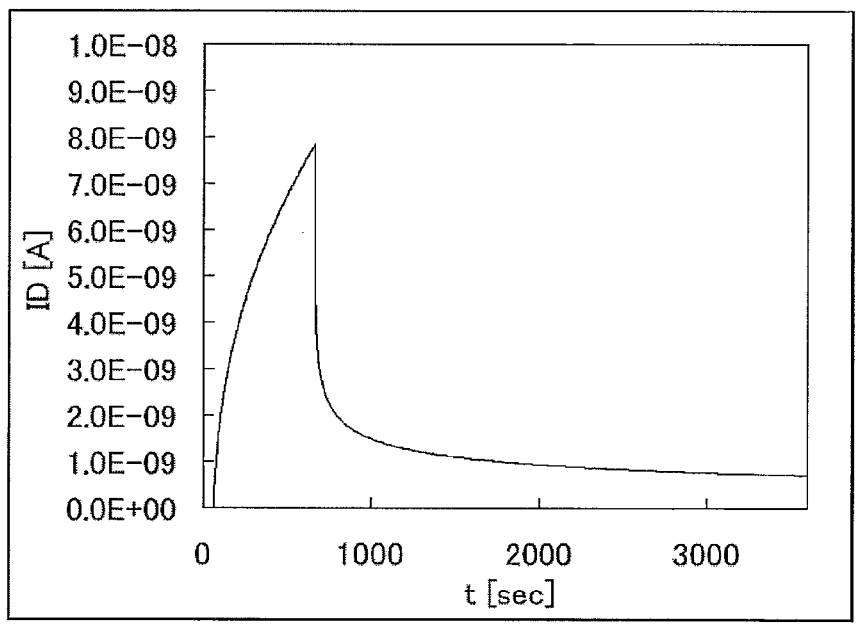

FIGS. 26A and 26B are graphs showing the amount of change in photoelectric current of Samples N and O in a photoresponse defect evaluation method. In the graphs shown in FIGS. 26A and 26B, the vertical axis indicates photoelectric current ID and the horizontal axis indicates time t (sec). Fitting of the graphs shown in FIGS. 26A and 26B is performed with a formula represented by linear combination of exponential functions, resulting in the following formula.

$$ID = 0.95e^{-\frac{t}{0.3}} + 0.02e^{-\frac{t}{39}} \quad \text{[Formula 4]}$$

$$ID = 0.56e^{-\frac{t}{3.8}} + 0.22e^{-\frac{t}{96}} \quad \text{[Formula 5]}$$

From FIGS. 26A and 26B, it is found that the maximum value of photoelectric current is smaller and the relaxation time $\tau_1$ and the relaxation time $\tau_2$ are shorter in Sample N including an oxide semiconductor film including a crystalline region with c-axis alignment than in Sample O. In Sample N, the maximum value of photoelectric current Imax was $6.2 = \times 10^{-11}$ A, the relaxation time $\tau_1$ was 0.3 seconds, and the relaxation time $\tau_2$ was 39 seconds. On the other hand, in Sample O, the maximum value of photoelectric current Imax was $8.0 \times 10^{-9}$ A, the relaxation time $\tau_1$ was 3.9 seconds, and the relaxation time $\tau_2$ was 98 seconds.

It was found that in both Samples N and O, fitting of relaxation of photoelectric current ID could be performed by linear combination of exponential functions having at least two kinds of relaxation time. This indicates that relaxation of photoelectric current ID has two kinds of relaxation processes in both Samples N and O. This coincides with the relaxation process of photoelectric current with two kinds of recombination models illustrated in FIGS. 5A and 5B. That is, it was indicated that, as in the band diagrams of FIGS. 5A and 5B in the above embodiment, a trap level exists in the band gap of the oxide semiconductor.

Further, the relaxation time $\tau_1$ and the relaxation time $\tau_2$ were shorter in Sample N including an oxide semiconductor film including a crystalline region with c-axis alignment than in Sample O. This indicates that the number of trap levels due to oxygen defects in the recombination models in FIGS. 5A and 5B is smaller in Sample N than in Sample O. This is because in Sample N, the number of defects in the oxide semiconductor film, which can function as trap levels, is reduced since the oxide semiconductor film includes a crystalline region with c-axis alignment.

From the above, the transistor has a more stable structure with respect to light irradiation by formation of a crystalline region with c-axis alignment in the oxide semiconductor film. By using such an oxide semiconductor film for a transistor, a highly reliable transistor having stable electric characteristics can be provided.

<6. TDS Analysis>

In this section, an oxide semiconductor film was formed in accordance with the above embodiment, and the oxide semiconductor film was evaluated with the use of thermal desorption spectroscopy (TDS). A result thereof is described below.

In this section, an oxide semiconductor film was formed over a quartz substrate by a sputtering method to form Sample P1 with a substrate temperature in deposition of room temperature, Sample P2 with a substrate temperature in deposition of 100° C., Sample P3 with a substrate temperature in deposition of 200° C., Sample P4 with a substrate temperature in deposition of 300° C., and Sample P5 with a substrate temperature in deposition of 400° C. Here, each of Samples P1, P2, and P3 is an oxide semiconductor film which does not include a crystalline region with c-axis alignment, and each of Samples P4 and P5 is an oxide semiconductor film which includes a crystalline region with c-axis alignment. A target for forming the oxide semiconductor film had a composition ratio where $In_2O_3:Ga_2O_3:ZnO=1:1:2$ [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, the radio frequency (RF) power was 0.5 kW, and the film thickness was 50 nm. The quartz substrate was subjected to heat treatment in a dry atmosphere at 850° C. in advance in order to reduce factors of a desorption gas from the substrate in TDS analysis.

Note that TDS analysis is an analysis method in which a sample is heated in a vacuum case using a halogen lamp and gas components generated from the whole sample when the temperature of the sample is increased are detected by a quadrupole mass spectrometer (QMS). Detected gas components are distinguished from each other by the value of M/z (mass/charge) and detected in the form of a mass spectrum.

In this example, TDS analysis was performed with WA1000S manufactured by ESCO Ltd. A mass spectrum where M/z=18 corresponding to $H_2O$ was detected under the following measurement conditions: the SEM voltage was 1500 V, the temperature of a substrate surface was room temperature to 400° C., the degree of vacuum was lower than or equal to $1.5 \times 10^{-7}$ Pa, Dwell Time was 0.2 (sec/U), and the temperature rising rate was 30 (° C./min).

Figure 27:
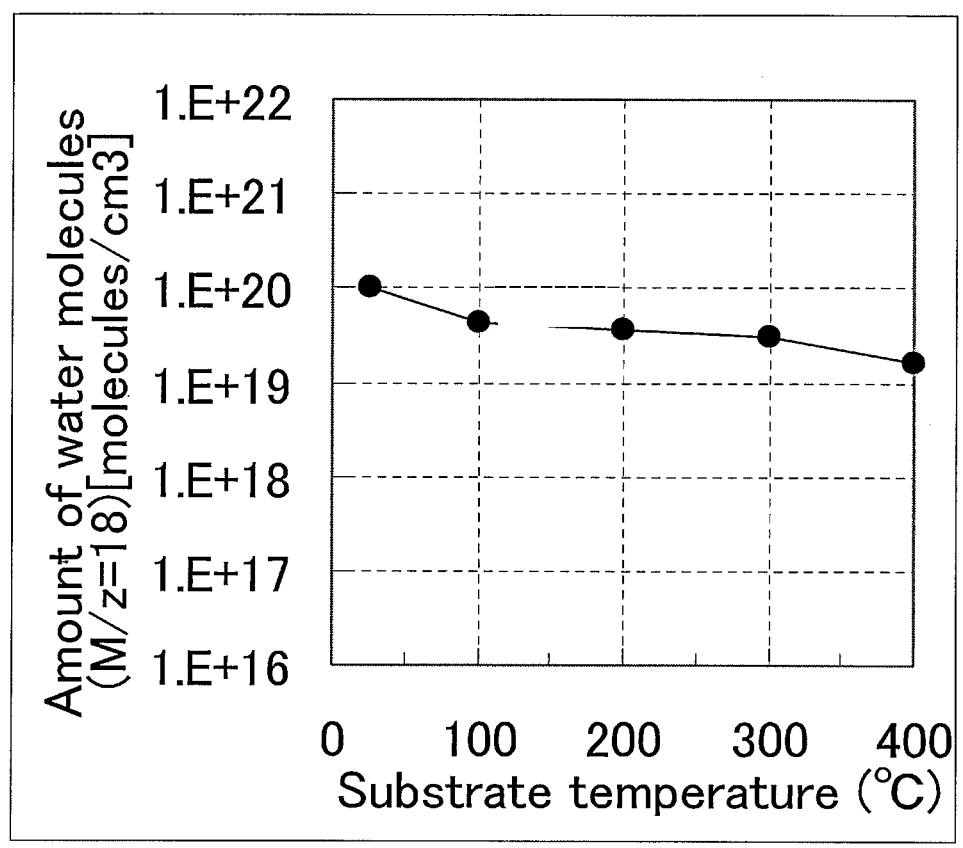
FIG. 27 shows a result of TDS analysis according to an example of the present invention.

The results of TDS analyses of Samples P1 to P5 are shown in FIG. 27. In the graph shown in FIG. 27, the vertical axis indicates the amount of water molecules that are desorbed (M/z=18) [molecules/cm³] (counts), and the horizontal axis indicates substrate temperature (° C.). Here, the amount of water molecules that are desorbed is obtained by calculating the value of an integral at a temperature in the vicinity of 300° C. in a mass spectrum where M/z=18, that is, it is the amount of water molecules that are desorbed from the oxide semiconductor film. In the mass spectrum where M/z=18, a peak exists also in a region where the temperature is in the vicinity of 100° C., but this peak is assumed to indicate the amount of moisture adsorbed onto the surface of the oxide semiconductor film and thus is not counted as the amount of water molecules that are desorbed.

The graph of FIG. 27 shows that as the substrate temperature in deposition is increased, the amount of water molecules desorbed from each sample is decreased. Thus, it can be said that by increasing the substrate temperature in deposition, that is, by forming a crystalline region with c-axis alignment in the oxide semiconductor film, molecules or ions containing H (hydrogen atoms), typified by $H_2O$ (water) molecules, contained in the oxide semiconductor film can be reduced.

As described above, by forming an oxide semiconductor film including a crystalline region with c-axis alignment, impurities such as molecules or ions containing H (hydrogen atoms), typified by $H_2O$ (water) molecules, which can be sources for supplying carriers in the oxide semiconductor film, can be reduced. Consequently, the electric conductivity of the oxide semiconductor film can be prevented from changing, whereby the reliability of a transistor including the oxide semiconductor film can be improved.

<7. Secondary Ion Mass Spectrometry>

In this section, an oxide semiconductor film was formed in accordance with the above embodiment, and the oxide semiconductor film was evaluated with the use of secondary ion mass spectrometry (SIMS). A result thereof is described below.

In this section, an oxide semiconductor film was formed over a quartz substrate by a sputtering method to form Samples Q1 to Q7 with a substrate temperature in deposition of room temperature and Samples R1 to R7 with a substrate temperature in deposition of 400° C. Here, each of Samples Q1 to Q7 is an oxide semiconductor film which does not include a crystalline region with c-axis alignment, and each of Samples R1 and R7 is an oxide semiconductor film which includes a crystalline region with c-axis alignment. A target for forming the oxide semiconductor film had a composition ratio where $In_2O_3:Ga_2O_3:ZnO=1:1:2$ [molar ratio]. Other conditions were as follows: as for the flow of deposition gases, the flow of an argon gas was 30 sccm and the flow of an oxygen gas was 15 sccm, the pressure was 0.4 Pa, the distance between the substrate and the target was 60 mm, the radio frequency (RF) power was 0.5 kW, and the film thickness was 300 nm. The quartz substrate was subjected to heat treatment in a nitrogen atmosphere at 850° C. for 1 hour in advance.

After the oxide semiconductor film was formed, heat treatment was performed on the quartz substrate over which the oxide semiconductor film was formed in each of Samples Q2 to 7 and Samples R2 to R7. The heat treatment was performed in such a manner that the temperature was increased to a predetermined temperature in a nitrogen atmosphere, the atmosphere was switched from the nitrogen atmosphere to an oxygen atmosphere, the predetermined temperature was kept for 1 hour in the oxygen atmosphere, and then the temperature was decreased in the oxygen atmosphere. The predetermined temperature was 200° C. in Samples Q2 and R2, 250° C. in Samples Q3 and R3, 350° C. in Samples Q4 and R4, 450° C. in Samples Q5 and R5, 550° C. in Samples Q6 and R6, and 650° C. in Samples Q7 and R7. In this manner, Samples Q1 to Q7 and Samples R1 to R7 in each of which the oxide semiconductor film was formed over the quartz substrate were manufactured.

Figure 28A:
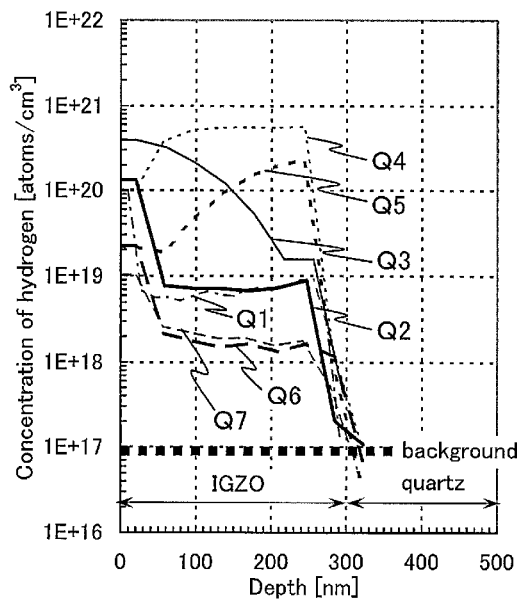
FIGS. 28A and 28B each show results of SIMS analyses according to an example of the present invention.
Figure 28B:
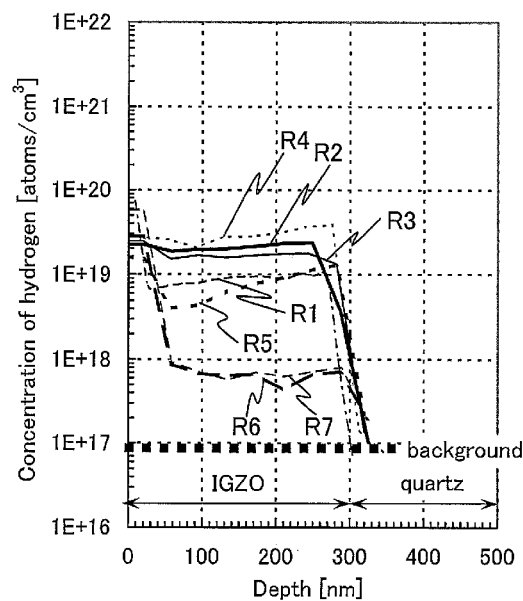

In this section, SIMS analysis was performed on each of Samples Q1 to Q7 and Samples R1 to R7. The results of the SIMS analyses of Samples Q1 to Q7 are shown in FIG. 28A, and the results of the SIMS analyses of Samples R1 to R7 are shown in FIG. 28B. In the graphs shown in FIGS. 28A and 28B, the vertical axis indicates the concentration (atoms/cm$^3$) of hydrogen (H), and the horizontal axis indicates the depth (nm) of the oxide semiconductor film and the depth (nm) of the quartz substrate, from the surface of the oxide semiconductor film.

It seems from the graphs in FIGS. 28A and 28B that: the concentrations of hydrogen in the oxide semiconductor films in Samples Q1 and R1 are substantially equal to each other, while the concentrations of hydrogen in the oxide semiconductor films in Samples R2 to R7 are lower than those of Samples Q2 to Q7, respectively. This shows that hydrogen is less likely to enter the oxide semiconductor film in heat treatment performed later as the substrate temperature in forming the oxide semiconductor film is higher. In particular, the graph of Samples Q3 to Q5 shows that as the temperature in heat treatment is increased, hydrogen enters from the surface side of the oxide semiconductor film and a layer in which the concentration of hydrogen is high spreads to an inner part of the oxide semiconductor film, and as the temperature is further increased, hydrogen is eliminated from the surface side of the oxide semiconductor film. In such a manner, in the case where the oxide semiconductor film does not include a crystalline region with c-axis alignment, entry or elimination of hydrogen is caused owing to heat treatment. However, such a phenomenon is not observed in Samples R2 to R7 each including a crystalline region with c-axis alignment in the oxide semiconductor film.

It can be considered that this is because by forming a crystalline region with c-axis alignment in the oxide semiconductor film with the substrate temperature increased in forming the oxide semiconductor film, dangling bonds to which hydrogen is likely to be bonded and the like are reduced in the oxide semiconductor film.

Accordingly, by forming a crystalline region with c-axis alignment in an oxide semiconductor film with the substrate temperature increased in forming the oxide semiconductor film, increase in hydrogen which can be a source for supplying a carrier in the oxide semiconductor film owing to heat treatment can be prevented. Consequently, the electric conductivity of the oxide semiconductor film can be prevented from changing, whereby the reliability of a transistor including the oxide semiconductor film can be improved.

EXPLANATION OF REFERENCE

11: site, 12: In atom, 13: Ga atom, 14: Zn atom, 15: O atom, 31: treatment chamber, 33: evacuation unit, 35: gas supply unit, 37: power supply device, 40: substrate support, 41: target, 43: ion, 45: atom, 47: atom, 51: substrate, 53: base insulating film, 55: oxide semiconductor film, 56: oxide semiconductor film, 59: oxide semiconductor film, 63: gate insulating film, 65: gate electrode, 69: insulating film, 120: transistor, 130: transistor, 140: transistor, 150: transistor, 160: transistor, 170: transistor, 180: transistor, 351: substrate, 353: base insulating film, 359: oxide semiconductor film, 363: gate insulating film, 365: gate electrode, 369: insulating film, 371: metal oxide film, 373: metal oxide film, 55*a*: seed crystal, 55*b*: oxide semiconductor film, 56*a*: seed crystal, 56*b*: oxide semiconductor film, 61*a*: source electrode, 61*b*: drain electrode, 361*a*: source electrode, 361*b*: drain electrode, 500: substrate, 501: pixel portion, 502: scan line driver circuit, 503: scan line driver circuit, 504: signal line driver circuit, 510: capacitor wiring, 512: gate wiring, 513: gate wiring, 514: drain electrode layer, 516: transistor, 517: transistor, 518: liquid crystal element, 519: liquid crystal element, 520: pixel, 521: switching transistor, 522: driving transistor, 523: capacitor, 524: light-emitting element, 525: signal line, 526: scan line, 527: power supply line, 528: common electrode, 1001: main body, 1002: housing, 1004: key board button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera lens, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 1003*a*: display portion, 1003*b*: display portion This application is based on Japanese Patent Application serial no. 2010-270557 filed with Japan Patent Office on Dec. 3, 2010, the entire contents of which are hereby incorporated by reference.

What is claimed is:

1. An oxide semiconductor film comprising a crystalline region,
wherein the oxide semiconductor film has a first peak of electron diffraction intensity with a full width at half maximum of greater than or equal to 0.2 nm$^{-1}$ in a region where a magnitude of a scattering vector is greater than or equal to 3.3 nm$^{-1}$ and less than or equal to 4.1 nm$^{-1}$, and
wherein the oxide semiconductor film has a second peak of electron diffraction intensity with a full width at half maximum of greater than or equal to 0.2 nm$^{-1}$ in a region where a magnitude of a scattering vector is greater than or equal to 5.5 nm$^{-1}$ and less than or equal to 7.1 nm$^{-1}$.

2. The oxide semiconductor film according to claim 1, wherein the crystalline region comprises a crystal structure in which a c-axis is substantially perpendicular to a surface of the oxide semiconductor film.

3. The oxide semiconductor film according to claim 1, wherein the oxide semiconductor film is in a non-single crystal state.

4. The oxide semiconductor film according to claim 2, wherein measurement of the electron diffraction intensity is performed by irradiation with an electron beam from a direction of the c-axis.

5. The oxide semiconductor film according to claim 1, wherein a spin density of a signal in a region where a g value is in a vicinity of 1.93 in ESR measurement of the oxide semiconductor film is lower than $1.3 \times 10^{18}$ spins/cm$^3$.

6. The oxide semiconductor film according to claim 1, wherein the oxide semiconductor film comprises indium and zinc.

7. A semiconductor device comprising the oxide semiconductor film according to claim 1, the semiconductor device further comprising:
- a gate electrode; and
- a gate insulating film between the gate electrode and the oxide semiconductor film.

8. An oxide semiconductor film comprising a crystalline region,
- wherein the oxide semiconductor film has a first peak of electron diffraction intensity with a full width at half maximum of greater than or equal to 0.4 nm$^{-1}$ in a region where a magnitude of a scattering vector is greater than or equal to 3.3 nm$^{-1}$ and less than or equal to 4.1 nm$^{-1}$, and
- wherein the oxide semiconductor film has a second peak of electron diffraction intensity with a full width at half maximum of greater than or equal to 0.45 nm$^{-1}$ in a region where a magnitude of a scattering vector is greater than or equal to 5.5 nm$^{-1}$ and less than or equal to 7.1 nm$^{-1}$.

9. The oxide semiconductor film according to claim 8, wherein the crystalline region comprises a crystal structure in which a c-axis is substantially perpendicular to a surface of the oxide semiconductor film.

10. The oxide semiconductor film according to claim 8, wherein the oxide semiconductor film is in a non-single crystal state.

11. The oxide semiconductor film according to claim 9, wherein measurement of the electron diffraction intensity is performed by irradiation with an electron beam from a direction of the c-axis.

12. The oxide semiconductor film according to claim 8, wherein a spin density of a signal in a region where a g value is in a vicinity of 1.93 in ESR measurement of the oxide semiconductor film is lower than $1.3 \times 10^{18}$ spins/cm$^3$.

13. The oxide semiconductor film according to claim 8, wherein the oxide semiconductor film comprises indium and zinc.

14. A semiconductor device comprising the oxide semiconductor film according to claim 8, the semiconductor device further comprising:
- a gate electrode; and
- a gate insulating film between the gate electrode and the oxide semiconductor film.

* * * * *